United States Patent
Andrews

(10) Patent No.: US 11,417,635 B2
(45) Date of Patent: *Aug. 16, 2022

(54) HIGH DENSITY PIXELATED-LED CHIPS AND CHIP ARRAY DEVICES

(71) Applicant: CREELED, INC., Durham, NC (US)

(72) Inventor: Peter Scott Andrews, Durham, NC (US)

(73) Assignee: CREELED, INC., Durham, NC (US)

( * ) Notice: Subject to any disclaimer, the term of this patent is extended or adjusted under 35 U.S.C. 154(b) by 9 days.

This patent is subject to a terminal disclaimer.

(21) Appl. No.: 16/983,553

(22) Filed: Aug. 3, 2020

(65) Prior Publication Data

US 2020/0411487 A1  Dec. 31, 2020

Related U.S. Application Data

(63) Continuation of application No. 16/174,584, filed on Oct. 30, 2018, now Pat. No. 10,734,363, which is a (Continued)

(51) Int. Cl.
*H01L 25/075* (2006.01)
*H01L 33/60* (2010.01)
(Continued)

(52) U.S. Cl.
CPC .......... *H01L 25/0753* (2013.01); *H01L 23/60* (2013.01); *H01L 27/156* (2013.01);
(Continued)

(58) Field of Classification Search
None
See application file for complete search history.

(56) References Cited

U.S. PATENT DOCUMENTS

| 4,319,070 A | 3/1982 | Imai et al. |
| 5,955,747 A | 9/1999 | Ogihara et al. |

(Continued)

FOREIGN PATENT DOCUMENTS

| CN | 101894851 A | 11/2010 |
| EP | 2197051 A2 | 6/2010 |

(Continued)

OTHER PUBLICATIONS

Notice of Reasons for Refusal for Japanese Patent Application No. 2018-553935, dated Nov. 24, 2020, 6 pages.

(Continued)

*Primary Examiner* — Asok K Sarkar
(74) *Attorney, Agent, or Firm* — Withrow & Terranova, P.L.L.C; Vincent K. Gustafson

(57) ABSTRACT

Pixelated-LED chips and related methods are disclosed. A pixelated-LED chip includes an active layer with independently electrically accessible active layer portions arranged on or over a light-transmissive substrate. The active layer portions are configured to illuminate different light-transmissive substrate portions to form pixels. Various enhancements may beneficially provide increased contrast (i.e., reduced cross-talk between pixels) and/or promote inter-pixel illumination homogeneity, without unduly restricting light utilization efficiency. In some aspects, a light extraction surface of each substrate portion includes protruding features and light extraction surface recesses. Lateral borders between different pixels are aligned with selected light extraction surface recesses. In some aspects, selected light extraction surface recesses extend through an entire thickness of the substrate. Other technical benefits may additionally or alternatively be achieved.

29 Claims, 53 Drawing Sheets

Related U.S. Application Data continuation of application No. 16/053,980, filed on Aug. 3, 2018, now Pat. No. 10,651,357.

(60) Provisional application No. 62/541,033, filed on Aug. 3, 2017, provisional application No. 62/655,296, filed on Apr. 10, 2018, provisional application No. 62/655,303, filed on Apr. 10, 2018.

(51) Int. Cl.
 H01L 27/15 (2006.01)
 H01L 23/60 (2006.01)
 H01L 33/62 (2010.01)
 H01L 33/20 (2010.01)
 H01L 33/44 (2010.01)
 H01L 33/46 (2010.01)

(52) U.S. Cl.
 CPC ............. H01L 33/20 (2013.01); H01L 33/60 (2013.01); H01L 33/62 (2013.01); H01L 33/44 (2013.01); H01L 33/46 (2013.01); H01L 2933/0083 (2013.01)

(56) References Cited

U.S. PATENT DOCUMENTS

| | | | |
|---|---|---|---|
| 6,160,354 A | 12/2000 | Ruvinskiy et al. | |
| 6,657,236 B1 | 12/2003 | Thibeault et al. | |
| 6,747,298 B2 | 6/2004 | Slater, Jr. et al. | |
| 6,791,119 B2 | 9/2004 | Slater, Jr. et al. | |
| 6,821,804 B2 | 11/2004 | Thibeault et al. | |
| 6,888,167 B2 | 5/2005 | Slater, Jr. et al. | |
| 7,211,803 B1 | 5/2007 | Dhurjaty et al. | |
| 7,829,906 B2 | 11/2010 | Donofrio | |
| 8,212,297 B1 | 7/2012 | Law et al. | |
| 8,716,724 B2 | 5/2014 | von Malm et al. | |
| 8,835,959 B2 | 9/2014 | Nakamura et al. | |
| 8,940,561 B2 | 1/2015 | Donofrio et al. | |
| 8,963,121 B2 | 2/2015 | Odnoblyudov et al. | |
| 8,969,897 B2 | 3/2015 | Choi | |
| 8,981,395 B2 | 3/2015 | Choi et al. | |
| 9,048,368 B2 | 6/2015 | Jeong | |
| 9,099,575 B2 | 8/2015 | Medendorp, Jr. et al. | |
| 9,123,864 B2 | 9/2015 | Tomonari et al. | |
| 9,129,977 B2 | 9/2015 | Marchand et al. | |
| 9,130,127 B2 | 9/2015 | Katsuno et al. | |
| 9,130,128 B2 | 9/2015 | Shinohara | |
| 9,130,137 B2 | 9/2015 | Lin et al. | |
| 9,136,432 B2 | 9/2015 | Yun et al. | |
| 9,136,433 B2 | 9/2015 | Park et al. | |
| 9,142,725 B1 | 9/2015 | Suzuki | |
| 9,153,750 B2 | 10/2015 | Seo et al. | |
| 9,159,894 B2 | 10/2015 | Cho et al. | |
| 9,166,107 B2 | 10/2015 | Park | |
| 9,166,108 B2 | 10/2015 | Unosawa | |
| 9,166,110 B2 | 10/2015 | Aihara | |
| 9,166,111 B2 | 10/2015 | Matsui et al. | |
| 9,171,882 B2 | 10/2015 | Akimoto et al. | |
| 9,172,002 B2 | 10/2015 | Wang et al. | |
| 9,172,021 B2 | 10/2015 | Sugizaki et al. | |
| 9,178,121 B2 | 11/2015 | Edmond et al. | |
| 9,196,653 B2 | 11/2015 | Leatherdale et al. | |
| 9,209,223 B2 | 12/2015 | Lee et al. | |
| 9,219,196 B2 | 12/2015 | Seo et al. | |
| 9,219,200 B2 | 12/2015 | Erchak et al. | |
| 9,231,037 B2 | 1/2016 | Shimayama | |
| 9,236,526 B2 | 1/2016 | Choi et al. | |
| 9,240,433 B2 | 1/2016 | Kim et al. | |
| 9,252,345 B2 | 2/2016 | Cho et al. | |
| 9,263,643 B2 | 2/2016 | Huang et al. | |
| 9,263,652 B2 | 2/2016 | Yoon et al. | |
| 9,269,858 B2 | 2/2016 | Schubert et al. | |
| 9,277,618 B2 | 3/2016 | Odnoblyudov et al. | |
| 9,281,448 B2 | 3/2016 | Choi et al. | |
| 9,281,449 B2 | 3/2016 | Kim et al. | |
| 9,287,457 B2 | 3/2016 | Jeong et al. | |
| 9,293,664 B2 | 3/2016 | Seo et al. | |
| 9,293,674 B2 | 3/2016 | Kususe et al. | |
| 9,293,675 B2 | 3/2016 | Yang et al. | |
| 9,299,889 B2 | 3/2016 | Katsuno et al. | |
| 9,299,893 B2 | 3/2016 | Chen et al. | |
| 9,300,111 B2 | 3/2016 | Lee et al. | |
| 9,318,529 B2 | 4/2016 | Jang et al. | |
| 9,324,765 B2 | 4/2016 | An | |
| 9,337,175 B2 | 5/2016 | Seo et al. | |
| 9,362,335 B2 | 6/2016 | von Malm | |
| 9,362,337 B1 | 6/2016 | Wu et al. | |
| 9,373,756 B2 | 6/2016 | Lee et al. | |
| 9,653,643 B2 | 5/2017 | Bergmann et al. | |
| 9,729,676 B2 | 8/2017 | Kobayashi et al. | |
| 9,748,309 B2 | 8/2017 | von Malm | |
| 9,754,926 B2 | 9/2017 | Donofrio et al. | |
| 9,831,220 B2 | 11/2017 | Donofrio et al. | |
| 10,317,787 B2 | 6/2019 | Graves et al. | |
| 10,651,357 B2 * | 5/2020 | Andrews | H05B 45/20 |
| 10,734,363 B2 * | 8/2020 | Andrews | H01L 23/60 |
| 10,903,268 B2 * | 1/2021 | Andrews | H01L 25/0753 |
| 2003/0015959 A1 | 1/2003 | Tomoda et al. | |
| 2005/0023550 A1 | 2/2005 | Eliashevich et al. | |
| 2005/0253492 A1 | 11/2005 | Besshi et al. | |
| 2006/0012588 A1 | 1/2006 | Shinohara | |
| 2006/0281203 A1 | 12/2006 | Epler et al. | |
| 2007/0001943 A1 | 1/2007 | Lee et al. | |
| 2008/0179611 A1 | 7/2008 | Chitnis et al. | |
| 2008/0211416 A1 | 9/2008 | Negley et al. | |
| 2008/0290351 A1 | 11/2008 | Ajiki et al. | |
| 2009/0179843 A1 | 7/2009 | Ackermann et al. | |
| 2009/0241390 A1 | 10/2009 | Roberts | |
| 2010/0015574 A1 | 1/2010 | Van der Zel et al. | |
| 2010/0051785 A1 | 3/2010 | Dai et al. | |
| 2010/0123386 A1 | 5/2010 | Chen | |
| 2010/0163900 A1 | 7/2010 | Seo et al. | |
| 2011/0049545 A1 | 3/2011 | Basin et al. | |
| 2011/0084294 A1 | 4/2011 | Yao | |
| 2011/0121732 A1 | 5/2011 | Tsutsumi | |
| 2011/0220934 A1 | 9/2011 | Gotoda et al. | |
| 2011/0291143 A1 | 12/2011 | Kim et al. | |
| 2011/0294240 A1 | 12/2011 | Kim | |
| 2011/0297979 A1 | 12/2011 | Diana et al. | |
| 2012/0062135 A1 | 3/2012 | Tamaki et al. | |
| 2012/0119237 A1 | 5/2012 | Leatherdale et al. | |
| 2012/0205634 A1 | 8/2012 | Ikeda et al. | |
| 2012/0236582 A1 | 9/2012 | Waragaya et al. | |
| 2012/0268042 A1 | 10/2012 | Shiobara et al. | |
| 2013/0264592 A1 | 10/2013 | Bergmann et al. | |
| 2014/0070245 A1 | 3/2014 | Haberern et al. | |
| 2014/0110730 A1 | 4/2014 | Lee et al. | |
| 2014/0361321 A1 | 12/2014 | Saito et al. | |
| 2015/0049502 A1 | 2/2015 | Brandl et al. | |
| 2015/0207045 A1 | 7/2015 | Wada et al. | |
| 2015/0228876 A1 | 8/2015 | Place et al. | |
| 2015/0262978 A1 | 9/2015 | Shibata | |
| 2015/0279902 A1 | 10/2015 | Von Malm et al. | |
| 2015/0295009 A1 | 10/2015 | Wang et al. | |
| 2015/0311407 A1 | 10/2015 | Gootz et al. | |
| 2015/0340346 A1 | 11/2015 | Chu et al. | |
| 2015/0380622 A1 | 12/2015 | Miyoshi et al. | |
| 2016/0150614 A1 | 5/2016 | Randolph | |
| 2016/0163916 A1 | 6/2016 | Ilievski et al. | |
| 2016/0240516 A1 | 8/2016 | Chang | |
| 2016/0293811 A1 | 10/2016 | Hussell et al. | |
| 2017/0062680 A1 | 3/2017 | Yoo et al. | |
| 2017/0092820 A1 | 3/2017 | Kim et al. | |
| 2017/0098746 A1 | 4/2017 | Bergmann et al. | |
| 2017/0135177 A1 | 5/2017 | Wang et al. | |
| 2017/0141280 A1 | 5/2017 | Zhong et al. | |
| 2017/0148771 A1 | 5/2017 | Cha et al. | |
| 2017/0207284 A1 | 7/2017 | Dykaar | |
| 2017/0229431 A1 | 8/2017 | Bergmann et al. | |
| 2017/0250164 A1 | 8/2017 | Takeya et al. | |
| 2017/0271561 A1 | 9/2017 | Bergmann et al. | |
| 2017/0287887 A1 | 10/2017 | Takeya et al. | |
| 2017/0294417 A1 | 10/2017 | Edmond et al. | |

(56) References Cited

U.S. PATENT DOCUMENTS

| | | |
|---|---|---|
| 2017/0294418 A1 | 10/2017 | Edmond et al. |
| 2017/0317251 A1 | 11/2017 | Sweegers et al. |
| 2017/0318636 A1 | 11/2017 | Kums |
| 2017/0358624 A1 | 12/2017 | Takeya et al. |
| 2018/0012949 A1 | 1/2018 | Takeya et al. |
| 2018/0076368 A1 | 3/2018 | Hussell |
| 2018/0145058 A1 | 5/2018 | Meitl et al. |
| 2018/0212108 A1 | 7/2018 | Leirer et al. |
| 2018/0359825 A1 | 12/2018 | Hussell |
| 2019/0044040 A1 | 2/2019 | Andrews |
| 2020/0144460 A1 | 5/2020 | Onuma et al. |
| 2021/0151422 A1 | 5/2021 | Iguchi et al. |

FOREIGN PATENT DOCUMENTS

| | | |
|---|---|---|
| EP | 2296179 A2 | 3/2011 |
| EP | 2320483 A1 | 5/2011 |
| EP | 2325883 A2 | 5/2011 |
| EP | 2393132 A2 | 12/2011 |
| EP | 3076442 A1 | 10/2016 |
| JP | 2006008956 A | 1/2006 |
| JP | 2008262993 A | 10/2008 |
| JP | 2010087292 A | 4/2010 |
| JP | 2013106048 A | 5/2013 |
| JP | 2013179197 A | 9/2013 |
| JP | 5788046 B2 | 9/2015 |
| JP | 2015201473 A | 11/2015 |
| JP | 2016072379 A | 5/2016 |
| JP | 2019016821 A | 1/2019 |
| KR | 100652133 A | 11/2006 |
| KR | 1020130086109 A | 7/2013 |
| WO | 2005062905 A2 | 7/2005 |
| WO | 2008062783 A1 | 5/2008 |
| WO | 2015063077 A1 | 5/2015 |
| WO | 2015135839 A1 | 9/2015 |
| WO | 2016087542 A1 | 6/2016 |
| WO | 2016188505 A1 | 12/2016 |

OTHER PUBLICATIONS

Applicant-Initiated Interview Summary for U.S. Appl. No. 15/621,731, dated May 12, 2021, 2 pages.
Advisory Action for U.S. Appl. No. 15/621,731, dated May 28, 2021, 3 pages.
Notice of Allowance for U.S. Appl. No. 15/621,731, dated Jun. 18, 2021, 15 pages.
Examination Report for European Patent Application No. 17721889.8, dated Apr. 20, 2021, 7 pages.
Srantof Patent for Korean Patent Application No. 10-2018-7032540, dated May 21, 2021, 4 pages.
International Preliminary Report on Patentability for International Patent Application No. PCT/IB2019/060455, dated Jul. 1, 2021 10 pages.
Notice of Allowance for U.S. Appl. No. 17/008,544, dated Sep. 29, 2020, 8 pages.
Office Action for Korean Patent Application No. 10-2018-7032540, dated Oct. 21, 2020, 23 pages.
Notice of Reasons for Refusal for Japanese Patent Application No. 2018-553935, dated Aug. 17, 2021, 8 pages.
Carey, Julian, "New LED architectures and phosphor technologies lower costs and boost quality (MAGAZINE)," LEDs Magazine, accessed Feb. 17, 2017, http://www.ledsmagazine.com/articles/print/volume-11/issue-7/features/manufacturing/new-led-architectures-and-phosphor-technologies-lower-costs-and-boost-quality.html, published Sep. 4, 2014, PennWell Corporation, 7 pages.
Chong, Wing et al., "1700 pixels per inch (PPI) Passive-Matrix Micro-LED Display Powered by ASIC," IEEE Compound Semiconductor Integrated Circuit Symposium (CSICs), Oct. 19-22, 2014, IEEE, 4 pages.
Dodel, DR. Kerstin et al., "Capital Markets Day 2015," HELLA KGaA Hueck & Co, Dec. 2, 2015, London, HELLA, pp. 1-89.
Herrnsdorf, Johannes et al., "Active-Matrix GaN Micro Light-Emitting Diode Display With Unprecedented Brightness," IEEE Transactions on Electron Devices, vol. 62, Issue 6, Jun. 2015, IEEE, pp. 1918-1925.
Jiang, H. X. et al., "Nitride micro-LEDs and beyond--a decade progress review," Optics Express, vol. 21, Issue S3, Apr. 22, 2013, OSA, 10 pages.
Non-Final Office Action for U.S. Appl. No. 15/401,240, dated May 26, 2017, 7 pages.
Non-Final Office Action for U.S. Appl. No. 15/401,240, dated Jan. 17, 2018, 8 pages.
Invitation to Pay Additional Fees and Partial Search Report for International Patent Application No. PCT/US2017/026163, dated Aug. 1, 2017, 23 pages.
International Search Report and Written Opinion for International Patent Application No. PCT/US2017/026163, dated Oct. 25, 2017, 30 pages.
Author Unknown, "MBI5026: 16-bit Constant Current LED Sink Driver," Datasheet, Version 1.0, Mar. 2004, Hsinchu, Taiwan, www.DatasheetCatalog.com, Macroblock, Inc., pp. 1-15.
Non-Final Office Action for U.S. Appl. No. 15/399,729, dated Jan. 24, 2018, 12 pages.
Final Office Action for U.S. Appl. No. 15/399,729, dated Jun. 28, 2018, 9 pages.
Final Office Action for U.S. Appl. No. 15/401,240, dated Jun. 26, 2018, 11 pages.
Official Letter for Taiwanese Patent Application No. 106112033, dated Aug. 27, 2018, 19 pages.
Notice of Allowance for U.S. Appl. No. 15/399,729, dated Oct. 23, 2018, 8 pages.
Notice of Allowance for U.S. Appl. No. 15/401,240, dated Oct. 25, 2018, 7 pages.
International Preliminary Report on Patentability for International Patent Application No. PCT/US2017/026163, dated Oct. 25, 2018, 20 pages.
Invitation to Pay Additional Fees and Partial Search Report for International Patent Application No. PCT/US201 8/045102, dated Oct. 30, 2018, 14 pages.
Quayle Action for U.S. Appl. No. 15/896,805, dated Jan. 10, 2019, 5 pages.
Non-Final Office Action for U.S. Appl. No. 15/621,731, dated Dec. 31, 2018, 43 pages.
International Search Report and Written Opinion for International Patent Application No. PCT/US2018/045102, dated Jan. 21, 2019, 23 pages.
Non-Final Office Action for U.S. Appl. No. 15/399,729, dated Mar. 27, 2019, 9 pages.
Notice of Allowance for U.S. Appl. No. 15/401,240, dated Apr. 1, 2019, 8 pages.
Final Office Action for U.S. Appl. No. 15/621,731, dated Jul. 11, 2019, 15 pages.
Non-Final Office Action for U.S. Appl. No. 16/053,980, dated Jun. 13, 2019, 7 pages.
Notice of Allowance for U.S. Appl. No. 15/896,805, dated Jun. 21, 2019, 8 pages.
Examination Report for European Patent Application No. 17721889.8, dated Apr. 26, 2019, 12 pages.
Non-Final Office Action for U.S. Appl. No. 16/414,162, dated Sep. 13, 2019, 11 pages.
Non-Final Office Action for U.S. Appl. No. 16/414,162, dated Dec. 23, 2019, 10 pages.
Final Office Action for U.S. Appl. No. 16/414,162, dated Jul. 15, 2020, 11 pages.
Notice of Allowance for U.S. Appl. No. 16/414,162, dated Sep. 23, 2020, 8 pages.
Advisory Action and AFCP 2.0 Decision for U.S. Appl. No. 15/621,731, dated Oct. 9, 2019, 4 pages.
Non-Final Office Action for U.S. Appl. No. 15/621,731, dated Dec. 30, 2019, 15 pages.
Non-Final Office Action for U.S. Appl. No. 15/621,731, dated Jul. 8, 2020, 15 pages.
Notice of Allowance for U.S. Appl. No. 16/053,980, dated Oct. 21, 2019, 9 pages.

(56) References Cited

OTHER PUBLICATIONS

Non-Final Office Action for U.S. Appl. No. 16/174,584, dated Oct. 21, 2019, 7 pages.
Notice of Allowance for U.S. Appl. No. 16/174,584, dated Mar. 23, 2020, 11 pages.
Notice of Allowance for U.S. Appl. No. 16/229,986, dated Sep. 24, 2020, 8 pages.
Quayle Action for U.S. Appl. No. 16/229,986, dated May 29, 2020, 6 pages.
Examination Report for European Patent Application No. 17721889.8, dated Dec. 13, 2019, 5 pages.
International Preliminary Report on Patentability for International Patent Application No. PCT/US2018/045102, dated Feb. 13, 2020, 15 pages.
International Search Report and Written Opinion for International Patent Application No. PCT/IB2019/060455, dated Feb. 7, 2020, 17 pages.
Final Office Action for U.S. Appl. No. 15/621,731, dated Mar. 15, 2021, 17 pages.
Examination Report for European Patent Application No. 18762420.0, dated Jan. 28, 2021, 4 pages.
International Search Report and Written Opinion for International Patent Application No. PCT/US2020/057955, dated Feb. 12, 2021, 18 pages.
Notice of Allowance for U.S. Appl. No. 16/950,142, dated Jan. 18, 2022, 9 pages.
Notice of Reasons for Rejection for Japanese Patent Application No. 2018-553935, dated Jan. 5, 2022, 6 pages.
Office Action for Korean Patent Application No. 10-2021-7026409, dated Dec. 21, 2021, 4 pages.
Notice of Allowance and Examiner-Initiated Interview Summary for U.S. Appl. No. 17/078,733, dated Apr. 4, 2022, 9 pages.
Preliminary Examination Report for Taiwanese Patent Application No. 107127064, dated Mar. 10, 2022, 7 pages.
Invitation to Pay Additional Search Fees for European Patent Application No. 18762420.0, dated Feb. 11, 2022, 4 pages.
Decision of Dismissal of Amendment for Japanese Patent Application No. 2018-553935, dated Apr. 26, 2022, 4 pages.
Decision of Refusal for Japanese Patent Application No. 2018-553935, dated Apr. 26, 2022, 2 pages.
Notice of Reasons for Rejection for Japanese Patent Application No. 2020-505841, dated Apr. 19, 2022, 9 pages.
Examination Report for European Patent Application No. 18762420.0, dated Apr. 19, 2022, 10 pages.

\* cited by examiner

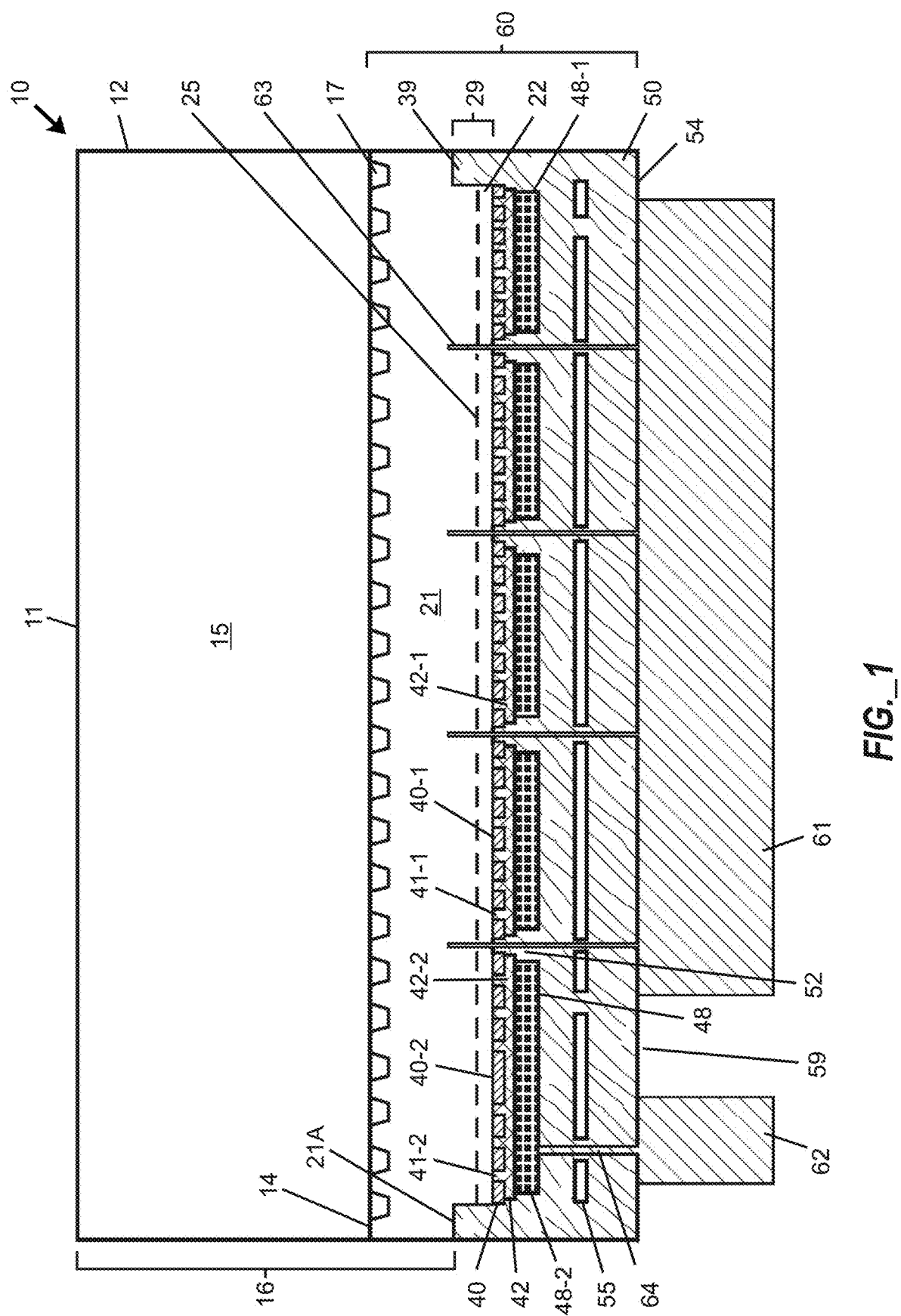
FIG._1

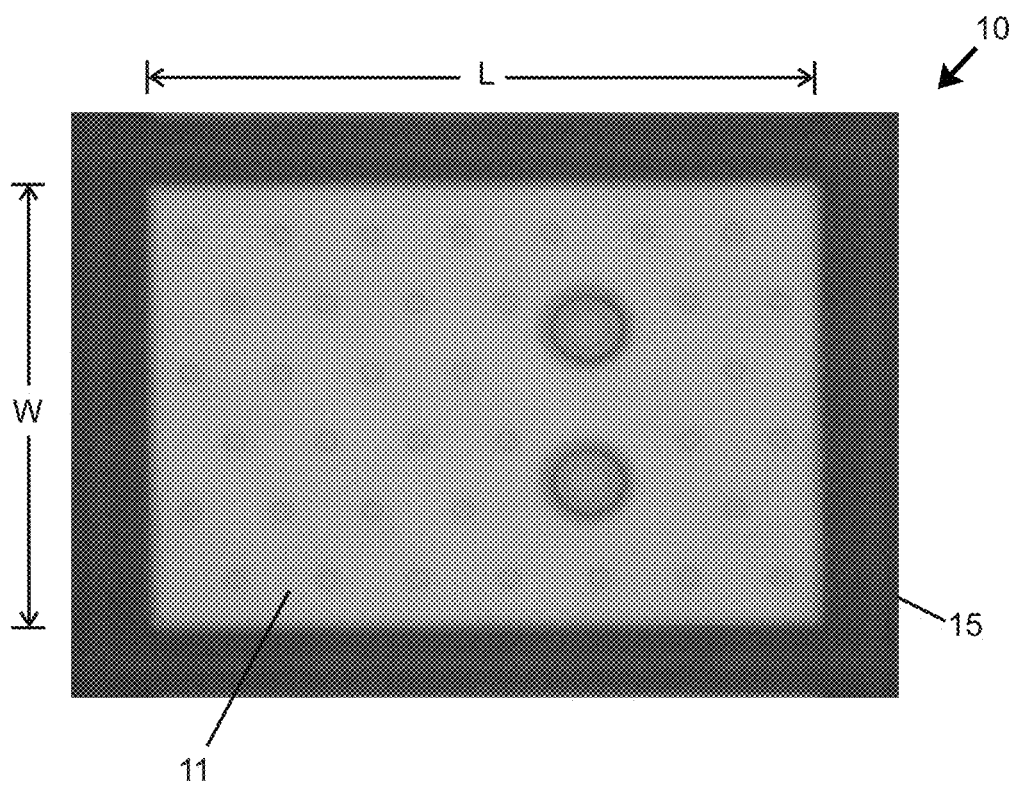
FIG._2A
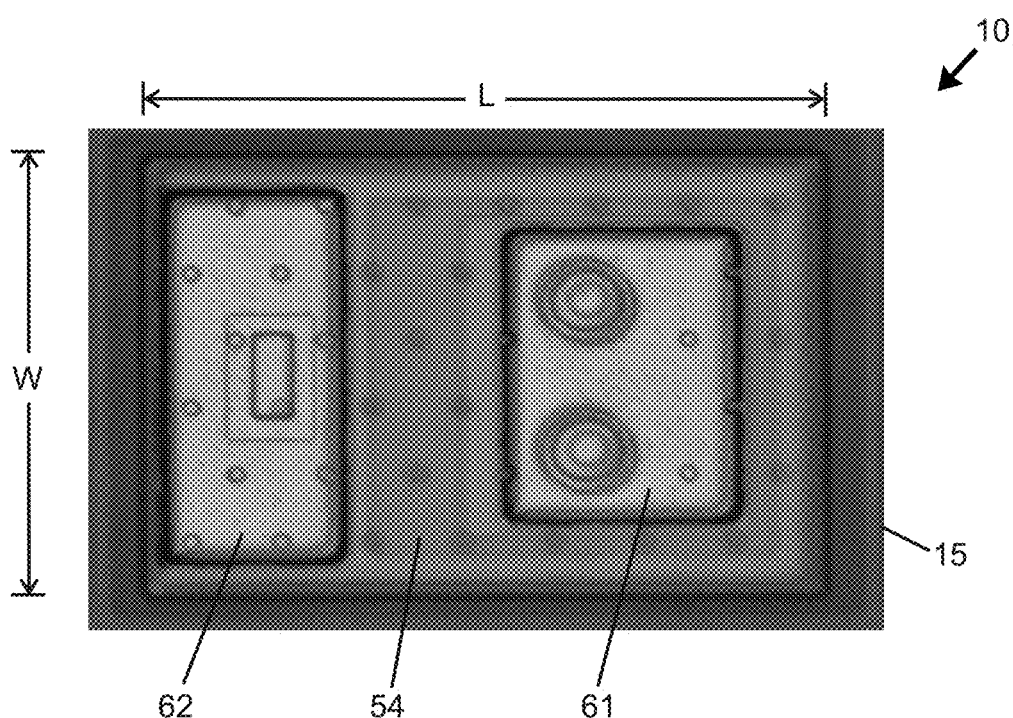
FIG._2B

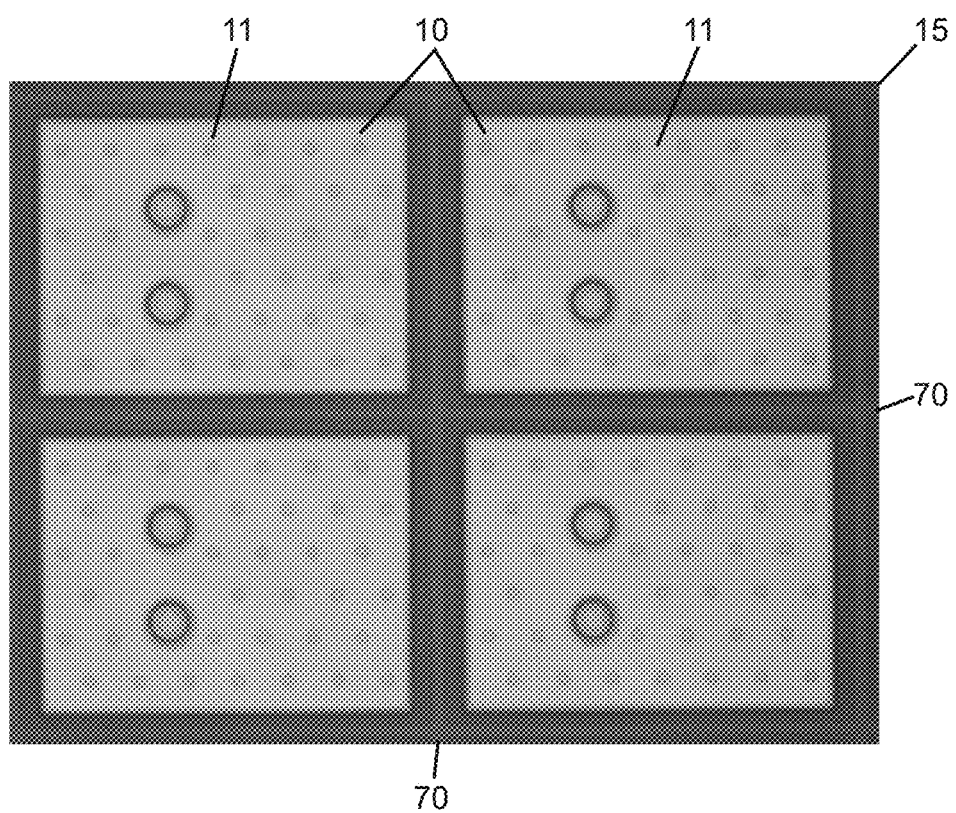
FIG._3A
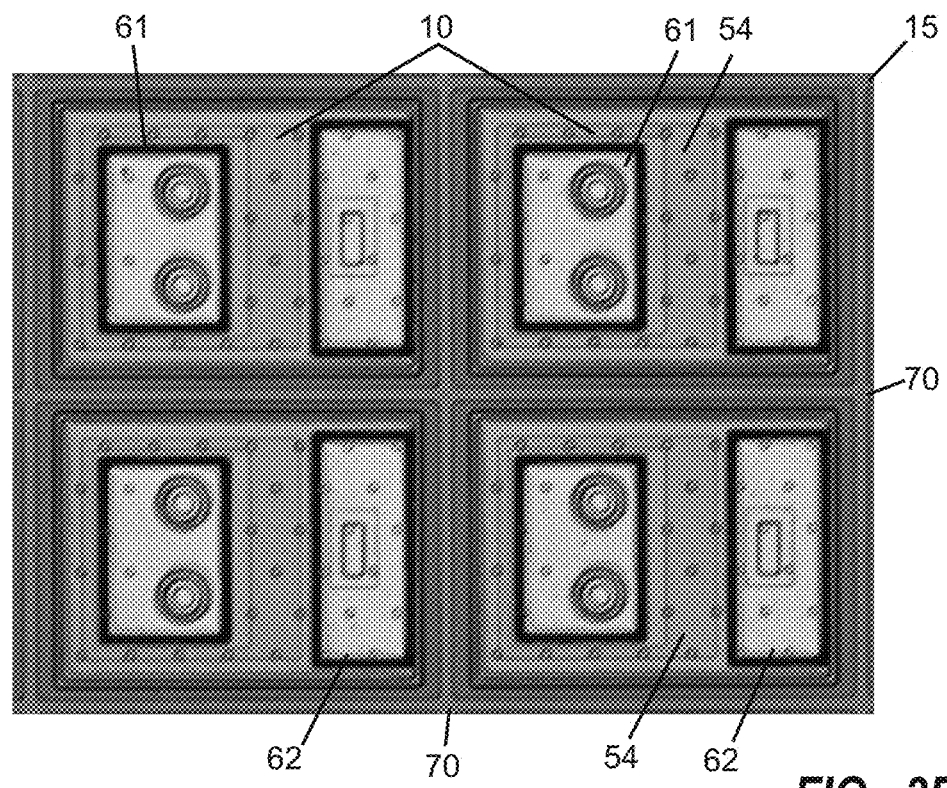
FIG._3B

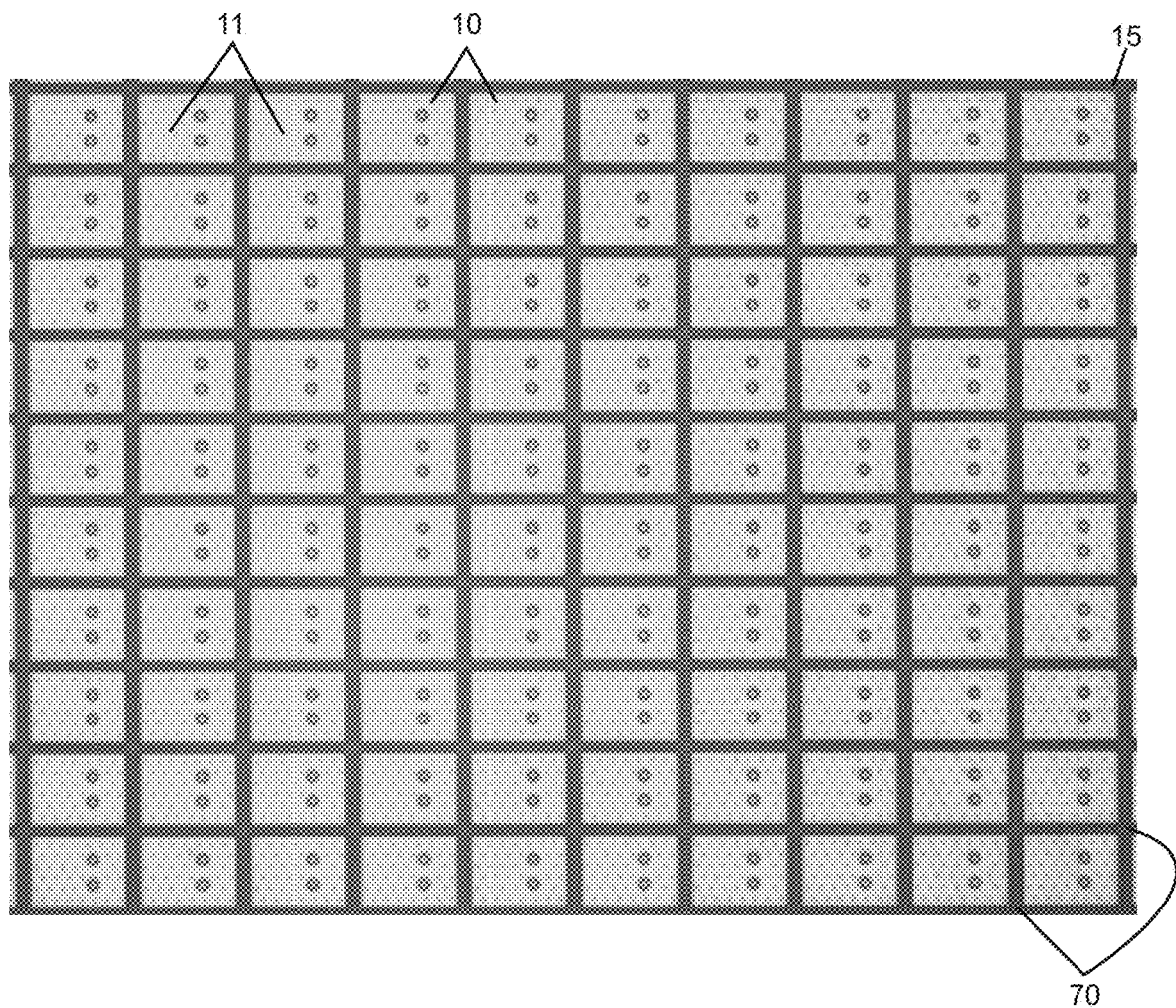
FIG._4A

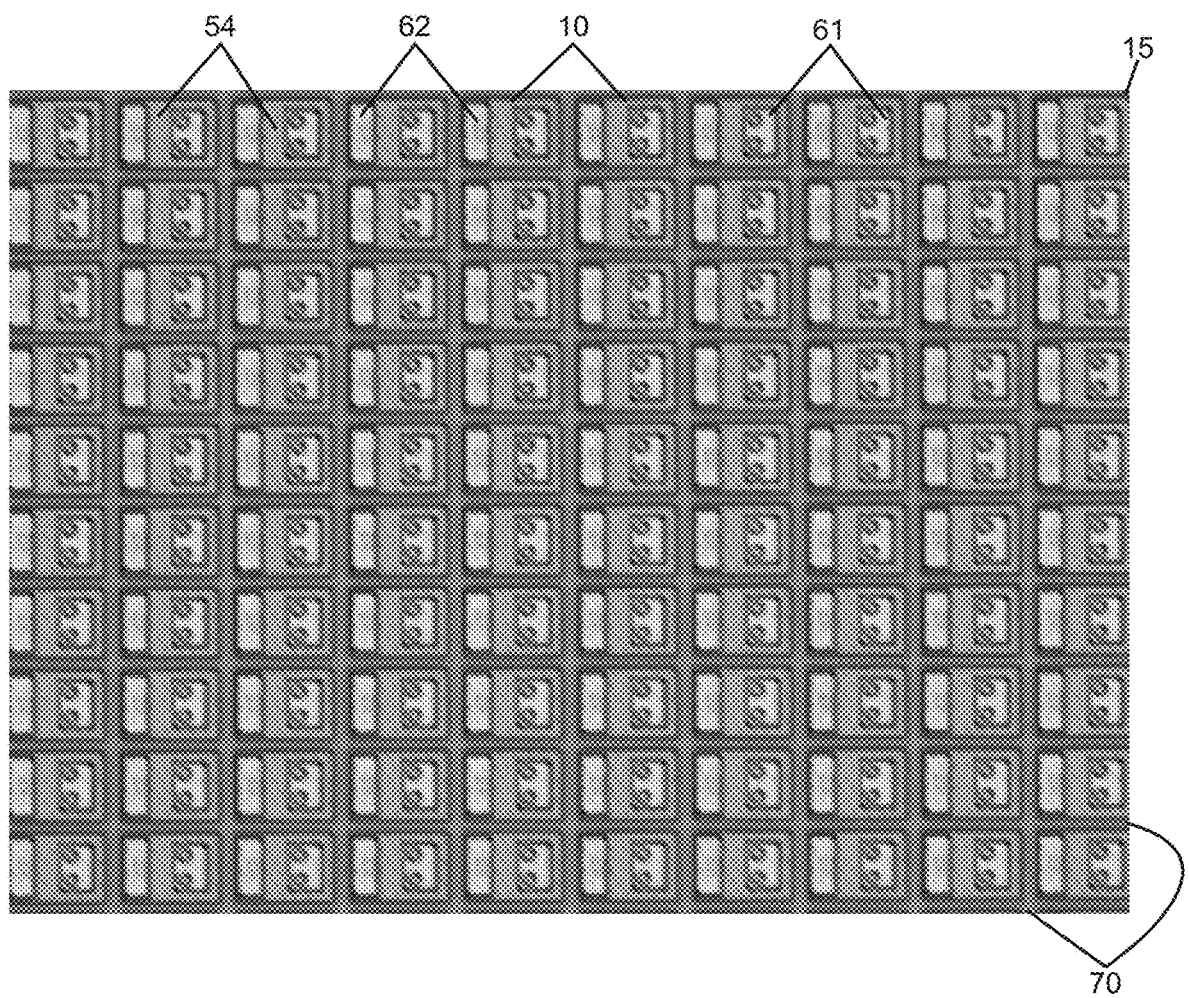
FIG._4B

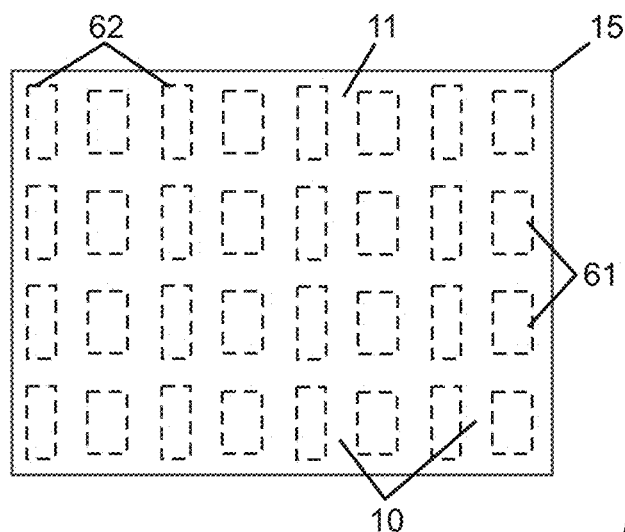
*FIG._5A*
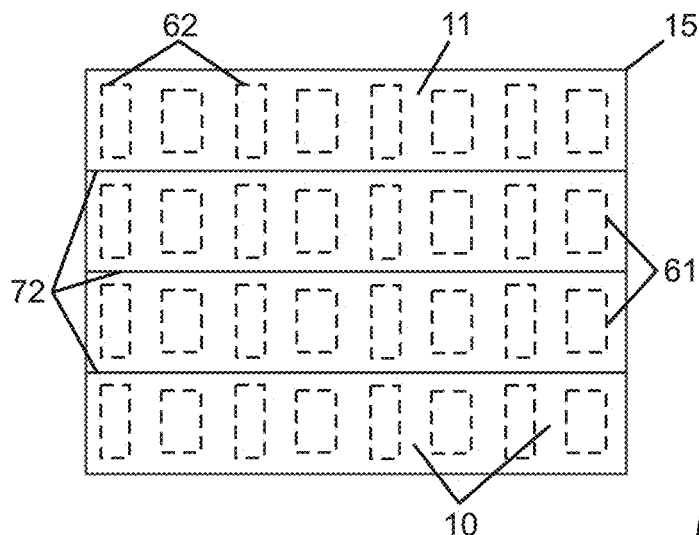
*FIG._5B*
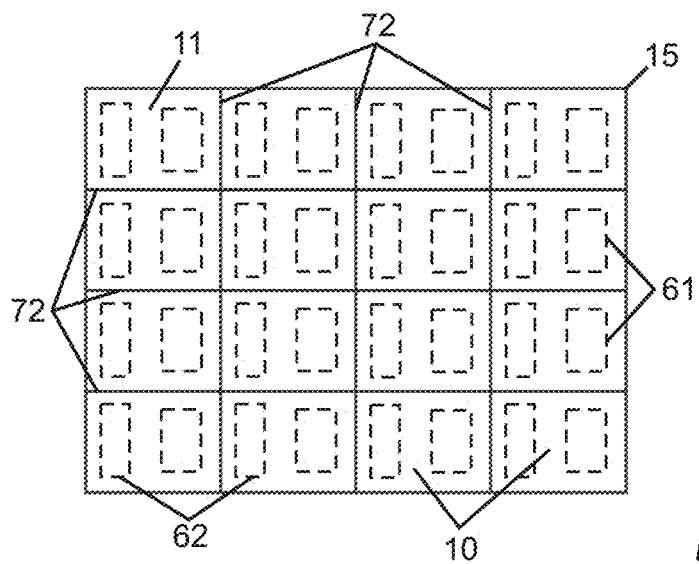
*FIG._5C*

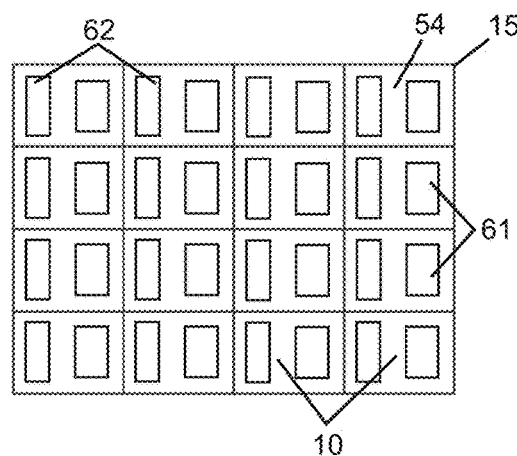
*FIG._6A*
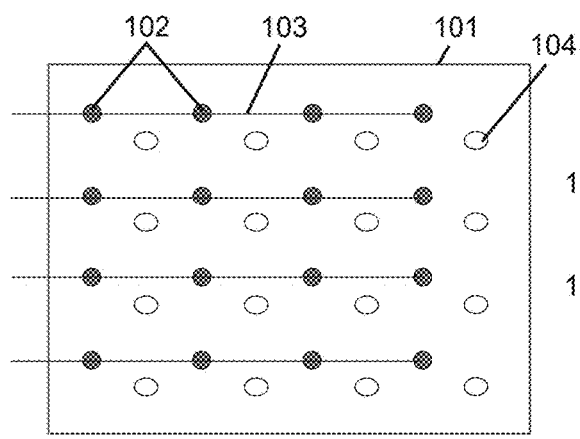
*FIG._6B*
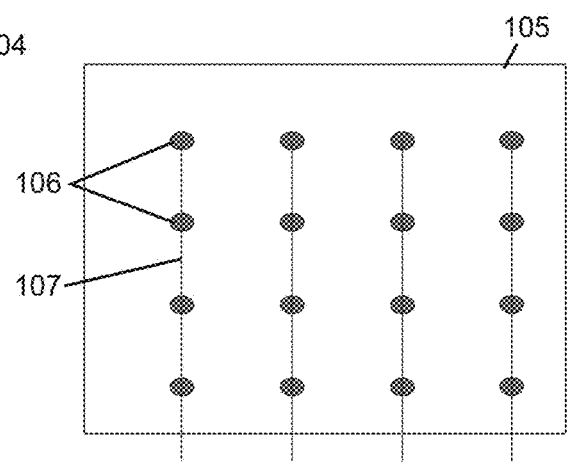
*FIG._6C*
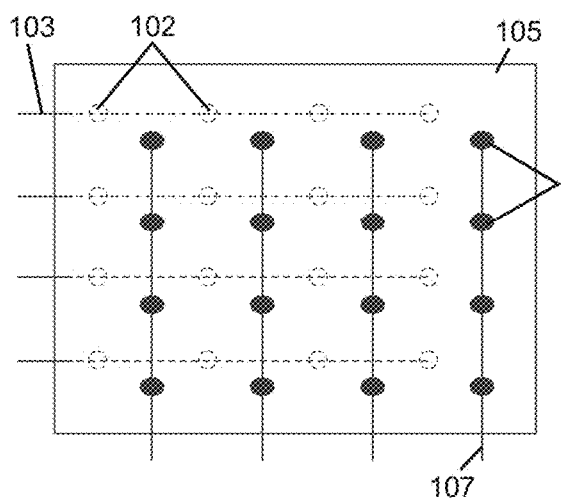
*FIG._6D*
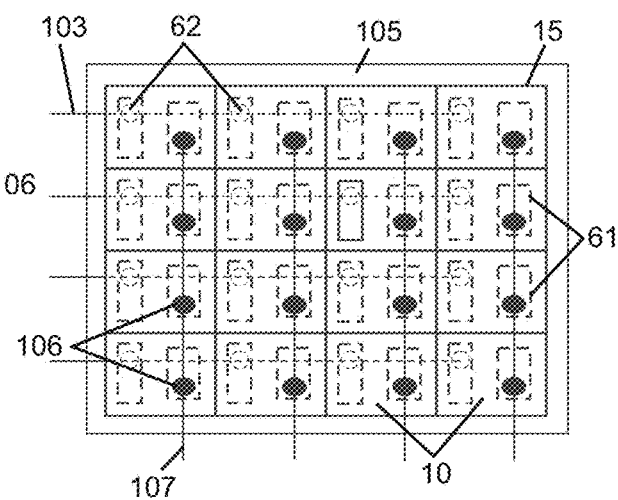
*FIG._6E*

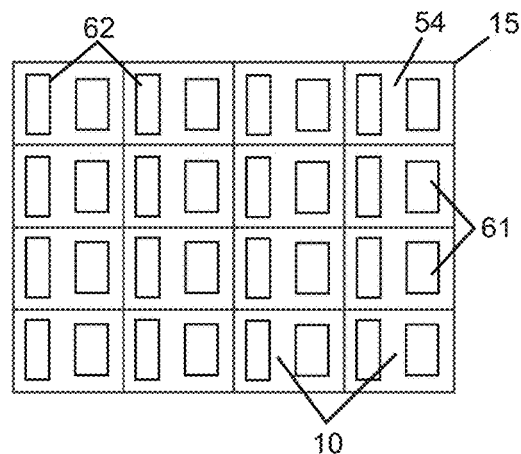
*FIG._7A*
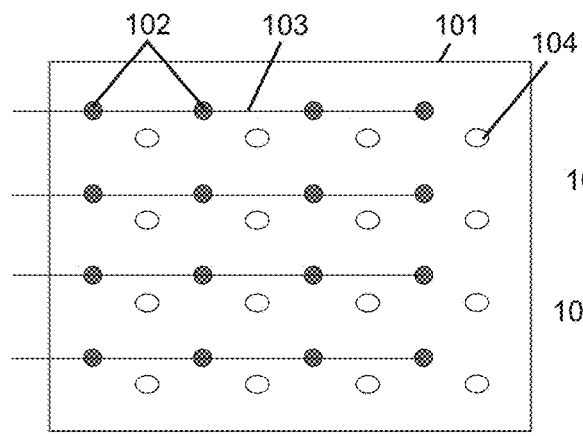
*FIG._7B*
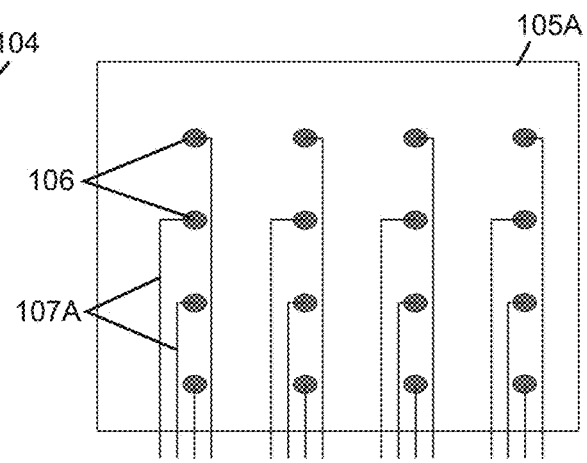
*FIG._7C*
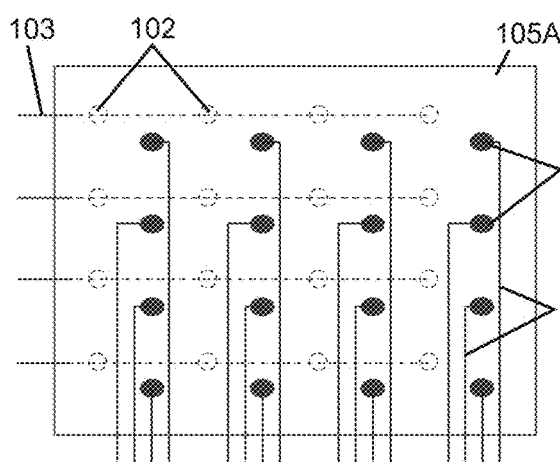
*FIG._7D*
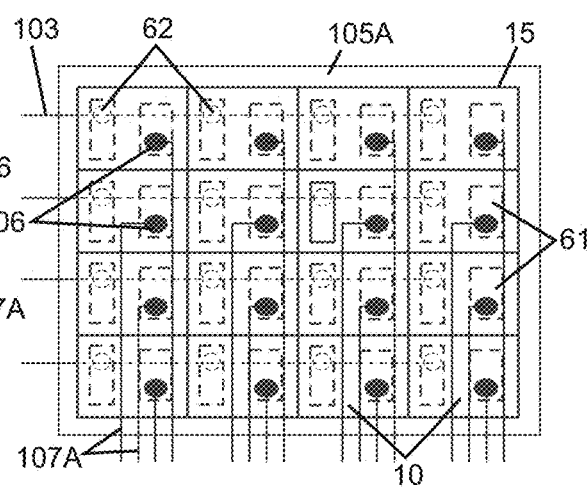
*FIG._7E*

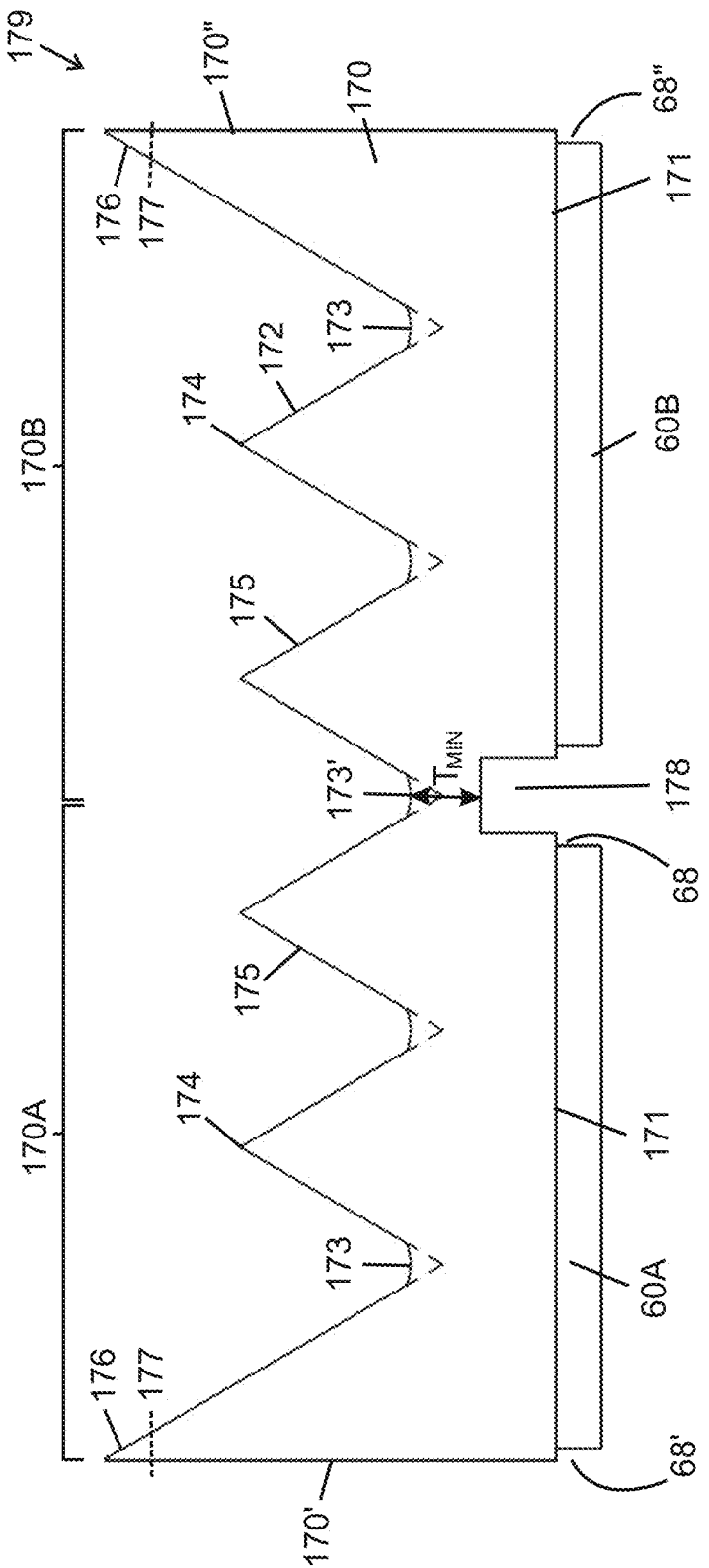
FIG._9A

| | Technology | Total pixel height | Thickness of interconnecting material | LF>90Candela /mm2 | Sharpness 70um | Contrast 120um | Pixel Homogeneity |
|---|---|---|---|---|---|---|---|
| A | 2x Full surface texture on thinned substrate with minimal material remaining | 65 | 5 | 100 | 135 | 360 | 4% |
| B | 2x Full surface texture on thinned substrate with significant material remaining | 110 | 50 | 105 | 360 | 1240 | 3% |
| C | 1x Full surface texture on thinned substrate with minimal material remaining | 150 | 5 | 110 | 160 | 550 | 16% |
| D | 3x Full surface texture on thinned substrate with minimal material remaining | 65 | 5 | 100 | 120 | 340 | -2% |
| E | 3x Full surface texture on thinned substrate with significant material remaining | 115 | 50 | 100 | 350 | 1270 | -2% |
| F | 2x Full surface texture on thinned substrate with minimal material remaining | 110 | 5 | 105 | 145 | 380 | +-8% |
| G | 3x Full surface texture on thinned substrate with minimal material remaining | 65 | 10 | 110 | 145 | 532 | +-2.5% |
| H | 3x Full surface texture on thinned substrate with minimal material remaining | 65 | 5 | 110 | 30 | 325 | +-2.5% |

*FIG._10*

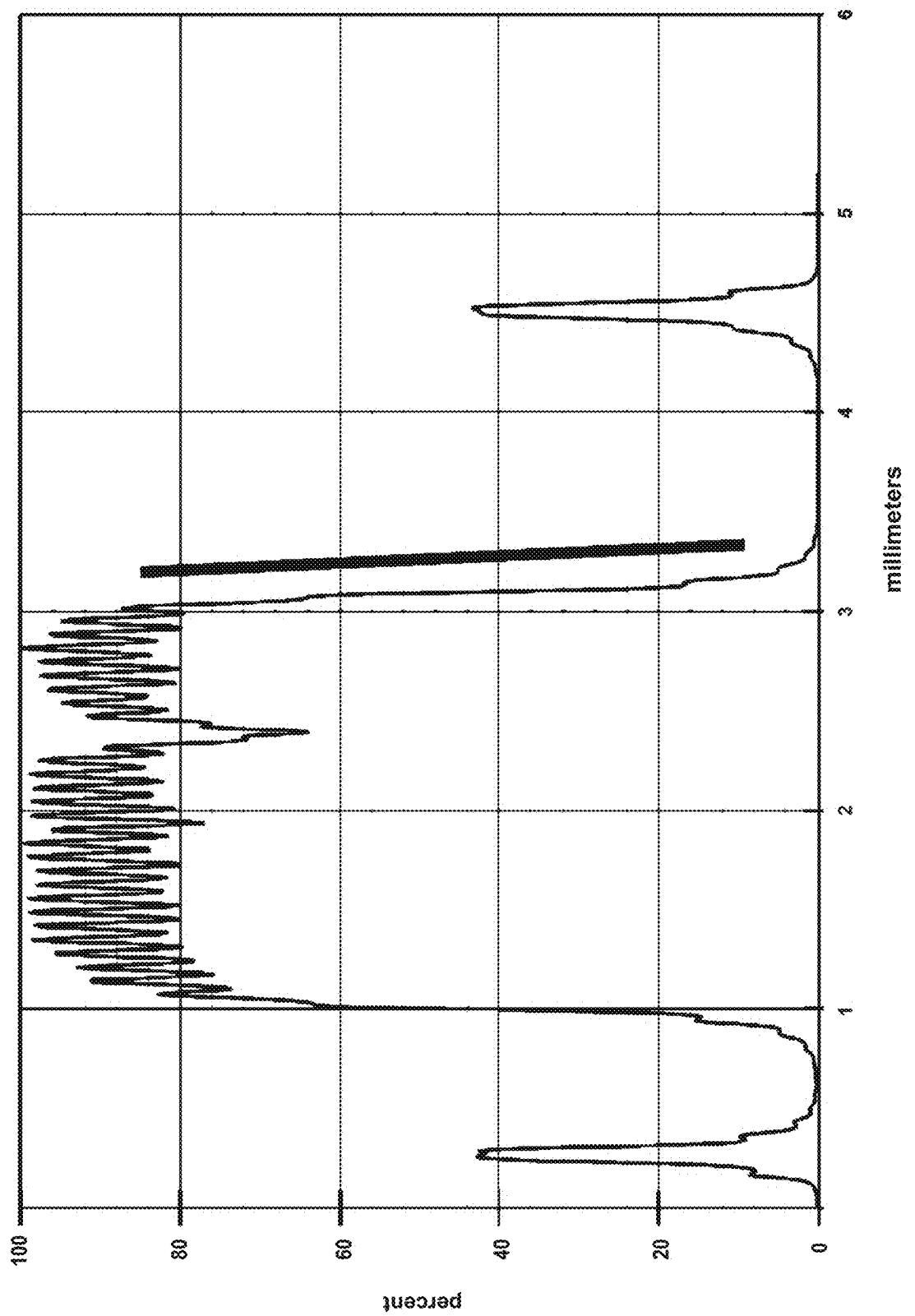
FIG._11A

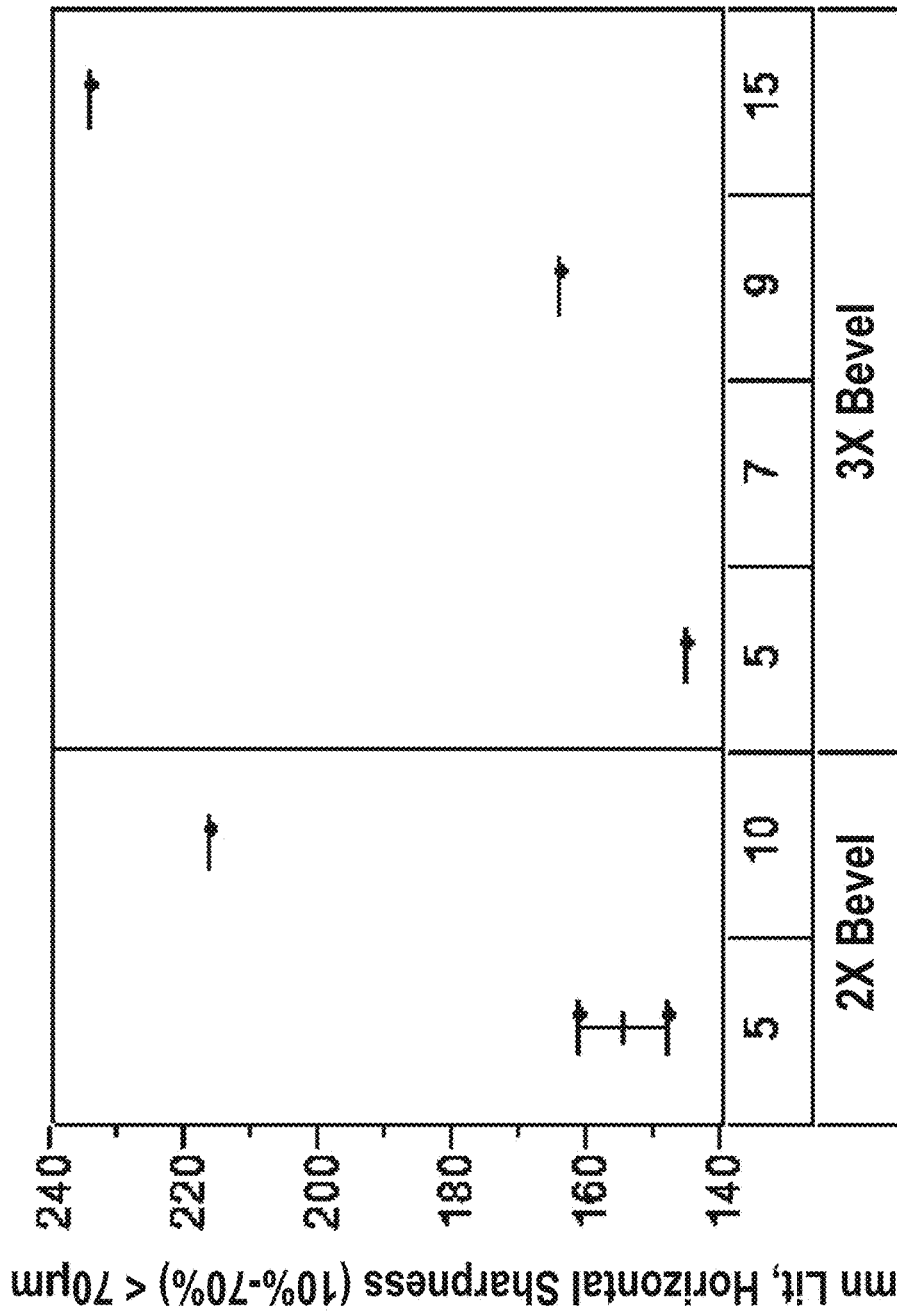
FIG._12D

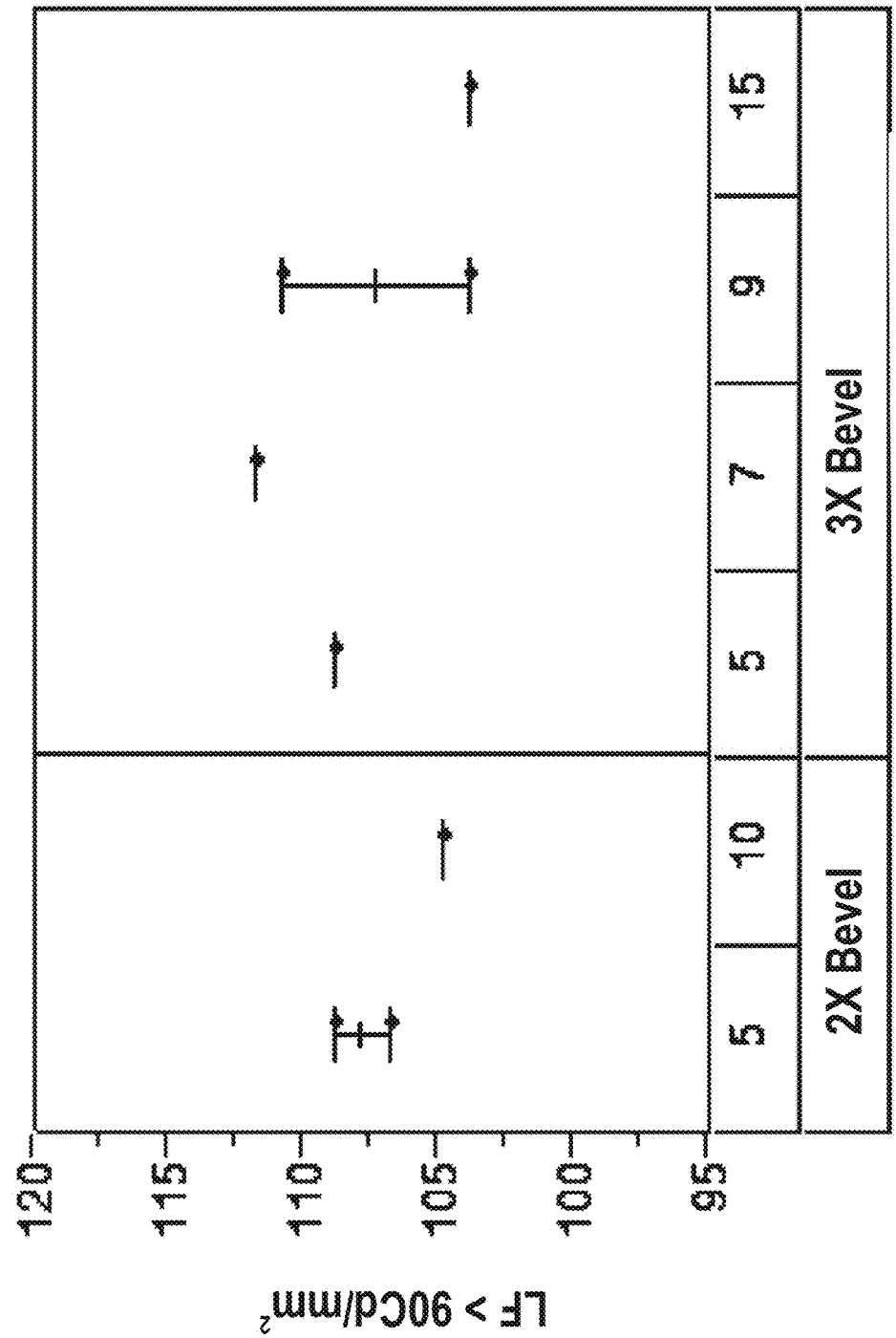
FIG._12E

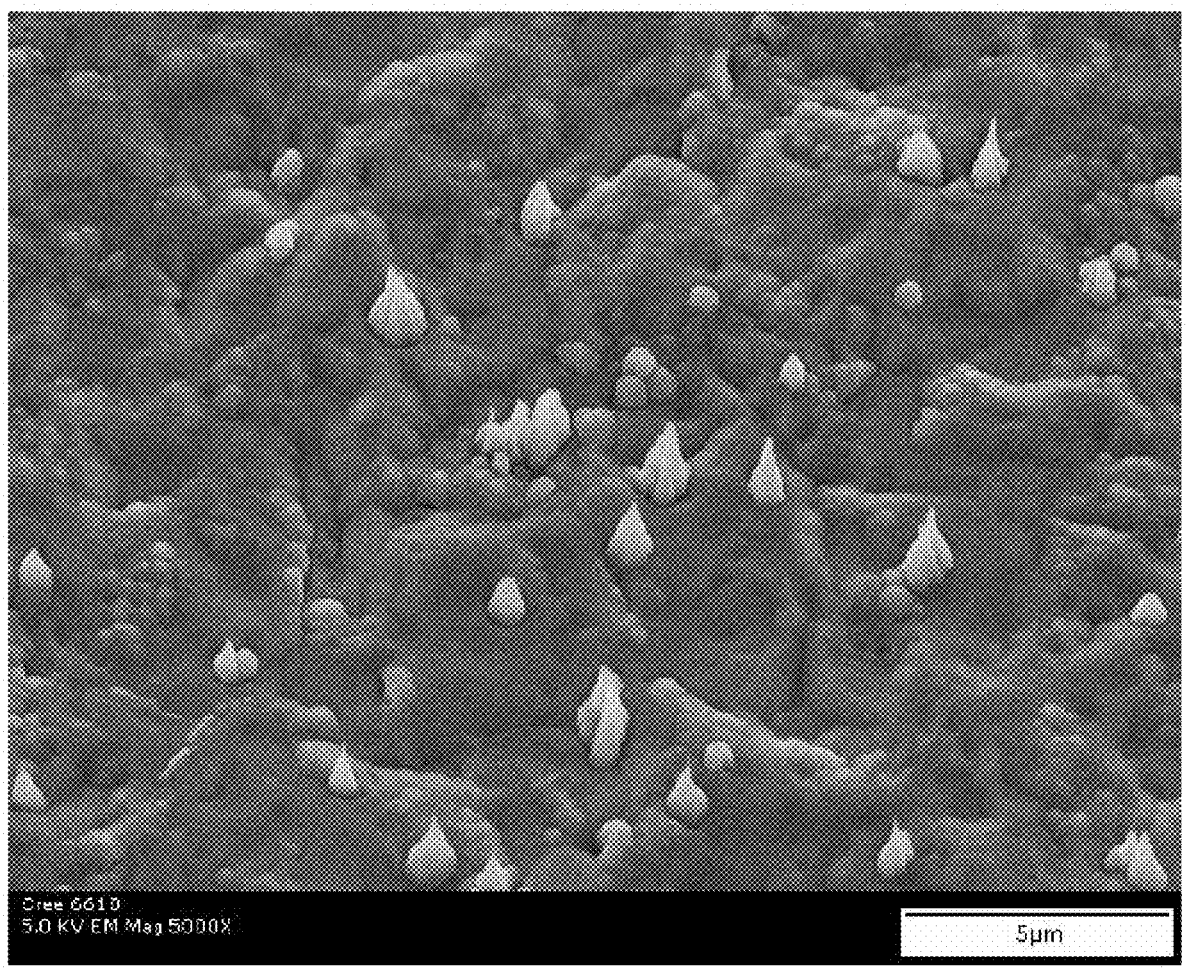
FIG._13

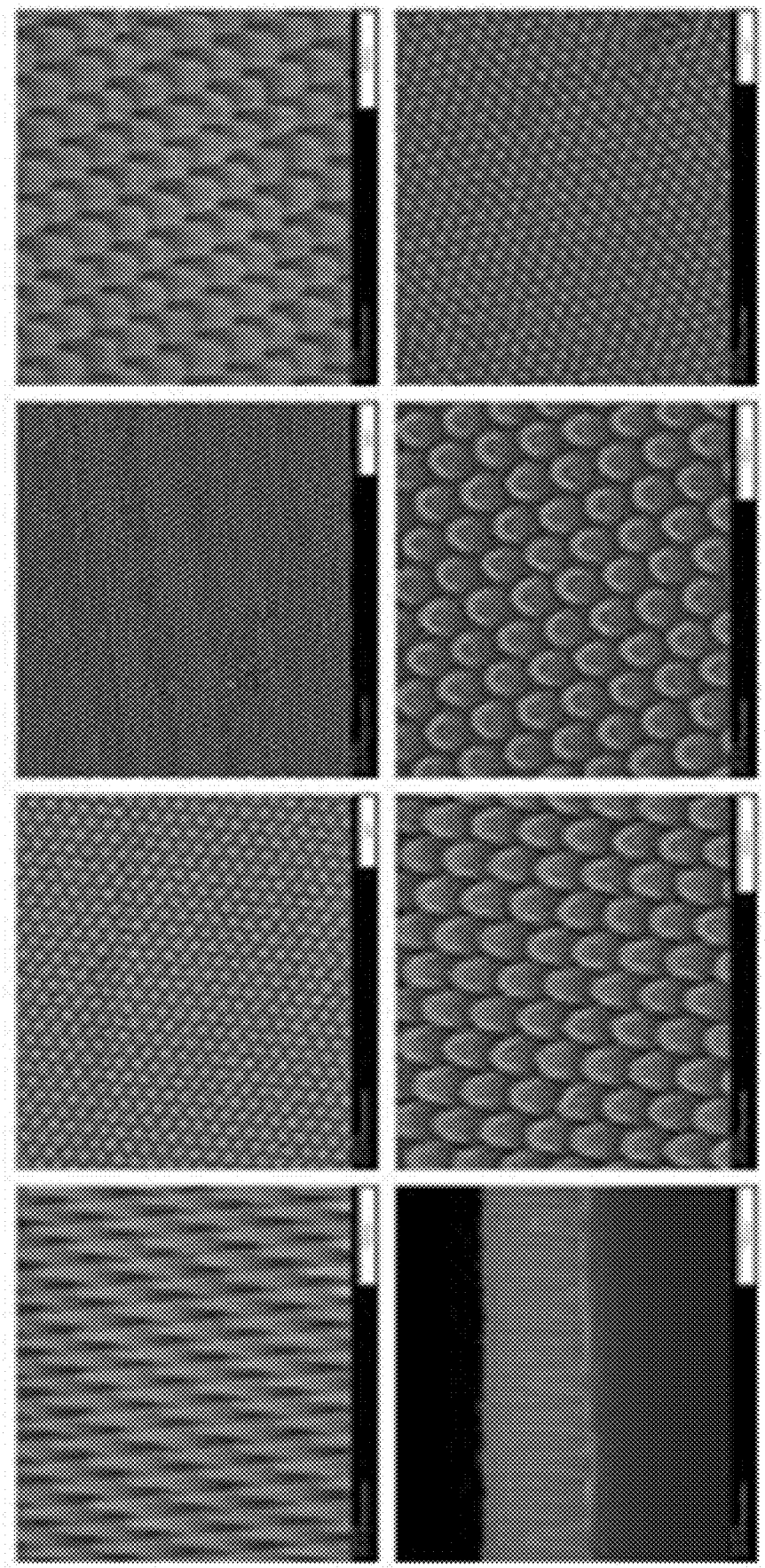
FIG._14

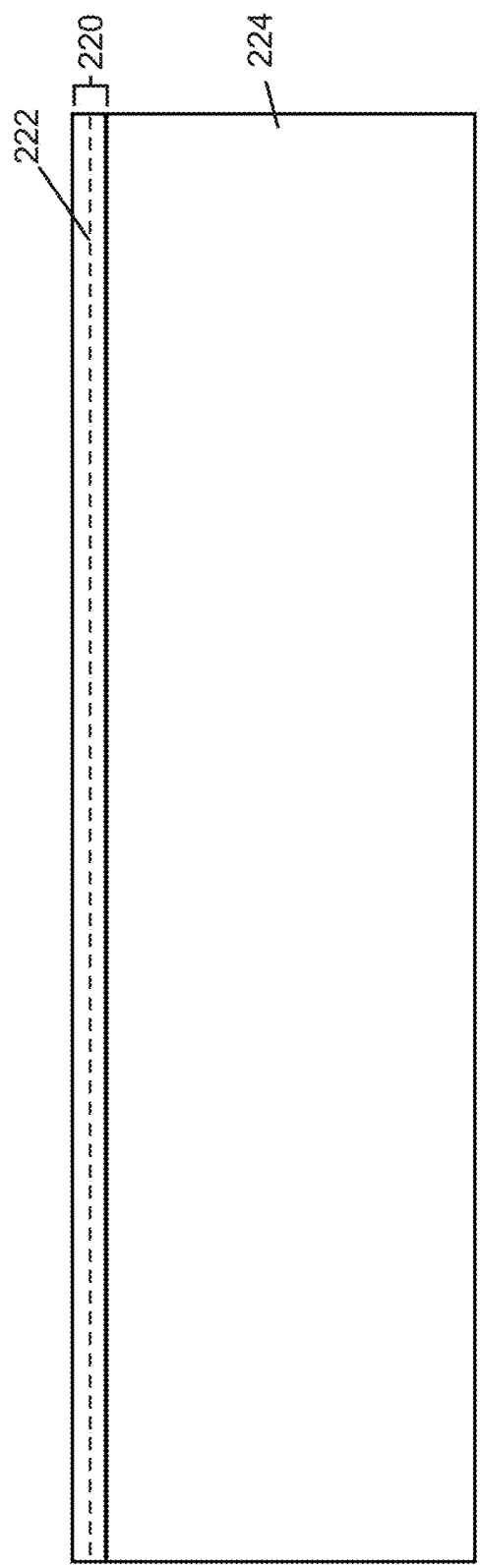
FIG. _15A

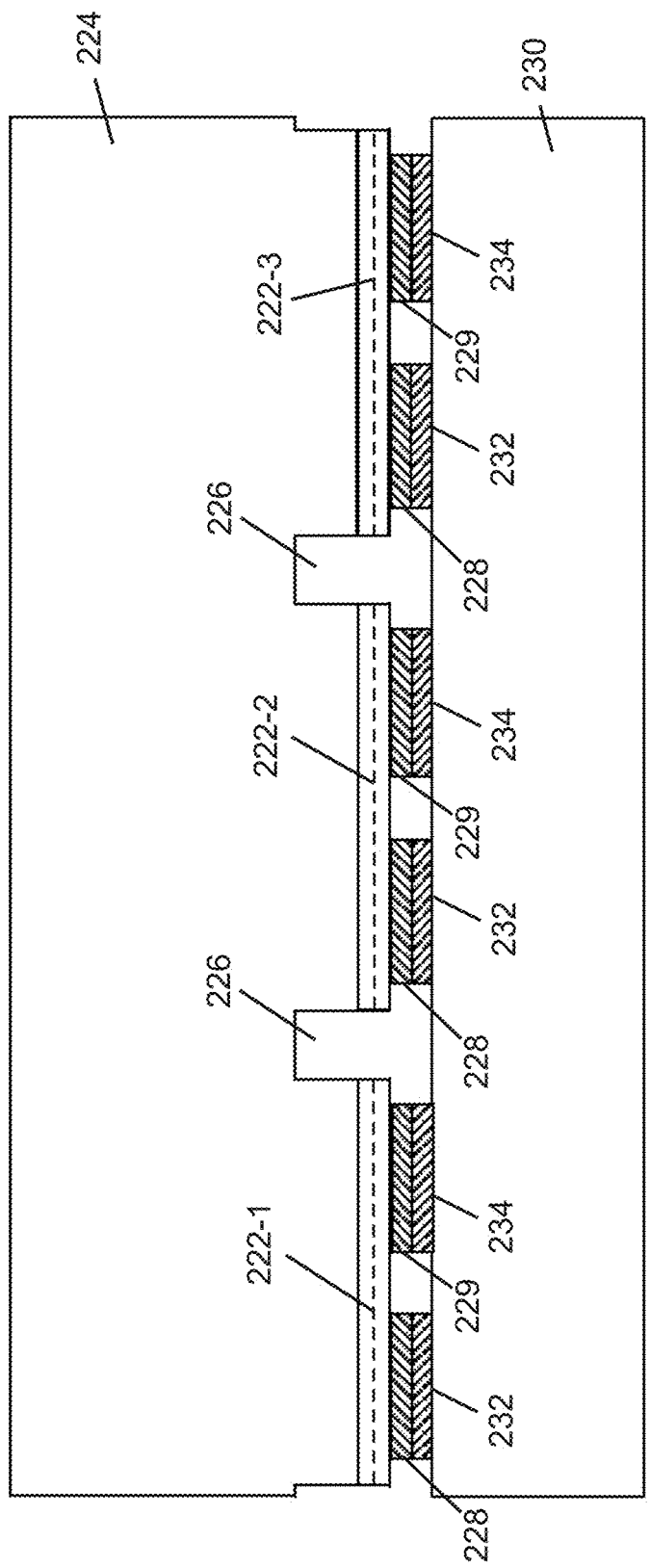
FIG. _15E

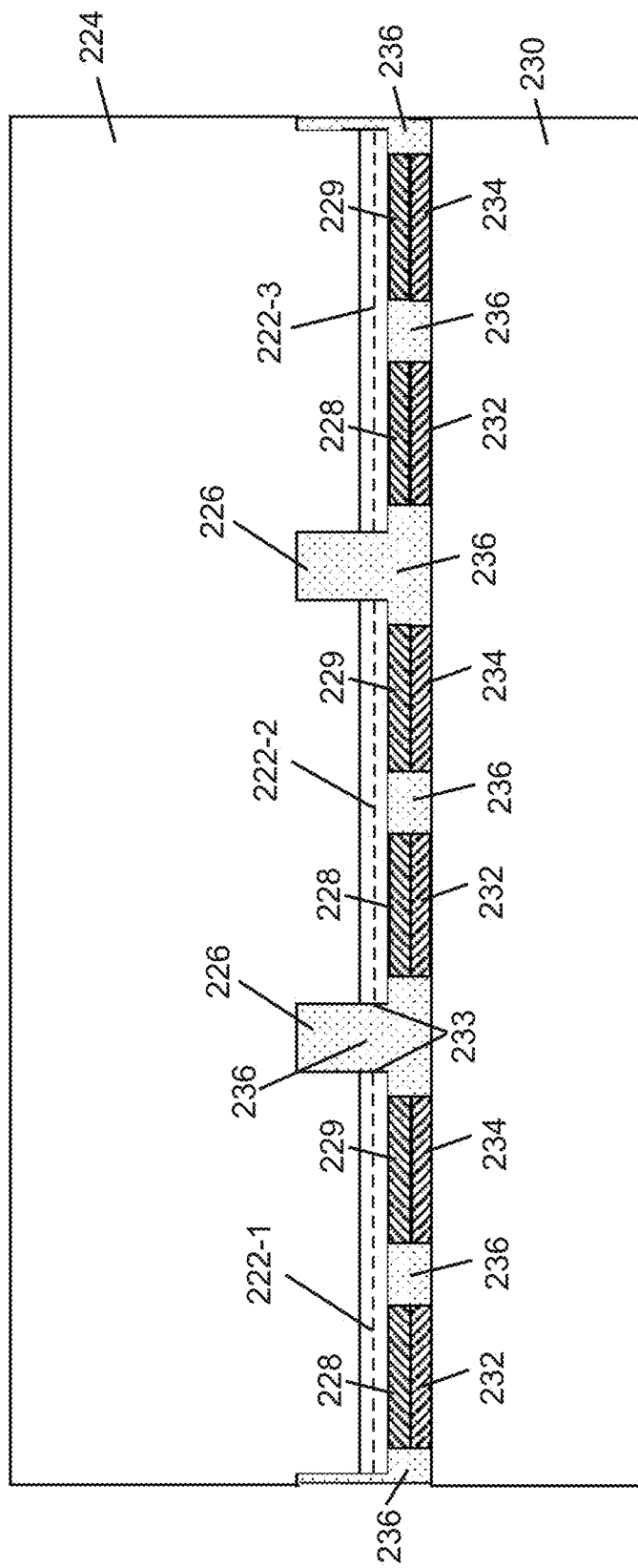
FIG._15F

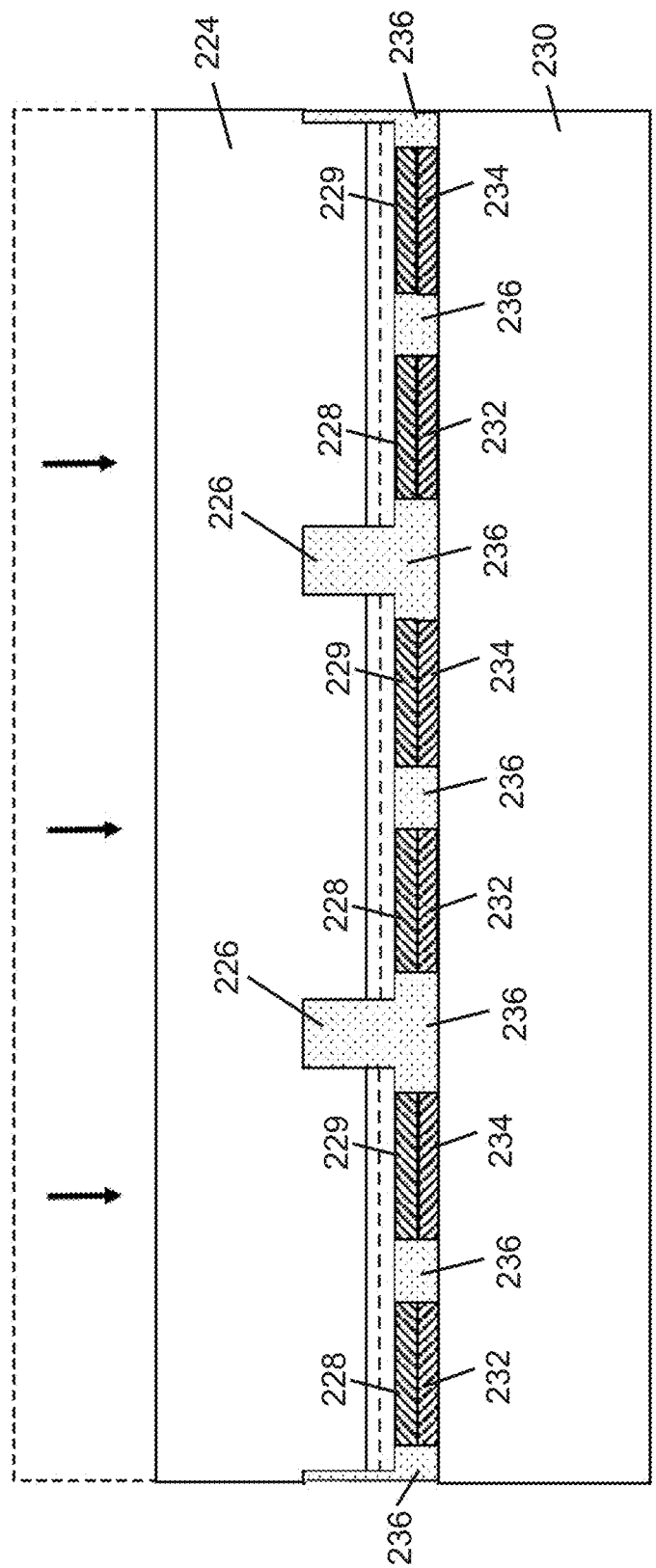
FIG._15G

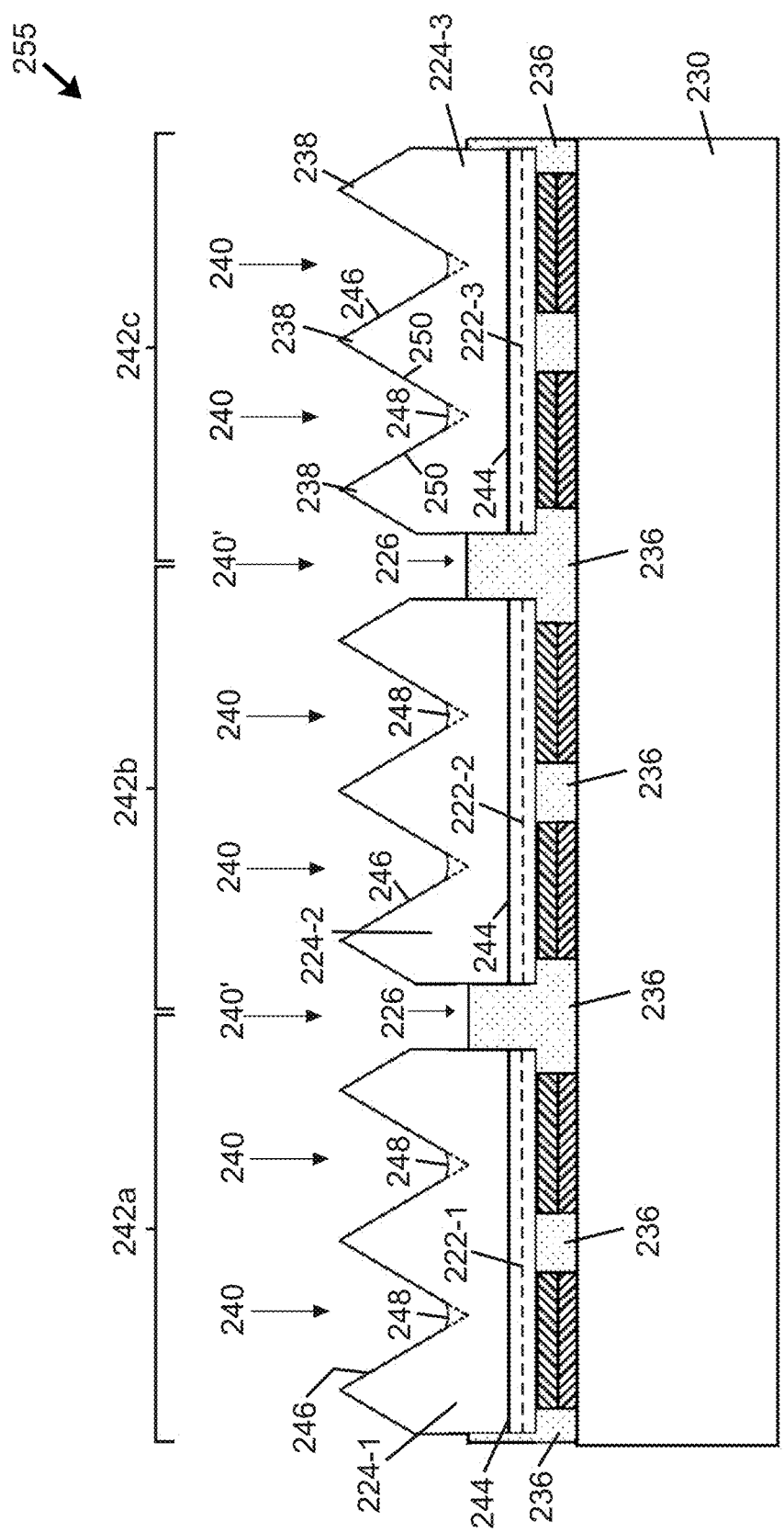
FIG._15H

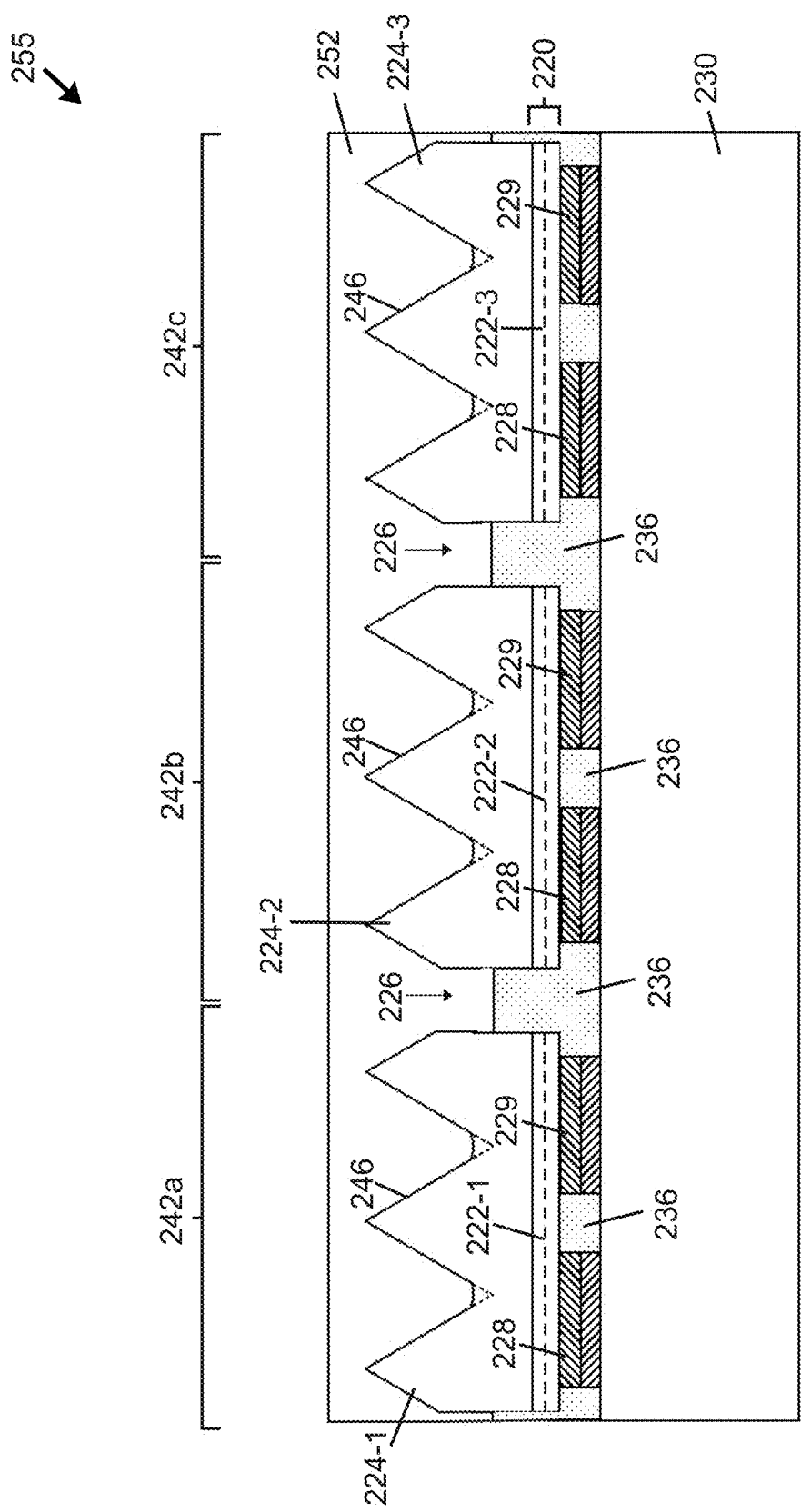
FIG._15I

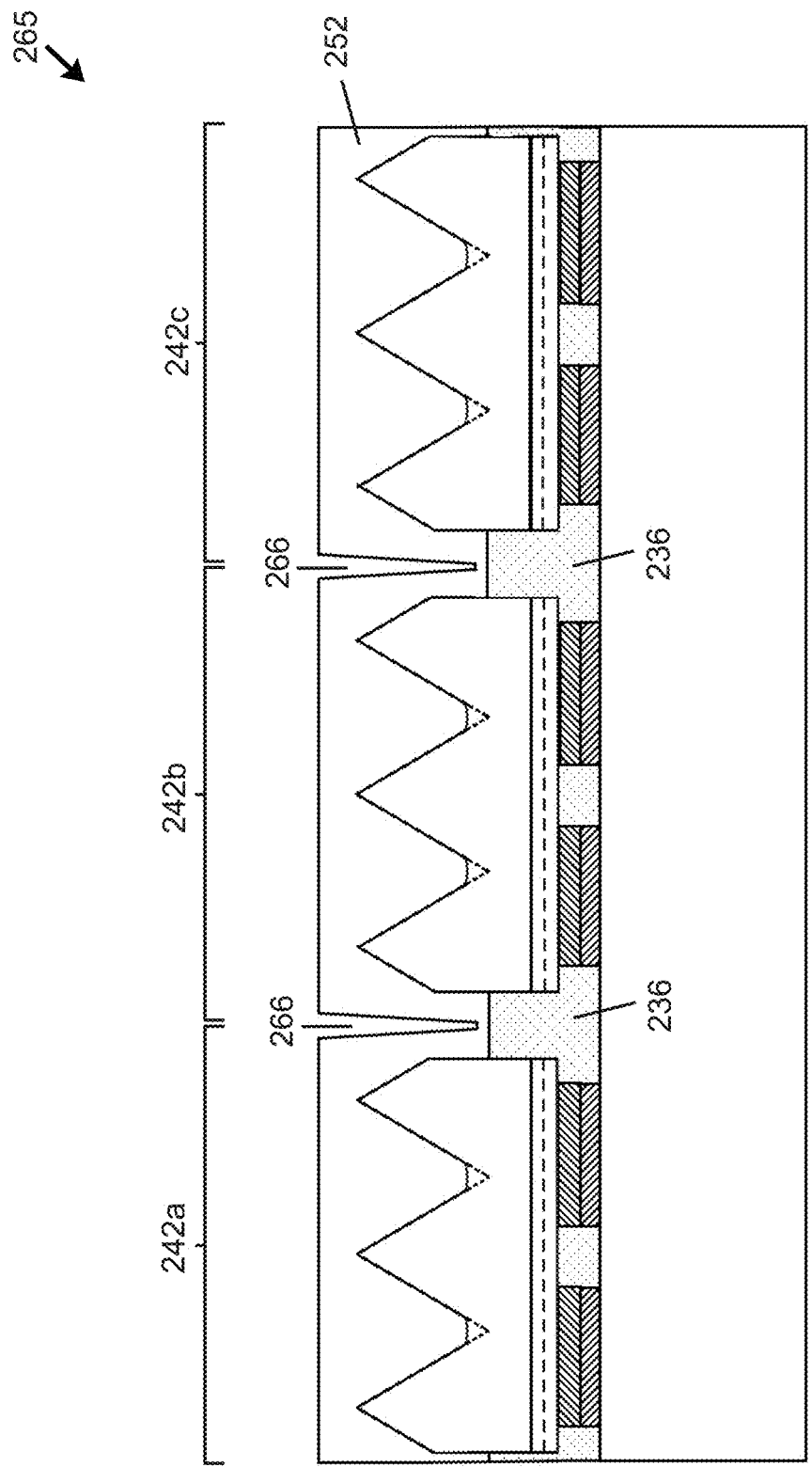
FIG. _16A

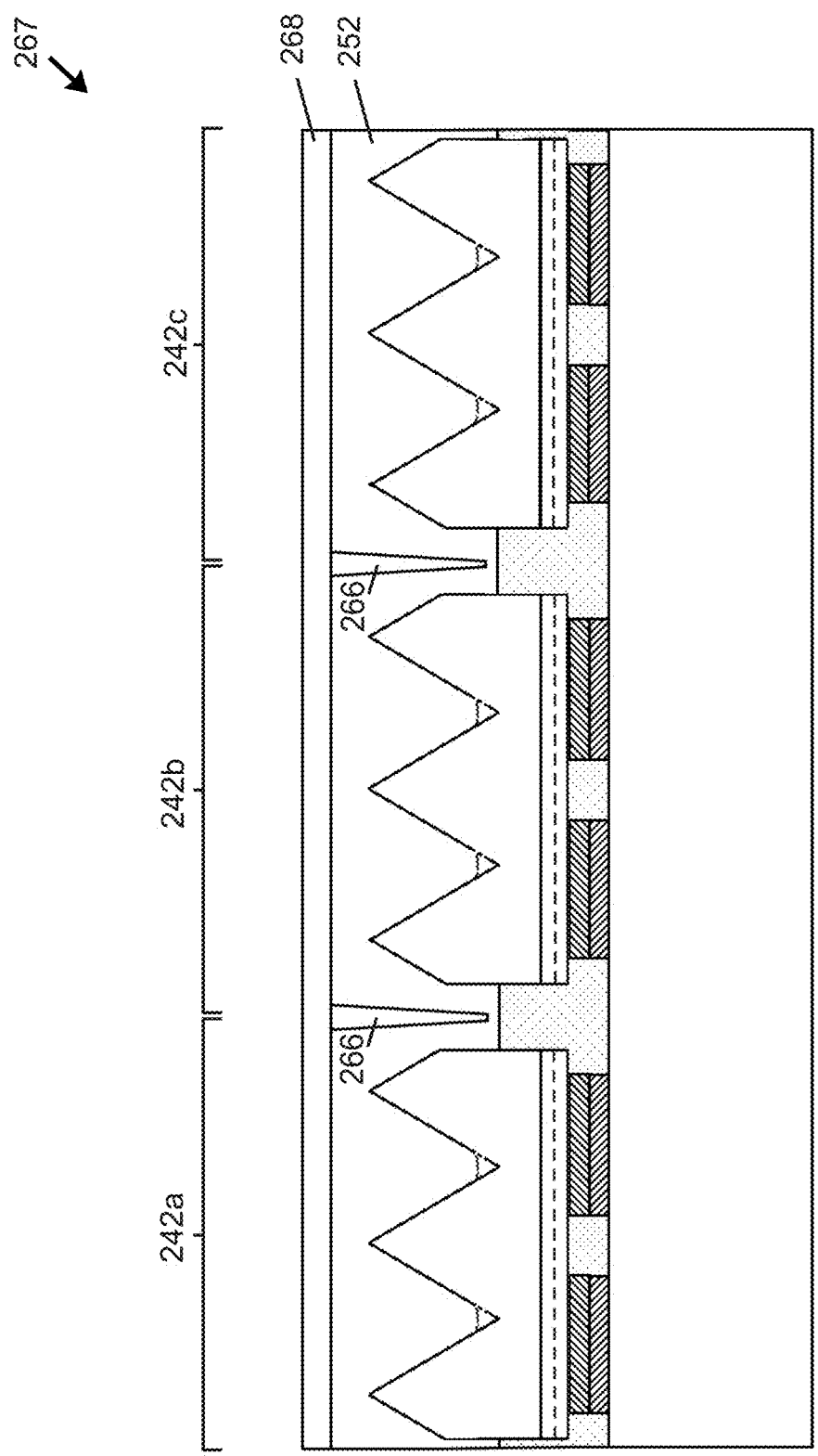
FIG._16B

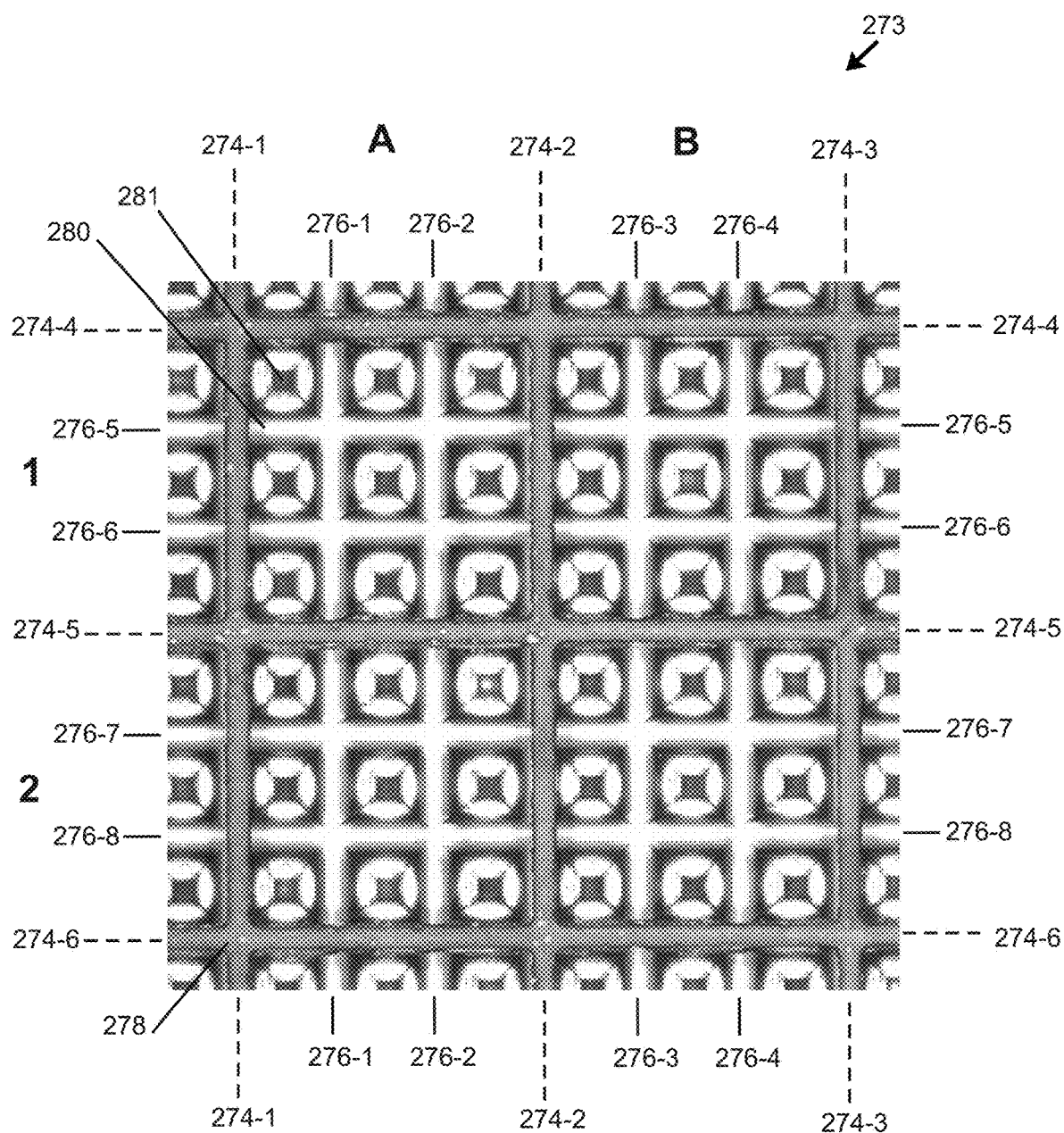
FIG._18

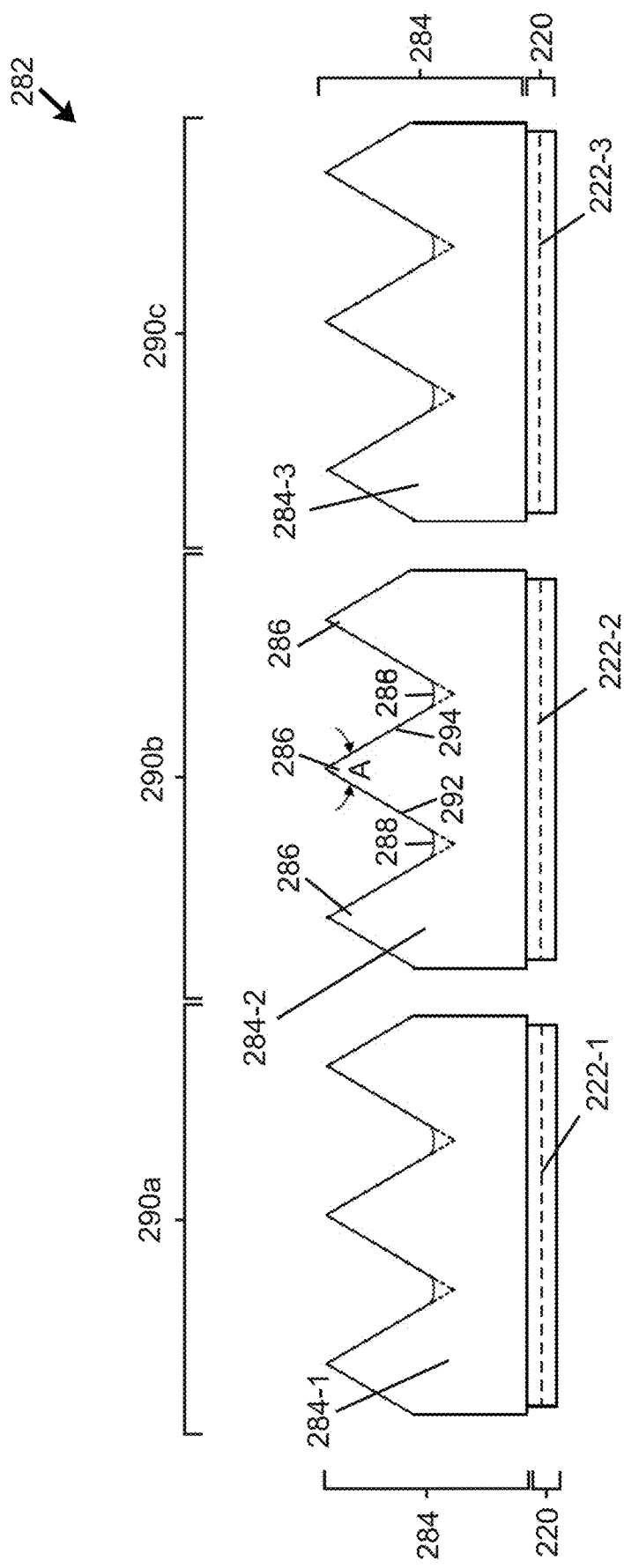
FIG._19

HIGH DENSITY PIXELATED-LED CHIPS AND CHIP ARRAY DEVICES

CROSS-REFERENCE TO RELATED APPLICATIONS

This application is a continuation of U.S. patent application Ser. No. 16/174,584 filed on Oct. 30, 2018, issuing as U.S. Pat. No. 10,734,363, which is a continuation of U.S. patent application Ser. No. 16/053,980 filed on Aug. 3, 2018 and subsequently issued as U.S. Pat. No. 10,651,357, and further claims priority to each of U.S. Provisional Patent Application No. 62/655,303 filed on Apr. 10, 2018, U.S. Provisional Patent Application No. 62/655,296 filed on Apr. 10, 2018, and U.S. Provisional Patent Application No. 62/541,033 filed on Aug. 3, 2017, wherein the entire contents of the foregoing applications and patents are hereby incorporated by reference herein.

TECHNICAL FIELD

Subject matter herein relates to solid state light-emitting devices, including electrically accessible light emitting diode (LED) array chips with reduced interaction between emissions of adjacent emitters, devices incorporating one or more LED array chips, and LED displays and illumination apparatuses including such devices, as well as related fabrication methods.

BACKGROUND

LEDs have been widely adopted in various illumination contexts, for backlighting of liquid crystal display (LCD) systems (e.g., as a substitute for cold cathode fluorescent lamps), and for sequentially illuminated LED displays. Applications utilizing LED arrays include automotive headlamps, roadway illumination, light fixtures, and various indoor, outdoor, and specialty contexts. Desirable characteristics of LED devices according to various end uses include high luminous efficacy, long lifetime, and wide color gamut.

Conventional color LCD display systems require color filters (e.g., red, green, and blue) that inherently reduce light utilization efficiency. Sequential illuminated LED displays, which utilize self-emitting LEDs and dispense with the need for backlights and color filters, provide enhanced light utilization efficiency.

Large format multi-color sequentially illuminated LED displays (including full color LED video screens) typically include numerous individual LED panels, packages, and/or components providing image resolution determined by the distance between adjacent pixels or "pixel pitch." Sequentially illuminated LED displays may include "RGB" three-color displays with arrayed red, green and blue LEDs, or "RG" two-color displays with arrayed red and green LEDs. Other colors and combinations of colors may be used. Large format displays (e.g., electronic billboards and stadium displays) intended for viewing from great distances typically have relatively large pixel pitches and usually include discrete LED arrays with multi-color (e.g., red, green, and blue) LEDs that may be independently operated to form what appears to a viewer to be a full color pixel. Medium-sized displays with relatively shorter viewing distances require shorter pixel pitches (e.g., 3 mm or less), and may include panels with arrayed red, green, and blue LED components mounted on a single electronic device attached to a driver printed circuit board (PCB) that controls the LEDs.

Various LED array applications, including (but not limited to) automotive headlamps, high resolution displays suitable for short viewing distances, and other lighting devices, may benefit from smaller pixel pitches; however, practical considerations have limited their implementation. Conventional pick-and-place techniques useful for mounting LED components and packages to PCBs may be difficult to implement in a reliable manner in high-density arrays with small pixel pitches. Additionally, due to the omnidirectional character of LED and phosphor emissions, it may be difficult to prevent emissions of one LED (e.g., a first pixel) from significantly overlapping emissions of another LED (e.g., a second pixel) of an array, which would impair the effective resolution of a LED array device. It may also be difficult to avoid non-illuminated or "dark" zones between adjacent LEDs (e.g., pixels) to improve homogeneity, particularly while simultaneously reducing crosstalk or light spilling between emissions of the adjacent LEDs. Moreover, addition of various light segregation or light steering structures within a beam path of one or more LEDs may result in reduced light utilization efficiency. The art continues to seek improved LED array devices with small pixel pitches while overcoming limitations associated with conventional devices and production methods.

SUMMARY

The present disclosure relates in various aspects to solid state light emitting devices including a plurality of independently electrically accessible active layer portions that form a plurality of pixels. In certain embodiments, various enhancements may beneficially provide increased contrast (i.e., reduced cross-talk between pixels) and/or promote inter-pixel illumination homogeneity, without unduly restricting light utilization efficiency. Other technical benefits may additionally or alternatively be achieved. Certain enhancements may also promote efficient manufacturability. Exemplary enhancements providing one or more of the foregoing beneficial effects include: aligning recess portions between at least some protruding features with lateral boundaries between pixels; providing different pixels with protruding features of different sizes, shapes, numbers, and/or distributions (i.e., inter-pixel variation); providing individual pixels with protruding features of different sizes and/or shapes (i.e., intra-pixel variation); providing protruding features having lateral faces with an angle of inclination from vertical in a range of from fifteen to forty-five degrees (or another angular subrange disclosed herein); providing protruding features with a width of from about one fifth to about one half of a maximum pixel width (or a maximum active region width); providing an underfill material between pixels for light segregation and mechanical support of pixels; adjusting composition, concentration, particle size and/or distribution of lumiphoric materials among different pixels; and adjusting composition, concentration, particle size and/or distribution of scattering materials among different pixels.

In certain embodiments, an array of LEDs may be formed by growing at least one active layer on a substrate formed of a light-transmissive material, and defining a plurality of intersecting first recesses defined through an entire thickness of the at least one active layer to laterally segregate the at least one active layer into a plurality of active layer portions supported by the substrate. The substrate includes a light injection surface supporting the array of LEDs, and a light extraction surface that generally opposes the light injection surface. A plurality of intersecting second recesses that extends through the light injection surface and may extend through an entire thickness of the substrate serves to (a) define borders between light-transmissive portions of the substrate and (b) reduce crosstalk between the light-transmissive portions. Protruding features of the light extraction surface may be separated by a plurality of intersecting light extraction surface recesses.

In one aspect of the disclosure, a pixelated-LED chip comprises: an active layer comprising a plurality of active layer portions; and a plurality of substrate portions supporting the plurality of active layer portions, wherein each substrate portion comprises a light-transmissive material, a light injection surface, and a light extraction surface, wherein the light injection surface is arranged between the active layer and the light extraction surface; wherein each active layer portion of the plurality of active layer portions is independently electrically accessible and is configured to illuminate a different substrate portion of the plurality of substrate portions and transmit light through the light extraction surface of the substrate portion, such that the plurality of active layer portions and the plurality of substrate portions form a plurality of pixels; wherein the light extraction surface of each substrate portion comprises a plurality of protruding features and a plurality of light extraction surface recesses, and each protruding feature of the plurality of protruding features is separated from at least one other protruding feature by a light extraction surface recess of the plurality of light extraction surface recesses; and wherein lateral borders between different pixels of the plurality of pixels are aligned with selected light extraction surface recesses of the plurality of light extraction surface recesses.

In certain embodiments, the lateral borders between different pixels of the plurality of pixels are aligned with selected light extraction surface recesses of the plurality of light extraction surface recesses that extend through an entire thickness of the substrate portions.

In certain embodiments, the plurality of protruding features comprises a first group of protruding features comprising a first size, and comprises a second group of protruding features comprising a second size, wherein the second size differs from the first size.

In certain embodiments, the first size and the second size comprise at least one of height, width, or length.

In certain embodiments, the plurality of protruding features comprises a first group of protruding features comprising a first shape, and comprises a second group of protruding features comprising a second shape, wherein the second shape differs from the first shape.

In certain embodiments, each protruding feature of the plurality of protruding features comprises a polyhedral or truncated polyhedral shape with a plurality of inclined lateral faces, and each inclined lateral face of the plurality of inclined lateral faces comprises an angle of inclination from vertical in a range of from about fifteen degrees to about forty-five degrees.

In certain embodiments, each protruding feature of the plurality of protruding features comprises a maximum width of from about one fifth to about one half of a maximum width of a pixel of the plurality of pixels with which each protruding feature is associated.

In certain embodiments, the plurality of substrate portions comprises a plurality of lateral edges; the plurality of protruding features comprises a first group of protruding features positioned adjacent to at least some lateral edges of the plurality of lateral edges, and comprises a second group of protruding features positioned distal from the plurality of lateral edges; and at least some protruding features of the first group of protruding features differ in at least one of (a) size, (b) shape, (c) number, or (d) distribution relative to at least some protruding features of the second group of protruding features.

In certain embodiments, the plurality of substrate portions comprises a plurality of corners; the plurality of protruding features comprises a first group of protruding features positioned adjacent to the plurality of corners, and comprises a second group of protruding features positioned distal from the plurality of corners; and at least some protruding features of the first group of protruding features differ in at least one of (a) size, (b) shape, (c) number, or (d) distribution relative to at least some protruding features of the second group of protruding features.

In certain embodiments, the pixelated-LED chip further comprises at least one lumiphoric material arranged on or over the plurality of protruding features, wherein the at least one lumiphoric material is configured to receive at least a portion of light emitted by the plurality of active layer portions and to responsively generate lumiphor emissions.

In certain embodiments, lumiphoric material associated with at least one first pixel of the plurality of pixels differs with respect to at least one of (a) composition, (b) concentration, (c) particle size, or (d) distribution relative to lumiphoric material associated with at least one second pixel of the plurality of pixels.

In certain embodiments, the plurality of substrate portions comprises silicon carbide, and the plurality of active layer portions comprises at least one Group III nitride material.

In certain embodiments, each active layer portion of the plurality of active layer portions includes a separate anode and cathode.

In another aspect of the disclosure, a pixelated-LED chip comprises: an active layer comprising a plurality of active layer portions, wherein each active layer portion of the plurality of active layer portions is independently electrically accessible to form a plurality of pixels; wherein each pixel of the plurality of pixels comprises an anode and a cathode; and an underfill material arranged between (i) lateral sidewalls of the plurality of pixels and (ii) between the anode and the cathode of each pixel of the plurality of pixels.

In certain embodiments, the underfill material comprises a light-altering or a light-reflecting material.

In certain embodiments, the light-altering or light-reflecting material comprises light-altering or light-reflecting particles suspended in a binder.

In certain embodiments, the light-altering or light-reflecting particles comprise titanium dioxide particles and the binder comprises silicone.

In certain embodiments, a weight ratio of titanium dioxide particles to silicone is in the range of 50% to 150%.

In certain embodiments, a width of the underfill material between the lateral sidewalls of the plurality of pixels is no greater than about 60 microns (μm).

In certain embodiments, the width of the underfill material between the lateral sidewalls of the plurality of pixels is in a range of from about 10 μm to about 30 μm.

In certain embodiments, the pixelated-LED chip further comprises a plurality of substrate portions supporting the plurality of active layer portions, wherein each substrate portion comprises a light-transmissive material.

In certain embodiments, the pixelated-LED chip is devoid of an air gap between the plurality of substrate portions.

In certain embodiments, the plurality of substrate portions comprises silicon carbide.

In certain embodiments, the plurality of substrate portions comprises sapphire.

In another aspect of the disclosure, a pixelated-LED chip for automotive applications and products comprises: an active layer comprising a plurality of active layer portions, wherein each active layer portion of the plurality of active layer portions is independently electrically accessible to form a plurality of pixels; and an underfill material arranged between the plurality of active layer portions, wherein the underfill material comprises a material with a Shore D hardness scale durometer value of at least 40.

In certain embodiments, the underfill material comprises a material with a Shore D hardness scale durometer value in a range of from about 40 to about 100.

In certain embodiments, the underfill material comprises a material with a Shore D hardness scale durometer value in a range of from about 60 to about 80.

In certain embodiments, the underfill material comprises a light-altering or a light-reflecting material.

In certain embodiments, the light-altering or light-reflecting material comprises light-altering or light-reflecting particles suspended in a binder.

In certain embodiments, the light-altering or light-reflecting particles comprise titanium dioxide particles and the binder comprises silicone.

In certain embodiments, each pixel of the plurality of pixels comprises an anode and a cathode.

In certain embodiments, the underfill material is arranged between the anode and the cathode of each pixel of the plurality of pixels.

In certain embodiments, the pixelated-LED chip further comprises a lumiphoric material on the plurality of pixels.

In certain embodiments, the lumiphoric material comprises a material with a Shore D hardness scale durometer value of less than about 40.

In certain embodiments, the pixelated-LED chip further comprises a plurality of substrate portions supporting the plurality of active layer portions, wherein each substrate portion comprises a light-transmissive material.

In certain embodiments, the plurality of substrate portions comprises silicon carbide.

In certain embodiments, the plurality of substrate portions comprises sapphire.

In another aspect of the disclosure, a pixelated-LED chip comprises: an active layer comprising a plurality of active layer portions; a substrate comprising a plurality of discontinuous substrate portions supporting the plurality of active layer portions, wherein each substrate portion comprises a light-transmissive material; wherein each active layer portion of the plurality of active layer portions is independently electrically accessible and is configured to illuminate a different substrate portion of the plurality of discontinuous substrate portions and transmit light through the substrate portion, such that the plurality of active layer portions and the plurality of discontinuous substrate portions form a plurality of pixels; and a first lumiphoric material on the plurality of pixels.

In certain embodiments, the first lumiphoric material comprises one or more materials including cyan, green, amber, yellow, orange, and/or red peak emission wavelengths.

In certain embodiments, the first lumiphoric material is continuous on the plurality of discontinuous substrate portions.

In certain embodiments, the first lumiphoric material comprises a plurality of light segregation elements that are registered between pixels of the plurality of pixels.

In certain embodiments, the pixelated-LED chip further comprises an underfill material between pixels of the plurality of pixels and registered with the plurality of light segregation elements.

In certain embodiments, the pixelated-LED chip further comprises a second lumiphoric material over the first lumiphoric material and the plurality of light segregation elements.

In certain embodiments, the first lumiphoric material comprises phosphor particles and scattering particles.

In certain embodiments, the scattering particles comprise at least one of fused silica, fumed silica, or titanium dioxide particles.

In another aspect of the disclosure, a pixelated-LED chip comprises: an active layer comprising a plurality of active layer portions, wherein each active layer portion of the plurality of active layer portions is independently electrically accessible to form a plurality of pixels; and a first lumiphoric material on the plurality of pixels, wherein the first lumiphoric material comprises a plurality of light segregation elements that are registered between pixels of the plurality of pixels.

In certain embodiments, the first lumiphoric material comprises one or more materials including cyan, green, amber, yellow, orange, and/or red peak emission wavelengths.

In certain embodiments, the first lumiphoric material is continuous on the plurality of pixels.

In certain embodiments, the pixelated-LED chip further comprises an underfill material between pixels of the plurality of pixels and registered with the plurality of light segregation elements.

In certain embodiments, the pixelated-LED chip further comprises a second lumiphoric material over the first lumiphoric material and the plurality of light segregation elements.

In certain embodiments, the plurality of light segregation elements comprises cuts in the first lumiphoric material.

In another aspect of the disclosure, a pixelated-LED chip comprises: an active layer comprising a plurality of active layer portions; and a plurality of substrate portions supporting the plurality of active layer portions, wherein each substrate portion comprises a light-transmissive material, a light injection surface, and a light extraction surface, wherein the light injection surface is arranged between the active layer and the light extraction surface; wherein each active layer portion of the plurality of active layer portions is independently electrically accessible and is configured to illuminate a different substrate portion of the plurality of substrate portions and transmit light through the light extraction surface of the substrate portion, such that the plurality of active layer portions and the plurality of substrate portions form a plurality of pixels; wherein at least one substrate portion of the plurality of substrate portions comprises: a first protruding feature comprising a first angle between two opposing faces; and a second protruding feature comprising a second angle between two opposing faces, wherein the second angle is larger than the first angle.

In certain embodiments, the second angle exceeds the first angle by at least fifteen degrees.

In certain embodiments, the second angle is about ninety degrees and the first angle is about sixty degrees.

In certain embodiments, the second protruding feature is closer to a pixel sidewall than the first protruding feature.

In certain embodiments, the first protruding feature and the second protruding feature comprise silicon carbide.

In another aspect of the disclosure, a pixelated-LED chip comprises: an active layer comprising a plurality of active layer portions; and a plurality of substrate portions supporting the plurality of active layer portions, wherein each substrate portion comprises a light-transmissive material, a light injection surface, and a light extraction surface, wherein the light injection surface is arranged between the active layer and the light extraction surface; wherein each active layer portion of the plurality of active layer portions is independently electrically accessible and is configured to illuminate a different substrate portion of the plurality of substrate portions and transmit light through the light extraction surface of the substrate portion, such that the plurality of active layer portions and the plurality of substrate portions form a plurality of pixels; wherein the light extraction surface of each substrate portion comprises a light extraction surface recess between pixel sidewalls of the plurality of pixels; and the pixelated-LED chip further comprises a reflective layer on the pixel sidewalls.

In certain embodiments, the reflective layer comprises at least one of a metal reflector, a dielectric reflector, and combinations thereof.

In another aspect of the disclosure, a pixelated-LED chip for automotive applications and products comprises: an active layer comprising a plurality of active layer portions; and a substrate comprising a plurality of substrate portions supporting the plurality of active layer portions, wherein each substrate portion comprises a light extraction surface; wherein each active layer portion of the plurality of active layer portions is independently electrically accessible and is configured to illuminate a different substrate portion of the plurality of substrate portions and transmit light through the light extraction surface of the substrate portion, such that the plurality of active layer portions and the plurality of substrate portions form a plurality of pixels; wherein the light extraction surface of each substrate portion comprises at least one first light extraction surface recess and at least one second light extraction surface recess; and wherein the at least one second light extraction surface recess is aligned with a street between adjacent pixels of the plurality of pixels; and the pixelated-LED chip includes at least one of the following features (i) or (ii): (i) the at least one first light extraction surface recess extends deeper into the substrate than the at least one second light extraction surface recess, or (ii) the second light extraction surface recess comprises a wider bottom than the first light extraction surface recess.

In certain embodiments, the at least one first light extraction surface recess extends deeper into the substrate than the at least one second light extraction surface recess.

In certain embodiments, the second light extraction surface recess comprises a wider bottom than the first light extraction surface recess.

In another aspect of the disclosure, a method for fabricating a pixelated-LED lighting device for automotive applications and products comprises: defining a plurality of recesses or streets through an active layer on a substrate to form a plurality of active layer portions, wherein the substrate comprises (i) a light injection surface proximate to a plurality of active layer portions, and (ii) a light extraction surface generally opposing the light injection surface, wherein recesses or streets of the plurality of recesses or streets are (a) defined through the light injection surface and less than an entire thickness of the substrate and (b) arranged generally between the plurality of active layer portions, and the substrate includes a plurality of anode-cathode pairs in conductive electrical communication with the plurality of active layer portions; mounting the substrate over a mounting surface; thinning the substrate after said mounting of the substrate over the mounting surface; removing portions of the substrate through an entire thickness of the substrate along a plurality of regions registered with the plurality of recesses or streets to form a plurality of discontinuous substrate portions.

In certain embodiments, each active layer portion of the plurality of active layer portions is configured to illuminate a different light-transmissive portion of a plurality of light-transmissive portions and transmit light through the light extraction surface, such that the plurality of active layer portions and the plurality of discontinuous substrate portions form a plurality of pixels, and pixels of the plurality of pixels comprise a maximum pixel width; and the method further comprises forming a plurality of protruding features in the light extraction surface, wherein each protruding feature of the plurality of protruding features comprises a width in a range of from about one fifth to about one half of the maximum pixel width.

In certain embodiments, the method further comprises applying a first lumiphoric material to the light extraction surface.

In certain embodiments, the method further comprises removing a portion of the first lumiphoric material that is registered between pixels of the plurality of pixels to form a plurality of light segregation elements.

In certain embodiments, the method further comprises applying a second lumiphoric material over the first lumiphoric material and the plurality of light segregation elements.

In certain embodiments, the method further comprises planarizing the plurality of anode-cathode pairs prior to the mounting of the substrate over the mounting surface.

In certain embodiments, the method further comprises applying an underfill material between the substrate and the mounting surface, between the plurality of anode-cathode pairs, and between the plurality of active layer portions before the thinning of the substrate.

In another aspect of the disclosure, a method for fabricating a pixelated-LED lighting device for automotive applications and products comprises: defining a plurality of recesses or streets through an active layer on a substrate to form a plurality of active layer portions, wherein the substrate comprises (i) a light injection surface proximate to the plurality of active layer portions, and (ii) a light extraction surface generally opposing the light injection surface, wherein recesses or streets of the plurality of recesses or streets are (a) defined through the light injection surface and less than an entire thickness of the substrate and (b) arranged generally between the plurality of active layer portions, and the substrate includes a plurality of anode-cathode pairs in conductive electrical communication with the plurality of active layer portions; mounting the substrate over a mounting surface; applying an underfill material between the substrate and the mounting surface, between the plurality of anode-cathode pairs, and between the plurality of active layer portions; and thinning the substrate after applying the underfill material between the substrate and the mounting surface.

In certain embodiments, the method further comprises removing portions of the substrate along a plurality of regions, wherein some regions of the plurality of regions are registered with the plurality of recesses or streets.

In certain embodiments, the method further comprises removing portions of the substrate through an entire thickness of the substrate along the plurality of regions registered with the plurality of recesses or streets to form a plurality of discontinuous substrate portions.

In certain embodiments, the method further comprises separating the plurality of discontinuous substrate portions, the underfill material, and the plurality of anode-cathode pairs from the mounting surface.

In another aspect of the disclosure, a method for fabricating a pixelated-LED lighting device for automotive applications and products comprises: defining a plurality of recesses or streets through an active layer to form a plurality of active layer portions; depositing a plurality of anode-cathode pairs on the plurality of active layer portions to form a plurality of individually electrically accessible pixels; mounting the plurality of pixels over a mounting surface; applying a first lumiphoric material to the plurality of pixels; and removing at least a portion of the first lumiphoric material between each pixel of the plurality of pixels to form a plurality of light segregation elements.

In certain embodiments, removing at least a portion of the first lumiphoric material comprises passing a saw blade across the first lumiphoric material.

In certain embodiments, the method further comprises applying a second lumiphoric material over the first lumiphoric material and the plurality of light segregation elements.

In certain embodiments, the method further comprises applying an underfill material within the plurality of recesses or streets and between the plurality of anode-cathode pairs after mounting the plurality of pixels over the mounting surface.

In certain embodiments, the method further comprises a plurality of substrate portions supporting the plurality of active layer portions.

In certain embodiments, the method further comprises removing the plurality of substrate portions before applying the first lumiphoric material.

In certain embodiments, the method further comprises applying a second lumiphoric material over the first lumiphoric material and the plurality of light segregation elements.

In another aspect of the disclosure, a lighting device comprises at least one pixelated-LED chip, wherein the at least one pixelated-LED chip comprises: an active layer comprising a plurality of active layer portions, wherein each active layer portion of the plurality of active layer portions is independently electrically accessible to form a plurality of pixels; and an underfill material arranged between lateral sidewalls of the plurality of pixels; wherein the at least one pixelated-LED chip is configured to project at least one image onto a surface.

In certain embodiments, the underfill material comprises at least one of an insulating material, light-altering particles suspended in a binder, or light-reflecting particles suspended in a binder.

In certain embodiments, the at least one image includes at least one of alphanumeric characters, symbols, different colors, still images, and moving images such as videos.

In certain embodiments, individual pixels or subgroups of pixels of the plurality of pixels are configured to be selectively activated or deactivated to form the at least one image.

In certain embodiments, each pixel of the plurality of pixels is configured to be simultaneously activated or deactivated to provide general illumination.

In certain embodiments, the surface comprises an upright surface of a billboard or a sign.

In certain embodiments, the lighting device comprises an indoor lighting device including at least one of an area light, a downlight, a high-bay or low-bay lighting fixture, a suspended lighting fixture, a troffer, a wall-mounted or ceiling-mounted fixture, track lighting, a table or floor lamp, or a light bulb.

In certain embodiments, the lighting device comprises an outdoor lighting device including at least one of an area light, a street or roadway light fixture, a canopy light fixture, a soffit light fixture, a parking garage lighting fixture, flood lighting, and a wall-mounted or ceiling-mounted outdoor fixture.

In certain embodiments, the lighting device comprises a display backlight configured to provide localized dimming for a display screen.

In certain embodiments, the lighting device comprises a portable or hand-held lighting device including at least one of a flashlight, a personal computer, a tablet, a phone, or a watch.

In certain embodiments, any of the foregoing devices or device fabrication methods (or other devices and methods as disclosed herein) may be for non-automotive products and applications.

In certain embodiments, any of the foregoing devices or device fabrication methods (or other devices and methods as disclosed herein) may be for automotive products and applications.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Other aspects, features and embodiments of the present disclosure will be more fully apparent from the ensuing disclosure and appended claims.

BRIEF DESCRIPTION OF THE DRAWINGS

FIG. 1 is a side cross-sectional illustration of a single flip chip LED including a light-transmissive surface that is patterned proximate to semiconductor layers of the LED, including a multi-layer reflector proximate to the semiconductor layers, and including a passivation layer between the multi-layer reflector and electrical contacts of the LED, with the single LED being representative of flip chips useable in flip chip LED arrays according to embodiments of the present disclosure.

FIG. 2A is a plan view photograph of a flip chip LED, with a transparent substrate facing upward, useable in flip chip arrays according to embodiments of the present disclosure.

FIG. 2B is a plan view photograph of the flip chip LED of FIG. 2A, with electrodes facing upward.

FIG. 3A is a plan view photograph of a pixelated-LED chip including an array of four flip chip type LEDs on a single transparent substrate facing upward, useable in embodiments of the present disclosure.

FIG. 3B is a plan view photograph of the pixelated-LED chip of FIG. 3A, with electrodes facing upward.

FIG. 4A is a plan view photograph of a pixelated-LED chip including an array of one hundred flip chip LEDs on a single transparent substrate facing upward, useable in embodiments of the present disclosure.

FIG. 4B is a plan view photograph of the pixelated-LED chip of FIG. 4A, with electrodes facing upward.

FIGS. 5A-5C are plan view illustrations of a pixelated-LED chip including an array of sixteen flip chip LEDs on a single transparent substrate facing upward in various states of fabrication, to define grooves or recesses between flip chip LEDs to enable formation of light segregation elements extending from a light extraction surface into an interior of the substrate and to deposit a lumiphoric material on the light extraction surface, according to certain embodiments of the present disclosure.

FIG. 6A is a plan view illustration of a light emitting device (e.g., a pixelated-LED chip) including an array of sixteen flip chip LEDs on a single transparent substrate with electrodes facing upward.

FIG. 6B is a plan view illustration of a lower layer of an electrical interface for the light emitting device of FIG. 6A, with multiple horizontal string series connections each including multiple electrically conductive vias for coupling with anodes of the light emitting device, and with the lower layer further including openings permitting passage of conductive vias defined in an upper layer of the electrical interface.

FIG. 6C is a plan view illustration of an upper layer of an electrical interface for the light emitting device of FIG. 6A, with multiple vertical string series connections each including multiple electrically conductive vias for coupling with cathodes of the light emitting device.

FIG. 6D is a plan view illustration of the upper layer of FIG. 6C superimposed over the lower layer of FIG. 6B to form an electrical interface for the light emitting device of FIG. 6A.

FIG. 6E is a plan view illustration of the electrical interface of FIG. 6D coupled with the light emitting device of FIG. 6A.

FIG. 7A is a plan view illustration of a light emitting device (e.g., a pixelated-LED chip) including an array of sixteen flip chip LEDs on a single transparent substrate with electrodes facing upward.

FIG. 7B is a plan view illustration of a lower layer of an electrical interface for the light emitting device of FIG. 7A, with multiple horizontal string series connections each including multiple electrically conductive vias for coupling with anodes of the light emitting device, and with the lower layer further including openings permitting passage of conductive vias defined in an upper layer of the electrical interface.

FIG. 7C is a plan view illustration of an upper layer of an electrical interface for the light emitting device of FIG. 7A, with multiple vertically arranged parallel connections each including multiple electrically conductive vias for coupling with cathodes of the light emitting device.

FIG. 7D is a plan view illustration of the upper layer of FIG. 7C superimposed over the lower layer of FIG. 7B to form an electrical interface for the light emitting device of FIG. 7A.

FIG. 7E is a plan view illustration of the electrical interface of FIG. 7D coupled with the light emitting device of FIG. 7A, according to an embodiment of the present disclosure.

FIG. 8A is a plan view diagram of an LED light emitting device configured to produce a first combination of colors, according to an embodiment of the present disclosure.

FIG. 8B is a plan view diagram of an LED light emitting device configured to produce a second combination of colors, according to an embodiment of the present disclosure.

FIG. 8C is a plan view diagram of an LED light emitting device configured to produce a third combination of colors, according to an embodiment of the present disclosure.

FIG. 8D is a plan view diagram of an LED light emitting device configured to produce a fourth combination of colors, according to an embodiment of the present disclosure. FIG. 9A is a schematic side cross-sectional view of at least a portion of a pixelated-LED light emitting device (e.g., a pixelated-LED chip) according to one embodiment including a substrate with multiple protruding features along a light extraction surface thereof and configured to transmit emissions of first and second active layer portions to form first and second pixels, with different protruding features having different sizes, and with a trough or "street" between two protruding features being aligned with a backside recess defining a lateral border between the first and second pixels (thereby providing a "street-aligned" configuration).

FIG. 10 is a table providing physical characteristics and measured performance values for pixelated-LED chips according to the present disclosure with different substrate light extraction surface configurations.

FIG. 11A is a plot of percent illumination versus position (millimeters) for a pixel of a pixelated-LED chip including a substrate light extraction surface textured with protruding features each having a width about the same as the width of a pixel (e.g., one bevel cut per pixel).

FIG. 12D is a variability chart including plots of horizontal sharpness as a function of un-cut material thickness for the six different pixelated-LED chips identified in connection with FIGS. 12A-12C.

FIG. 12E is a variability chart including plots of luminous flux values greater than 90 Cd/mm$^2$ for the six different pixelated-LED chips identified in connection with FIGS. 12A-12D.

FIG. 13 is a scanning electrode microscope image of a silicon carbide surface processed with inductively coupled plasma etching to define a plurality of randomly distributed microscale textural features.

FIG. 14 provides eight scanning electrode microscope images of silicon carbide surfaces following masking and selective material removal including inductively coupled plasma etching to define ordered arrays of regularly spaced and sized microscale textural features.

FIG. 15A-15I are schematic side cross-sectional views of a pixelated-LED chip in various states of fabrication, according to certain embodiments.

FIG. 16A is a schematic cross-sectional view of a pixelated-LED chip according to some embodiments including light segregation elements in a lumiphoric material.

FIG. 16B is a schematic cross-sectional view of a pixelated-LED chip according to some embodiments including a second lumiphoric material over a lumiphoric material with light segregation elements.

FIG. 18 is an upper perspective view photograph of a portion of a pixelated-LED light emitting device according to some embodiments including street-aligned cut lines defining a plurality of pixels with protruding features.

FIG. 19 is a schematic side cross-sectional view of at least a portion of a pixelated-LED chip according to some embodiments including a plurality of protruding features with a same angle A defined as the angle between two opposing faces of a protruding feature.

DETAILED DESCRIPTION

Figure 9B:
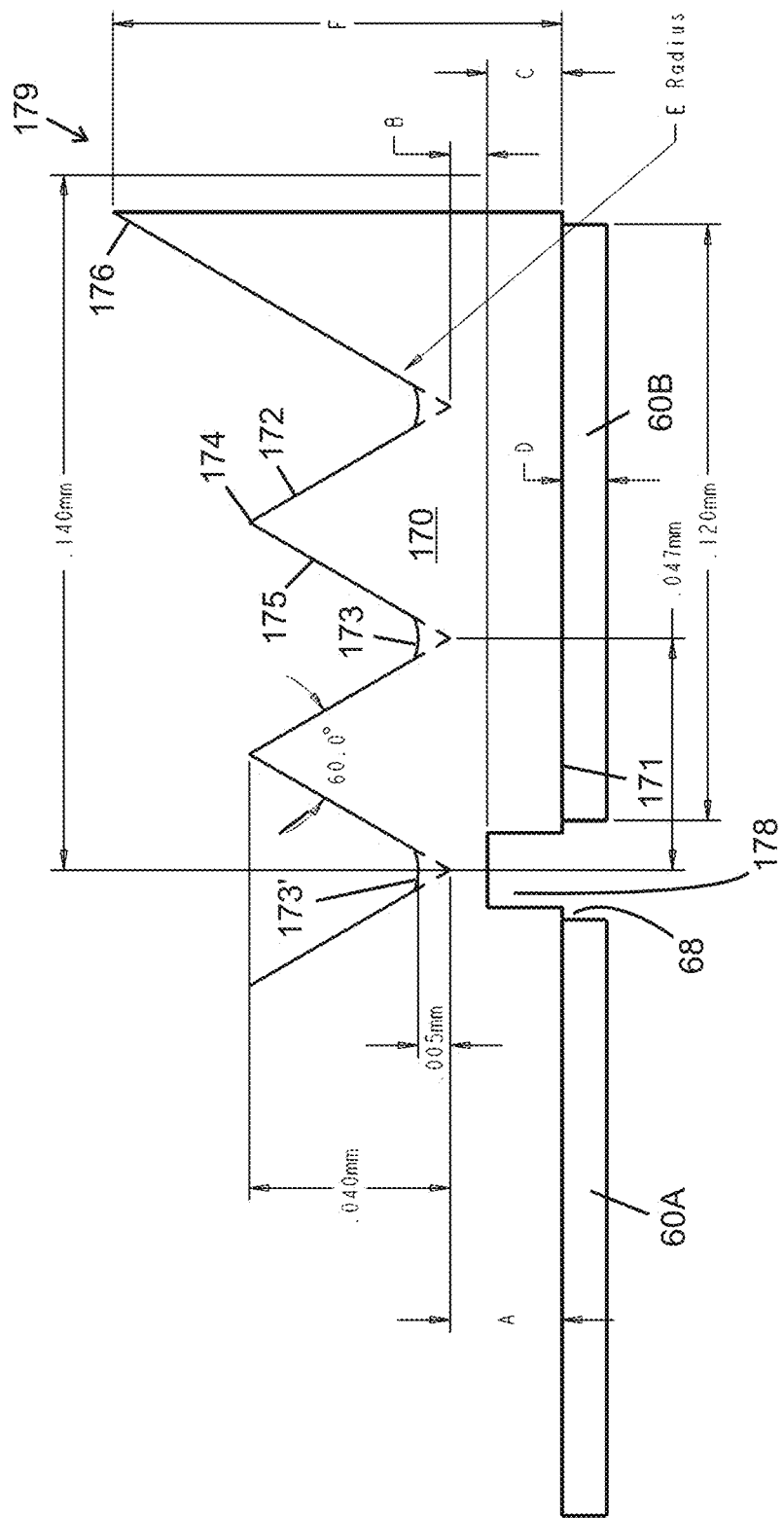
FIG. 9B is a schematic side cross-sectional view representing a portion of FIG. 9A, with addition of dimensioning lines and values.

Solid state light emitting devices disclosed herein include a plurality of independently electrically accessible active layer portions that form a plurality of pixels. In certain embodiments, various enhancements may beneficially provide increased contrast (i.e., reduced cross-talk between pixels) and/or promote inter-pixel homogeneity, without unduly restricting light utilization efficiency. Efficient manufacturability of a lighting device may also be provided. Additional and/or alternative beneficial effects are contemplated. Exemplary enhancements to provide one or more technical benefits described herein include, but are not limited to: aligning recess portions between at least some protruding features with lateral boundaries between pixels; providing different pixels with protruding features of different sizes, shapes, numbers, and/or distributions (i.e., inter-pixel variation); providing individual pixels with protruding features of different sizes and/or shapes (i.e., intra-pixel variation); providing protruding features having lateral faces with an angle of inclination from vertical in a range of from fifteen to forty-five degrees (or another angular subrange disclosed herein); providing protruding features with a width of from about one fifth to about one half of a maximum pixel width (or a maximum active region width); adjusting composition, concentration, particle size and/or distribution of lumiphoric materials among different pixels; and adjusting composition, concentration, particle size and/or distribution of scattering materials among different pixels.

As used herein, a "pixelated-LED chip" refers to an inorganic light emitting device or precursor thereof, in which a body or film comprising at least one layer or region made of a semiconductor material and being configured into sub-regions or pixels to emit visible light, infrared and/or ultraviolet light when a current is applied. The pixelated-LED chip may include an active layer that is segregated into a plurality of active layer portions such that each pixel comprises a different active layer portion. The pixelated-LED chip may also include a substrate that supports the active layer. The substrate may be segregated, either partially or entirely through a thickness of the substrate, into a plurality of substrate portions that support a different active layer portion in each pixel. Depending on the embodiment, the pixelated-LED chip may include lumiphoric materials, including phosphors or other conversion materials, and other physical optical structures that are integral with the pixelated-LED chip.

The embodiments set forth herein represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element, or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements present.

Relative terms such as "below," "above," "upper," "lower," "horizontal," or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

As used herein, an "active layer" or an "active region" of a solid state light emitting device refers to the layer or region in which majority and minority electronic carriers (e.g., holes and electrons) recombine to produce light. In general, an active layer or region according to embodiments disclosed herein can include a double heterostructure or a well structure, such as a quantum well structure. An active layer or region can include multiple layers or regions, such as a multiple quantum well structure.

Solid state light emitting devices disclosed herein may include at least one solid state light source (e.g., a LED or a pixelated-LED chip) and one or more lumiphoric materials (also referred to herein as lumiphors) arranged to receive emissions of the at least one solid state light source. A lumiphoric material may include one or more of a phosphor, a scintillator, a lumiphoric ink, a quantum dot material, a day glow tape, or the like. In certain embodiments, a lumiphoric material may be in the form of one or more phosphors and/or quantum dots arranged in a binder such as silicone or glass, arranged in the form of a single crystalline plate or layer, a polycrystalline plate or layer, and/or a sintered plate. In certain embodiments, a lumiphoric material such as a phosphor may be spin coated or sprayed on a surface of a LED array or a pixelated-LED chip. In certain embodiments, a lumiphoric material may be located on a growth substrate, on epitaxial layers, and/or on a carrier substrate of a LED array or a pixelated-LED chip. If desired, multiple pixels including one or more lumiphoric materials may be manufactured in a single plate. In general, a solid state light source may generate light having a first peak wavelength. At least one lumiphor receiving at least a portion of the light generated by the solid state light source may re-emit light having a second peak wavelength that is different from the first peak wavelength. A solid state light source and one or more lumiphoric materials may be selected such that their combined output results in light with one or more desired characteristics such as color, color point, intensity, etc. In certain embodiments, aggregate emissions of one or more flip chip LEDs or pixels of a pixelated-LED chip, optionally in combination with one or more lumiphoric materials, may be arranged to provide cool white, neutral white, or warm white light, such as within a color temperature range of from 2500K to 10,000K. In certain embodiments, lumiphoric materials having cyan, green, amber, yellow, orange, and/or red peak wavelengths may be used. In certain embodiments, lumiphoric materials may be added to one or more emitting surfaces (e.g., top surface and one or more edge surfaces) by methods such as spray coating, dipping, liquid dispensation, powder coating, inkjet printing, or the like. In certain embodiments, lumiphoric material may be dispersed in an encapsulant, adhesive, or other binding medium.

In certain embodiments, photolithographic patterning or other stencil-type patterning may be used to permit different lumiphoric materials to be applied on or over different pixels associated with a substrate to provide lumiphoric material and/or scattering material that differs in (a) composition, (b) concentration, (c) particle size, or (d) distribution with respect to different pixels.

In certain embodiments, a scattering material may be added over or incorporated into a lumiphoric material. The scattering material may include scattering particles arranged in a binder, such as silicone. The scattering particles affect total internal reflection (TIR) of light to promote scattering and mixing of light that interacts with the scattering material. The scattering particles may include fused silica, fumed silica, or particles of titanium dioxide (TiO2), among others. In some embodiments, the scattering material includes a layer of scattering particles suspended in a binder that is applied on the lumiphoric material. In other embodiments, the scattering particles may be included within the lumiphoric material such that the lumiphoric material comprises lumiphoric particles and scattering particles suspended in the same binder.

As used herein, a layer or region of a light emitting device may be considered to be "transparent" when at least 70% of emitted radiation that impinges on the layer or region emerges through the layer or region. For example, in the context of LEDs configured to emit visible light, suitably pure crystalline substrate materials of silicon carbide or sapphire may be considered transparent. Moreover, as used herein, a layer or region of an LED is considered to be "reflective" or embody a "reflector" when at least 70% of the angle averaged emitted radiation that impinges on the layer or region is reflected. In some embodiments, an LED is considered to be "reflective" or embody a "reflector" when at least 90% of the angle averaged emitted radiation that impinges on the layer or region is reflected. For example, in the context of gallium nitride (GaN)-based blue and/or green LEDs, silver (for example, at least 70% reflective, or at least 90% reflective) may be considered a reflective or reflecting material. In the case of ultraviolet (UV) LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength.

Certain embodiments disclosed herein relate to the use of flip chip LED devices or flip-chip pixelated-LED chips in which a light-transmissive substrate represents the exposed light emitting surface. In certain embodiments, the light-transmissive substrate embodies or includes a LED growth substrate, wherein multiple LEDs are grown on the same substrate that forms a light emitting surface or region. In certain embodiments, a pixelated-LED chip includes multiple active layer portions formed from an active layer grown on a growth substrate. In certain embodiments, the pixels may share functional layers of the pixelated-LED chip. In certain embodiments, one or more portions (or the entirety) of a growth substrate and/or portions of epitaxial layers may be thinned or removed. In certain embodiments, a second substrate (such as a carrier substrate or a temporary substrate to perform chip processing) may be added to the pixelated-LED chip or precursor thereof, whether or not a growth substrate has been partially or fully removed. In certain embodiments, a light-transmissive substrate includes silicon carbide (SiC), sapphire, or glass. Multiple LEDs (e.g., flip chip LEDs or flip chip pixels) may be grown on a substrate and incorporated into a light emitting device. In certain embodiments, a substrate (e.g., silicon) may include vias arranged to make contact with LED chips mounted or grown thereon. In certain embodiments, as an alternative to using flip chips, individual LEDs or LED packages may be individually placed and mounted on or over a substrate to form an array. For example, multiple wafer level packaged LEDs may be used to form LED arrays or subarrays.

When LEDs embodying a flip chip configuration are used, desirable flip chip LEDs incorporate multi-layer reflectors and incorporate light-transmissive (preferably transparent) substrates patterned along an internal surface adjacent to semiconductor layers. A flip chip LED, or a flip chip pixel in some embodiments, includes anode and cathode contacts that are spaced apart and extend along the same face, with such face opposing a face defined by the light-transmissive (preferably transparent) substrate. A flip chip LED may be termed a horizontal structure, as opposed to a vertical structure having contacts on opposing faces of a LED chip. In certain embodiments, the transparent substrate may be patterned, roughened, or otherwise textured to provide a varying surface that increases the probability of refraction over internal reflection, so as to enhance light extraction. A substrate may be patterned or roughened by any of various methods known in the art, including (but not limited to) formation of nano-scale features by etching (e.g., photolithographic etching) using any suitable etchants, optionally in combination with one or more masks.

Patterning or texturing of a substrate may depend on the substrate material as well as implications on light extraction efficiency and/or pixel separation. If a silicon carbide substrate bearing multiple LEDs (e.g., flip chip LEDs or flip chip pixels) is used, then the index of refraction of the silicon carbide is well-matched to a GaN-based active region of a LED, so light emissions of the active region tend to enter the substrate easily. If a sapphire substrate bearing multiple LEDs (e.g., flip chip LEDs or flip chip pixels) is used, then it may be desirable to provide a patterned, roughened, or textured interface between the active region and the substrate to promote passage of LED emissions into the substrate. With respect to a light extraction surface of a substrate, in certain embodiments it may be desirable to provide a patterned, roughened, or textured surface to promote extraction of light from the substrate. In embodiments where the growth substrate is removed, the GaN epitaxial light emitting surface can be roughened, patterned and/or textured.

In certain embodiments, LEDs or pixels may be grown on a first substrate of a first material (e.g., silicon, silicon carbide or sapphire), the first (growth) substrate may be partially removed (e.g., thinned) or fully removed, and the LEDs or pixels may be bonded to, mounted to, or otherwise supported by a second substrate of a second material (e.g., glass, sapphire, etc.) through which LED emissions are transmitted, wherein the second material is preferably more transmissive of LED emissions than the first material. Removal of the first (growth) substrate may be done by any appropriate method, such as by use of an internal parting region or parting layer that is weakened and/or separated by: application of energy (e.g., laser rastering, sonic waves, heat, etc.), fracturing, one or more heating and cooling cycles, chemical removal, and/or mechanical removal (e.g., including one or more grinding, lapping, and/or polishing steps), or by any appropriate combination of techniques. In certain embodiments, one or more substrates may be bonded or otherwise joined to a carrier. Bonding of one or more LEDs or pixels to a substrate, or bonding of substrates to a carrier, may be performed by any suitable methods. Any suitable wafer bonding technique known in the art may be used, such as may rely on van der Waals bonds, hydrogen bonds, covalent bonds, and/or mechanical interlocking. In certain embodiments, direct bonding may be used. In certain embodiments, bonding may include one or more surface activation steps (e.g., plasma treatment, chemical treatment, and/or other treatment methods) followed by application of heat and/or pressure, optionally followed by one or more annealing steps. In certain embodiments, one or more adhesion promoting materials may additionally or alternatively be used.

In certain embodiments, a LED array includes multiple flip chip LEDs or flip chip pixels grown on a single first (or growth) substrate, with the growth substrate removed from the LEDs, and a second substrate (or carrier) added to the LEDs, with the second substrate including one or more reflective layers, vias, and a phosphor layer (e.g., spin-coated phosphor layer). In certain embodiments, a LED array includes multiple flip chip LEDs or flip chip pixels grown on a single growth substrate, wherein grooves, recesses, or other features are defined in the growth substrate and/or a carrier, and are used to form light-affecting elements, optionally being filled with one or more materials such as to form a grid between individual LEDs or pixels.

In certain embodiments utilizing flip chip LEDs or flip chip pixels, a light-transmissive substrate, a plurality of semiconductor layers, a multi-layer reflector, and a passivation layer may be provided. The light-transmissive substrate is preferably transparent with a patterned surface including a plurality of recessed features and/or a plurality of raised features. The plurality of semiconductor layers is adjacent to the patterned surface, and includes a first semiconductor layer comprising doping of a first type and a second semiconductor layer comprising doping of a second type, wherein a light emitting active region is arranged between the first semiconductor layer and the second semiconductor layer. The multi-layer reflector is arranged proximate to the plurality of semiconductor layers and includes a metal reflector layer and a dielectric reflector layer, wherein the dielectric reflector layer is arranged between the metal reflector layer and the plurality of semiconductor layers. The passivation layer is arranged between the metal reflector layer and first and second electrical contacts, wherein the first electrical contact is arranged in conductive electrical communication with the first semiconductor layer, and the second electrical contact is arranged in conductive electrical communication with the second semiconductor layer. In certain embodiments, a first array of conductive microcontacts extends through the passivation layer and provides electrical communication between the first electrical contact and the first semiconductor layer, and a second array of conductive microcontacts extends through the passivation layer. In certain embodiments, a substrate useable for forming and supporting an array of flip chip LEDs or flip chip pixels may include sapphire; alternatively, the substrate may include silicon, silicon carbide, a Group III-nitride material (e.g., GaN), or any other combination of the foregoing materials (e.g., silicon on sapphire, etc.). Further details regarding fabrication of flip chip LEDs are disclosed in U.S. Patent Application Publication No. 2017/0098746A1, with the entire contents thereof being hereby incorporated by reference herein.

FIG. 1 illustrates a single flip chip LED 10 including a substrate 15, first and second electrical contacts 61, 62, and a functional stack 60 (incorporating at least one light emitting active region 25) arranged therebetween. The flip chip LED 10 includes an internal light-transmissive surface 14 that is patterned (with multiple recessed and/or raised features 17) proximate to semiconductor layers of the LED 10, including a multi-layer reflector proximate to the semiconductor layers according to one embodiment. The light-transmissive (preferably transparent) substrate 15 has an outer major surface 11, side edges 12, and the patterned surface 14. Multiple semiconductor layers 21, 22 sandwiching the light emitting active region 25 are adjacent to the patterned surface 14, and may be deposited via vapor phase epitaxy or any other suitable deposition process. In one implementation, a first semiconductor layer 21 proximate to the substrate 15 embodies an n-doped material (e.g., n-GaN), and the second semiconductor layer 22 embodies a p-doped material (e.g., p-GaN). A central portion of the multiple semiconductor layers 21, 22 including the active region 25 extends in a direction away from the substrate 15 to form a mesa 29 that is laterally bounded by at least one recess 39 containing a passivation material (e.g., silicon nitride as part of a passivation layer 50), and that is vertically bounded by surface extensions 21A of the first semiconductor layer 21.

A multi-layer reflector is arranged proximate to (e.g., on) the second semiconductor layer 22, with the multi-layer reflector consisting of a dielectric reflector layer 40 and a metal reflector layer 42. The dielectric reflector layer 40 is arranged between the metal reflector layer 42 and the second semiconductor layer 22. In certain implementations, the dielectric reflector layer 40 comprises silicon dioxide, and the metal reflector layer 42 comprises silver. Numerous conductive vias 41-1, 41-2 are defined in the dielectric reflector layer 40 and are preferably arranged in contact between the second semiconductor layer 22 and the metal reflector layer 42. In certain implementations, the conductive vias 41-1, 41-2 comprise substantially the same material(s) as the metal reflector layer 42. In certain implementations, at least one (preferably both) of the dielectric reflector layer 40 and the metal reflector layer 42 is arranged over substantially the entirety of a major surface of the mesa 29 terminated by the second semiconductor layer 22 (e.g., at least about 90%, at least about 92%, or at least about 95% of the major (e.g., lower) surface of the mesa portion of the second semiconductor layer 22).

A barrier layer 48 (including portions 48-1 and 48-2) is preferably provided between the metal reflector layer 42 and the passivation layer 50. In certain implementations, the barrier layer 48 comprises sputtered Ti/Pt followed by evaporated Au, or comprises sputtered Ti/Ni followed by evaporated Ti/Au. In certain implementations, the barrier layer 48 may function to prevent migration of metal from the metal reflector layer 42. The passivation layer 50 is arranged between the barrier layer 48 and (i) the first externally accessible electrical contact (e.g., electrode, or cathode) 61 and (ii) the second externally accessible electrical contact (e.g., electrode, or anode) 62, which are both arranged along a lower surface 54 of the flip chip LED 10 separated by a gap 59. In certain implementations, the passivation layer 50 comprises silicon nitride. The passivation layer 50 includes a metal-containing interlayer 55 arranged therein, wherein the interlayer 55 may include (or consist essentially of) Al or another suitable metal.

The LED 10 includes first and second arrays of microcontacts 63, 64 extending through the passivation layer 50, with the first array of microcontacts 63 providing conductive electrical communication between the first electrical contact 61 and the first (e.g., n-doped) semiconductor layer 21, and with the second array of microcontacts 64 providing conductive electrical communication between the second electrical contact 62 and the second (e.g., p-doped) semiconductor layer 22. The first array of microcontacts 63 extends from the first electrical contact 61 (e.g., n-contact) through the passivation layer 50, through openings defined in the interlayer 55, through openings 52 defined in the first portion 48-1 of the barrier layer 48, through openings defined in a first portion 42-1 of the metal reflector layer 42, through openings defined in a first portion 40-1 of the dielectric reflector layer 40, through the second semiconductor layer 22, and through the active region 25 to terminate in the first semiconductor layer 21. Within openings defined in the interlayer 55, the first portion 48-1 of the barrier layer 48, the first portion 42-1 of the metal reflector layer 42, and the first portion 40-1 of the dielectric reflector layer 40, dielectric material of the dielectric reflector layer 40 laterally encapsulates the first array of microcontacts 63 to prevent electrical contact between the first array of microcontacts 63 and the respective layers 55, 48, 42, 40. The conductive vias 41-1 defined in the first portion 40-1 of the dielectric reflector layer 40 contact the first portion 40-1 of the dielectric reflector layer 40 and the second semiconductor layer 22, which may be beneficial to promote current spreading in the active region 25. The second array of microcontacts 64 extends from the second electrical contact 62 through the passivation layer 50 and through openings defined in the interlayer 55 to at least one of (i) the second portion 48-2 of the barrier layer 48, and (ii) a second portion 42-2 of the metal reflector layer 42, wherein electrical communication is established between the metal reflector layer 42 and the second semiconductor layer 22 through the conductive vias 41-2 defined in a second portion 40-2 of the dielectric reflector layer 40. Although the second array of microcontacts 64 is preferred in certain implementations, in other implementations, a single second microcontact may be substituted for the second array of microcontacts 64. Similarly, although it is preferred in certain implementations to define multiple vias 41-2 in the second portion 40-2 of the dielectric reflector layer 40, in other implementations, a single via or other single conductive path may be substituted for the conductive vias 41-2.

Following formation of the passivation layer 50, one or more side portions 16 extending between the outer major surface 11 of the substrate 15 and surface extensions 21A of the first semiconductor layer 21 are not covered with passivation material. Such side portions 16 embody a non-passivated side surface.

In operation of the flip chip LED 10, current may flow from the first electrical contact (e.g., n-contact or cathode) 61, the first array of microcontacts 63, and the first (n-doped) semiconductor layer 21 into the active region 25 to generate light emissions. From the active region 25, current flows through the second (p-doped) semiconductor layer 22, conductive vias 41-2, second metal reflector layer portion 42-2, second barrier layer portion 48-2, and the second array of microcontacts 64 to reach the second electrical contact (e.g., p-contact or anode) 62. Emissions generated by the active region 25 are initially propagated in all directions, with the reflector layers 40, 42 serving to reflect emissions in a direction generally toward the substrate 15. As emissions reach the patterned surface 14 arranged between the substrate 15 and the first semiconductor layer 21, recessed and/or raised features 17 arranged in or on the patterned surface 14 promote refraction rather than reflection at the patterned surface 14, thereby increasing the opportunity for photons to pass from the first semiconductor layer 21 into the substrate 15 and thereafter exit the LED 10 through the outer major surface 11 and non-passivated side portions 16. In certain implementations, one or more surfaces of the LED 10 may be covered with one or more lumiphoric materials (not shown), to cause at least a portion of emissions emanating from the LED 10 to be up-converted or down-converted in wavelength.

FIGS. 2A and 2B are plan view photographs of a single flip chip LED 10 similar in structure and operation to the flip chip LED 10 of FIG. 1. Referring to FIG. 2A, the flip chip LED 10 includes an outer major surface 11 arranged for extraction of LED emissions, and includes an active region having a length L and a width W. In certain embodiments, the active region includes a length L of about 280 microns, and a width W of about 220 microns, and a substrate 15 extends beyond the active region. Referring to FIG. 2B, the flip chip LED 10 includes a cathode (e.g., first electrical contact) 61 and an anode (e.g., second electrical contact) 62 arranged along a lower surface 54. In certain embodiments, the cathode 61 includes length and width dimensions of about 95 microns by 140 microns, and the anode 62 includes length and width dimensions of about 70 microns by 170 microns.

FIGS. 3A and 3B are plan view photographs of a pixelated-LED chip including an array of four flip chip LEDs 10 formed on a single transparent substrate 15, with each flip chip LED 10 being substantially similar in structure and operation to the flip chip LED 10 of FIG. 1. Each flip chip LED 10 includes an active layer portion of an active layer. The active layer portion of each flip chip LED 10 is spaced apart from the active area of each of other adjacent flip chip LED 10 by a gap (e.g., 40 microns in a length direction and 30 microns in a width direction). A central portion of each gap embodies a street 70 (e.g., having a width of about 10 microns) consisting solely of the substrate 15, whereas peripheral portions of each gap (between each street 70 and active areas of LEDs 10) includes the substrate 15 as well as passivation material (e.g., passivation layer 50 shown in FIG. 1). Each street 70 thus represents a boundary between adjacent flip chip LEDs 10. Each flip chip LED 10 includes a cathode 61 and an anode 62 arranged along a lower surface 54, and each flip chip LED 10 is arranged to emit light through an outer major surface 11 of the substrate 15. The exposed cathodes 61 and anodes 62 permit separate electrical connections to be made to each flip chip LED 10, such that each flip chip LED 10 may be individually addressable and independently electrically accessed. Additionally, this allows groups or subgroups of the flip chip LEDs 10 to be accessed together, separately from other flip chip LEDs 10. If it were desired to separate the flip chip LEDs 10 from one another, then a conventional method to do so would be to utilize a mechanical saw to cut through the streets 70 to yield individual flip chip LEDs 10.

FIGS. 4A and 4B are plan view photographs of a pixelated-LED chip including an array of one hundred flip chip LEDs 10 on a single transparent substrate 15, with each flip chip LED 10 being substantially similar in structure and operation to the flip chip LED 10 illustrated in FIG. 1. The flip chip LEDs 10 are separated from one another by gaps including streets 70. Each flip chip LED 10 includes an outer major surface 11 arranged for extraction of LED emissions, and includes a cathode 61 and an anode 62 arranged along a lower surface 54. The exposed cathodes 61 and anodes 62 permit separate electrical connections to be made to each flip chip LED 10, such that each flip chip LED 10 may be individually addressable and independently electrically accessed.

As noted previously, the omnidirectional character of LED and phosphor emissions may render it difficult to prevent emissions of one LED (e.g., a first pixel) from significantly overlapping emissions of another LED (e.g., a second pixel) of an array of flip chip LEDs arranged on a single light-transmissive substrate. A single transparent substrate supporting multiple flip chip LEDs would permit light beams to travel in numerous directions, leading to light scattering and loss of pixel-like resolution of emissions transmitted through the substrate. Problems of light scattering and loss of pixel-like resolution would be further exacerbated by presence of one or more lumiphoric materials overlying the light extraction surface of a substrate, owing to the omnidirectional character of lumiphor emissions. Various embodiments disclosed herein address this issue by providing light segregation elements configured to reduce interaction between emissions of different LEDs and/or lumiphoric material regions, thereby reducing scattering and/or optical crosstalk and preserving pixel-like resolution of the resulting emissions. In certain embodiments, light segregation elements may extend from a light injection surface into a substrate, may extend from a light extraction surface into a substrate, may extend outward from a light extraction surface, or any combination of the foregoing. In certain embodiments, multiple light segregation elements may be defined by different methods in the same substrate and/or light emitting device. In certain embodiments, light segregation elements of different sizes and/or shapes may be provided in the same substrate and/or light emitting device. For example, in certain embodiments, a first group of light segregation elements having a first size, shape, and/or fabrication technique may extend from a light injection surface into an interior of a substrate, and a second group of light segregation elements having a second size, shape, and/or fabrication technique may extend from a light injection surface into an interior of a substrate, wherein the second size, shape, and/or fabrication technique differs from the first size, shape, and/or fabrication technique. In certain embodiments, light segregation elements may include recesses (whether filled or unfilled) defined in a substrate supporting multiple LEDs, with such recesses embodying boundaries between pixels.

In certain embodiments, each flip chip LED of an array of LEDs supported by a single substrate (e.g., a pixelated-LED chip) includes a greatest lateral dimension of no greater than about 400 microns, about 300 microns, or about 200 microns. In certain embodiments, each flip chip LED pixel of an array of LEDs supported by a single substrate includes inter-pixel spacing of no greater than about 60 microns, or about 50 microns, or about 40 microns, or about 30 microns, or about 20 microns, or about 10 microns. Such dimensional ranges provide a desirably small pixel pitch.

In certain embodiments, a pixelated-LED chip includes LEDs serving as pixels each having a substantially square shape. In certain embodiments, a pixelated-LED chip includes LEDs serving as pixels each having a rectangular (but non-square) shape. In other embodiments, LEDs may be provided as pixels having hexagonal shapes, triangular shapes, round shapes, or other shapes.

In certain embodiments, a pixelated-LED chip may include LEDs provided in a two-dimensional array as pixels of about 70 μm long×70 μm wide, each including an active region of about 50 μm long×50 μm wide, thereby providing a ratio of emitting area to total area of 0.0025 mm$^2$/0.0049 mm$^2$=0.51 (or 51%). In certain embodiments, an array of at least 100 LEDs (as shown in FIG. 4B) may be provided in an area of no greater than 32 mm long×24 mm wide, with spacing between LEDs (pixel pitch) of no greater than 40 μm in the length direction and no greater than 30 μm in the width direction. In certain embodiments, each LED may include an emissive area of 280 μm long×210 μm wide (totaling an area of 0.0588 mm$^2$). Considering a total top area of 320 μm long×240 μm wide (totaling an area of 0.0768 mm$^2$) for each LED, a ratio of emissive area to total area (i.e., including emissive area in combination with non-emissive area) along a major (e.g., top) surface is 76.6%. In certain embodiments, a light emitting device as disclosed herein includes a ratio of emissive area to non-emissive (or dark) area along a major (e.g., top) surface of at least about 30%, at least about 40%, at least about 50% (i.e., about 1:1 ratio of emitting area to non-emitting (dark) area), at least about 55%, at least about 60%, at least about 65%, at least about 70%, at least about 75%, or at least about 80%. In certain embodiments, one or more of the foregoing values may optionally constitute a range bounded by an upper value of no greater than 70%, 75%, 80%, 85%, or 90%. In certain embodiments, an array of at least 1000 LEDs may be provided.

Although FIGS. 2A, 2B, 3A, 3B, 4A, and 4B show each LED as including two n-contact vias (embodying vertically offset circles registered with the n-contact or cathode 61), in certain embodiments, n-contacts and any associated n-contact vias may be shifted laterally and provided in a dark area outside the emitting area of each LED.

FIGS. 5A-5C illustrate a pixelated-LED chip including an array of sixteen flip chip LEDs or pixels 10 on a single transparent substrate 15 facing upward in various states of fabrication. Cathodes 61 and anodes 62 are facing downward. As shown in FIG. 5A, the substrate 15 is continuous in character without any surface features along an outer major (light extraction) surface 11. FIG. 5B shows the substrate 15 following formation of three lengthwise grooves or recesses 72 extending from the light extraction surface 11 into an interior of the substrate 15. Such grooves or recesses 72 may be formed by any suitable techniques described herein, including mechanical sawing. FIG. 5C shows the substrate 15 following formation of three widthwise grooves or recesses 72 extending from the light extraction surface 11 into an interior of the substrate 15.

In certain embodiments, a light emitting device (e.g., a pixelated-LED chip) including an array of flip chip LEDs or pixels may be arranged for coupling with a temporary interface element such as a carrier, submount, or mounting tape that provides temporary support during various manufacturing steps. Electrical coupling with the array of flip chip LEDs or pixels may then occur at subsequent packaging of the pixelated-LED chip.

In certain embodiments, a light emitting device (e.g., a pixelated-LED chip) including an array of flip chip LEDs or pixels may be arranged for coupling with a passive interface element such as a carrier or submount, with electrical connections between the light emitting device and the interface element. In certain embodiments, an interface element may include a first array of bond pads or electrical contacts positioned on a first surface and arranged to make contact with electrodes of an array of flip chip LEDs (e.g., embodied in one or more pixelated-LED chips), and a second array of bond pads or electrical contacts positioned on a second surface and arranged to make contact with electrodes of one or more ASICs or other switching apparatuses configured to accommodate switching of current supplied to individual pixels of the pixelated-LED chip. Optionally, conductive vias may be defined through the interface element to provide conductive paths between the first array of bond pads or electrical contacts and the second array of bond pads or electrical contacts.

In certain embodiments, a light emitting device (e.g., a pixelated-LED chip) including an array of flip chip LEDs or pixels may be arranged for coupling to a passive interface element that provides electrical connections to an off-board controller. In certain embodiments, orthogonally arranged (e.g., vertical and horizontal) conductors form rows and columns in a grid pattern, whereby individual flip chip LEDs (or pixels) are defined by each intersection of a row and column. Such construction may enable multiplex sequencing to permit individual control of each LED or pixel of the array while employing a smaller number of conductors than the number of LEDs in the array, either by utilizing a common-row anode or common-row cathode matrix arrangement, and brightness control may be provided by pulse width modulation.

FIGS. 6A-6E illustrate a first scheme for passively interfacing with an array of flip chip LEDs or pixels. FIG. 6A is a plan view illustration of a light emitting device (e.g., a pixelated-LED chip) including an array of sixteen flip chip LEDs or pixels 10 on a single transparent substrate 15 with a lower surface 54 of the substrate 15 as well as cathodes 61 and anodes 62 facing upward. FIG. 6B is a plan view illustration of a lower layer of an electrical interface for the light emitting device of FIG. 6A. A first interface carrier 101 includes multiple horizontal string series connections 103 each including multiple electrically conductive vias 102 for coupling with anodes 62 of the light emitting device of FIG. 6A, and further including openings 104 permitting passage of conductive vias 106 defined in a second interface carrier 105 (shown in FIG. 6C) forming an upper layer of the electrical interface. As shown in FIG. 6C, multiple vertical string series connections 107 each include multiple electrically conductive vias 106 arranged for coupling with cathodes 61 of the light emitting device of FIG. 6A. FIG. 6D is a plan view illustration of the upper layer of FIG. 6C superimposed over the lower layer of FIG. 6B to form an electrical interface for the light emitting device of FIG. 6A. FIG. 6E is a plan view illustration of the electrical interface of FIG. 6D coupled with the light emitting device of FIG. 6A, whereby the horizontal string series connections 103 and the vertical string series connections 107 permit each flip chip LED or pixel 10 of the array to be individually accessed. Such accessibility may permit each flip chip LED or pixel 10 to be separately controlled (e.g., using multiplex sequencing).

FIGS. 7A-7E illustrate a second scheme for passively interfacing with an array of flip chip LEDs, including individual signals supplied to cathodes of the array. FIG. 7A is a plan view illustration of a light emitting device (e.g., a pixelated-LED chip) including an array of sixteen flip chip LEDs or pixels 10 on a single transparent substrate 15 with a lower surface 54 of the substrate 15 as well as cathodes 61 and anodes 62 facing upward. FIG. 7B is a plan view illustration of a lower layer of an electrical interface for the light emitting device of FIG. 7A. A first interface carrier 101 includes multiple horizontal string series connections 103 each including multiple electrically conductive vias 102 for coupling with anodes 62 of the light emitting device of FIG. 7A, and further including openings 104 permitting passage of conductive vias 106 defined in a second interface carrier 105A (shown in FIG. 7C) forming an upper layer of the electrical interface. FIG. 7C is a plan view illustration of the upper layer of an electrical interface for the light emitting device of FIG. 7A, with multiple vertically arranged parallel connections 107A each including multiple electrically conductive vias 106 for coupling with cathodes 61 of the array. FIG. 7D is a plan view illustration of the upper layer of FIG. 7C superimposed over the lower layer of FIG. 7B to form an electrical interface for the light emitting device of FIG. 7A. FIG. 7E is a plan view illustration of the electrical interface of FIG. 7D coupled with the light emitting device of FIG. 7A, whereby the horizontal string series connections 103 and the vertically arranged parallel connections 107A permit each flip chip LED or pixel 10 of the array to be individually electrically accessed.

As noted previously, solid state emitter arrays disclosed herein may include various combinations of solid state light emitters (e.g., LEDs) and/or lumiphors configured to emit light of different wavelengths, such that an emitter array may be arranged to emit light of multiple peak wavelengths. Various color combinations are contemplated for use in different applications.

FIGS. 8A-8D are plan view diagrams of electrically accessible light emitting devices (e.g., LEDs or pixels) each including multiple light emitters 110 (each including at least one solid state light emitter, optionally in combination with at least one lumiphoric material) supported by a single substrate 15 and configured to produce a different combination of colors. Such devices may each include an array of flip chip LEDs or flip chip pixels on a transparent substrate according to various embodiments disclosed herein. It is to be appreciated that particular color combinations and the number of light emitters disclosed herein are provided by way of example only, and are not intended to limit the scope of the invention, since any suitable combination of colors and number of light emitters are contemplated.

FIG. 8A illustrates a light emitting device including four groups of four red (R), green (G), blue (B), and white (W) light emitters, with each light emitter arranged in a different row among rows 1 to 4 and a different column among columns A to D. A single repeat unit 112 including R-G-B-W light emitters is shown at upper left. In certain embodiments, the blue (B) emitters include LEDs lacking any lumiphoric material; the white (W) emitters include blue LEDs arranged to stimulate emissions of a yellow and red lumiphor combination; the green (G) emitters include either green LEDs or blue LEDs arranged to stimulate green lumiphors; and the red (R) emitters include red LEDs or blue LEDs arranged to stimulate red lumiphors. Accordingly, in certain embodiments, all of the R-G-B-W light emitters are blue LEDs, and the R-G-W light emitters are arranged with lumiphors as described above. In some embodiments, the white (W) emitters may be omitted. In certain embodiments, the light emitting device of FIG. 8A may be useable as a sequentially illuminated LED display for producing color images or text and the like.

FIG. 8B illustrates a light emitting device including four groups of four short wavelength red ($R_1$), green (G), blue (B), and long wavelength red ($R_2$) light emitters, with each light emitter arranged in a different row among rows 1 to 4 and a different column among columns A to D. A single repeat unit 112 including $R_1$-G-B-$R_2$ light emitters is shown at upper left. In certain embodiments, the blue (B) emitters include LEDs lacking any lumiphoric material; the short wavelength red ($R_1$) and long wavelength red ($R_2$) emitters each include a red LED or a blue LED arranged to stimulate emissions of red lumiphors; and the green (G) emitters include either green LEDs or blue LEDs arranged to stimulate green lumiphors. Accordingly, in certain embodiments, all of the $R_1$-G-B-$R_2$ light emitters are blue LEDs, and the $R_1$-G-$R_2$ light emitters are arranged with lumiphors as described above. Generally, solid-state light sources (e.g., LEDs) having different peak wavelengths in the red range decline in luminous efficacy with increasing peak wavelength, such that significantly more current may be required to generate the same number of red lumens from a red LED having a long peak wavelength in the red range than from a red LED having a shorter peak wavelength; however, long peak wavelength red emitters are well-suited for producing high vividness illumination. In certain embodiments, the light emitting device of FIG. 8B may be useable as a sequentially illuminated LED display or advertising billboard suitable for producing very high vividness images, owing to the presence of long wavelength red emitters.

FIG. 8C illustrates a light emitting device including four groups of four blue shifted yellow (BSY), white (W), white (W), and amber (A) light emitters, with each light emitter arranged in a different row among rows 1 to 4 and a different column among columns A to D. A single repeat unit 112 including BSY-W-W-A light emitters is shown at upper left. In certain embodiments, the blue shifted yellow (BSY) emitters include blue LEDs arranged to stimulate emissions of yellow phosphors providing better efficiency but poorer color rendering than white LEDs; the white (W) emitters include blue LEDs arranged to stimulate emissions of a yellow and red lumiphor combination; and the amber (A) emitters include either amber LEDs or blue LEDs arranged to stimulate amber lumiphors.

FIG. 8D illustrates a light emitting device including four groups of four blue shifted yellow (BSY), amber (A), red (R), and blue shifted yellow (BSY) light emitters, with each light emitter arranged in a different row among rows 1 to 4 and a different column among columns A to D. A single repeat unit 112 including BSY-A-R-BSY light emitters is shown at upper left. In certain embodiments, blue shifted yellow (BSY) emitters include blue LEDs arranged to stimulate emissions of yellow phosphors providing better efficiency but poorer color rendering than white LEDs; the amber (A) emitters include either amber LEDs or blue LEDs arranged to stimulate amber lumiphors; and the red (R) emitters include red LEDs or blue LEDs arranged to stimulate red lumiphors.

Various embodiments disclosed herein are directed to providing strong contrast and/or sharpness between lit and unlit regions of LED arrays while seeking to reduce or eliminate crosstalk or light spill between such regions. However, when adjacent LEDs are lit, the presence of certain types of light segregation elements between such LEDs (which are intended to reduce or eliminate crosstalk) may lead to non-illuminated or "dark" zones between the LEDs, thereby degrading homogeneity of the composite emissions. Various embodiments described hereinafter are intended to provide strong contrast and/or sharpness between lit and unlit regions of a LED array, while enhancing homogeneity of composite emissions when adjacent LEDs of the array are lit. For example, in certain embodiments, an array of LEDs (optionally embodied in a pixelated-LED chip) defines multiple pixels, and light segregating elements are configured to permit limited amounts of light to be transmitted between border portions of the pixels for inter-pixel illumination at light-emitting surface portions that are registered with or proximate to a plurality of light segregation elements. Exemplary light segregation elements include recesses (whether unfilled or subsequently filled) defined through a light injection surface and less than entire thickness of a substrate. Such recesses defined in a light injection surface of a substrate may be employed in combination with protruding features of a light extraction surface of the same substrate to provide desirable illumination with and among multiple pixels.

FIGS. 9A to 9B illustrate pixelated-LED light emitting devices (e.g., pixelated-LED chips) according to various embodiments utilizing substrates with light extraction surfaces defining protruding features and with light segregation elements in the form of recesses defined through light injection surfaces. Multiple LEDs are associated with each substrate, with multiple LEDs configured to inject light into a substrate in each instance to form multiple pixels. In each instance, protruding features of the light extraction surfaces may be defined by bevel cutting the light extraction surfaces with a rotary saw (e.g., at a high rotation speed but a slow linear travel speed to prevent cracking of crystalline substrate material). Such cutting may form a plurality of light extraction surface recesses that intersect and that serve to define and segregate the protruding features. More particularly, bevel cutting of the light extraction surface may be performed to yield a plurality of inclined lateral faces of the light extraction surface recesses. In certain embodiments, each inclined lateral face of the plurality of inclined lateral faces comprises an angle of inclination from vertical in a range of from about fifteen degrees to about forty-five degrees, or in a subrange of from about twenty degrees to about forty degrees, or in a subrange of from about twenty-five degrees to about thirty-five degrees, or in an amount of about thirty degrees. When an angle of inclination from vertical of about thirty degrees is used, and opposing faces of a protruding feature are formed by two bevel cuts of the same magnitude, a protruding feature may include an angle of about sixty degrees between the opposing faces.

FIG. 9A is a schematic side cross-sectional view of at least a portion of a pixelated-LED light emitting device 179 (e.g., a pixelated-LED chip) according to one embodiment including a substrate 170 with multiple protruding features 174, 176 separated by multiple light extraction surface recesses 173, 173' along a light extraction surface 172 thereof. The light extraction surface 172 opposes a light injection surface 171 of the substrate 170, with the light injection surface 171 being positioned proximate to first and second LEDs (functional stacks) 60A, 60B. For sake of brevity, the functional stacks 60A, 60B may hereinafter be referred to as "LED 60A" and "LED 60B," respectively. A first recess 68 is provided between the LEDs 60A, 60B, and a second recess 178 (which is registered with the first recess 68) is defined through the light injection surface 171 and through less than an entire thickness of the substrate 170. As shown in FIG. 9A, the LEDs 60A, 60B are configured to transmit light through the substrate 170 to form first and second pixels 170A, 170B. The second recess 178 serves as a light segregation element, or a pixel segregation element, to reduce transmission of emissions of one LED 60A, 60B into the pixel 170B, 170A associated with the other LED 60B, 60A, respectively. The protruding features 174, 176 are segregated from one another by light extraction surface recesses 173, 173', with sloping sidewalls 175 spanning between the protruding features 174, 176 and the light extraction surface recesses 173, 173'. Three protruding features 174, 176 are provided for each pixel 170A, 170B. Multiple light extraction surface recesses 173 (e.g., bevel cuts formable with angled rotary saw blades) are provided for each pixel 170A, 170B. As shown, a trough or "street" (e.g., light extraction surface recess) 173' between two protruding features 174 is aligned with the second recess 178 defining a lateral border between LEDs 60A, 60B of the first and second pixels 170A, 170B (thereby providing a "street-aligned" configuration). Additionally, different protruding features 174, 176 are shown as having different sizes (e.g., heights) and different shapes, with laterally outermost (or edge-adjacent) protruding features 176 being larger than non-edge-adjacent protruding features 174. Such configuration may increase light extraction proximate to the edges and thereby at least partially ameliorate perceived non-uniformity of light output intensity (with edge or corner pixels generally appearing dimmer than interior pixels).

A minimum thickness region between the second recess 178 and the light extraction surface 172 extends in a vertical direction and is shown as $T_{MIN}$ in FIG. 9A. For light emissions of the first LED 60A to exit through the light extraction surface 172 of the second pixel 170B, such emissions would need to be transmitted in an approximately lateral direction through the minimum thickness region $T_{MIN}$ generally above the second recess 178. Permitting a small amount of light to be transmitted (e.g., laterally and outwardly) through the protruding feature 174' registered with the second recess 178 may beneficially reduce the appearance of a dark boundary between adjacent pixels 170A, 170B that would result if inter-pixel light segregation were 100% effective. As will be described hereinafter, reducing the minimum thickness region $T_{MIN}$ would be expected to generally reduce cross-talk and increase contrast between the pixels 170A, 170B. With further reference to FIG. 9A, a lower boundary of each light extraction surface recess 173 is radiused, reflecting the fact that a rotary saw blade useable to form each light extraction surface recess 173 has a non-zero thickness. The dashed lines shown below each light extraction surface recess 173 represent imaginary projections of the sloping sidewalls 175. Although FIG. 9A shows only two LEDs 60A, 60B and illustrates the substrate 170 as having lateral walls 170', 170", it is to be appreciated that the lateral walls 170', 170" may be shifted as necessary and additional first recesses 68', 68" may be provided to accommodate any suitable number of LEDs to be supported by the substrate 170. Alternatively, the pixelated-LED chip 179 may be abutted laterally against (or positioned proximate to) at least one other pixelated-LED chip along the lateral walls 170', 170" to form a larger LED array. As further shown by horizontal dashed lines 177 in FIG. 9A, the laterally outermost (or edge-adjacent, optionally corner-adjacent) protruding features 176 may optionally be truncated along upper portions thereof to yield vertically truncated polyhedral shapes.

FIG. 9B is a schematic side cross-sectional view representing a portion of FIG. 9A, with addition of dimensioning lines and values. As shown, each sloping sidewall 175 is separated from another adjacent sloping sidewall 175 of the same protruding feature 174 by an angle of about sixty degrees. In certain embodiments, A=22.5 µm, B=7.5 µm, C=15 µm, D=9 µm, E=8 µm radius, and F=90 µm. Other dimensions may be used according to various embodiments.

In certain embodiments, each active region of the plurality of active layer portions are configured to illuminate a different light-transmissive portion of the plurality of light-transmissive portions and transmit light through the light extraction surface, such that the plurality of active layer portions and the substrate form a plurality of pixels, and pixels of the plurality of pixels comprise a maximum pixel width; and the method further comprises forming a plurality of protruding features in the light extraction surface, wherein each protruding feature of the plurality of protruding features comprises a width in a range of from about one fifth to about one half of the maximum pixel width. Restated, in certain embodiments, a light extraction surface may include (larger-scale) protruding features of polyhedral or truncated polyhedral shapes with a plurality of inclined lateral faces, in combination with (smaller scale) microscale textural features.

In certain embodiments, one or more pixelated-LED chips may include different pixels with protruding features of different sizes, shapes, numbers, and/or distributions. Protruding features of different sizes may include differences in at least one of height, width, or length. Protruding features of different shapes may include differences in symmetry (or lack thereof), angularity, curvature, or the like. Protruding features may be provided in different numbers in association with different pixels. Differences in pixel distribution may include relative or absolute placement of pixels relative to a pixel area.

In certain embodiments, protruding features of light extraction surfaces of one or more pixelated-LED chips may be defined by bevel cutting the light extraction surfaces with a rotary saw (e.g., at a high rotation speed but a slow linear travel speed to prevent cracking of crystalline substrate material). Such cutting may form a plurality of light extraction surface recesses that intersect and that serve to define and segregate the protruding features. Either before or after (or both before and after) such bevel cutting, substrate material may be subjected to one or more thinning processes such as etching, grinding, lapping, mechanical polishing, chemical polishing, chemical-mechanical polishing, and the like. One or more thinning processes may be applied to the entirety of a substrate, or only to selected portions thereof.

In certain embodiments, a pixelated-LED chip (or a least a substrate thereof) as disclosed herein may be thinned to about 200 µm prior to formation of recesses to yield protruding features in a light extraction surface thereof.

In certain embodiments, laterally outermost (e.g., edge-adjacent, or adjacent lateral edges of the substrate) protruding features differ in size (e.g., larger or smaller) than non-edge-adjacent protruding features of one or more pixels of a pixelated-LED chip. In certain embodiments, corner-adjacent protruding features (e.g., adjacent corners of the substrate) may differ in size (e.g., larger or smaller) than non-corner-adjacent protruding features (e.g., non-corner-adjacent edge protruding features, or non-edge-adjacent protruding features) of one or more pixels of a pixelated-LED chip.

FIG. 10 is a table providing physical characteristics and measured performance values for various pixelated-LED chips according to the present disclosure with different substrate light extraction surface configurations, identified at left by alphanumeric characters A to H. As identified in the first column, each pixelated-LED chip including a substrate light extraction surface textured with protruding features each having either (i) a width about the same as the width of a pixel (e.g., one bevel cut per pixel or "1× full surface texture"), (ii) a width about one half of the width of a pixel (e.g., two bevel cuts per pixel or "2× full surface texture"), or (iii) a width about one third of the width of a pixel (e.g., three bevel cuts per pixel or "3× full surface texture"). Different pixel total heights were used, with numerical values specified in the second column. Thickness of interconnecting material (i.e., a distance between a recess defined through a substrate light injection surface and the closest light extraction surface) is specified in the third column. The fourth column specifies luminous flux greater than 90 Candela per square millimeter. The fifth and sixth columns specify sharpness at 70 µm and contrast at 120 µm, respectively (with lower values representing positive results). The final column provides pixel homogeneity (with lower values representing positive results). Generally, it can be seen that thickness of interconnecting material (the third column) has a pronounced effect on sharpness and contrast, since the worst sharpness and contrast values were obtained for samples with the greatest thickness of interconnecting material. When samples with the least thickness of interconnecting material (rows A, C, D, F, and H) are compared, it appears that three bevel cuts per pixel or "3× full surface texture" provides the most favorable combination of sharpness, contrast, pixel homogeneity, and luminous flux, according to row H.

Figure 11B:
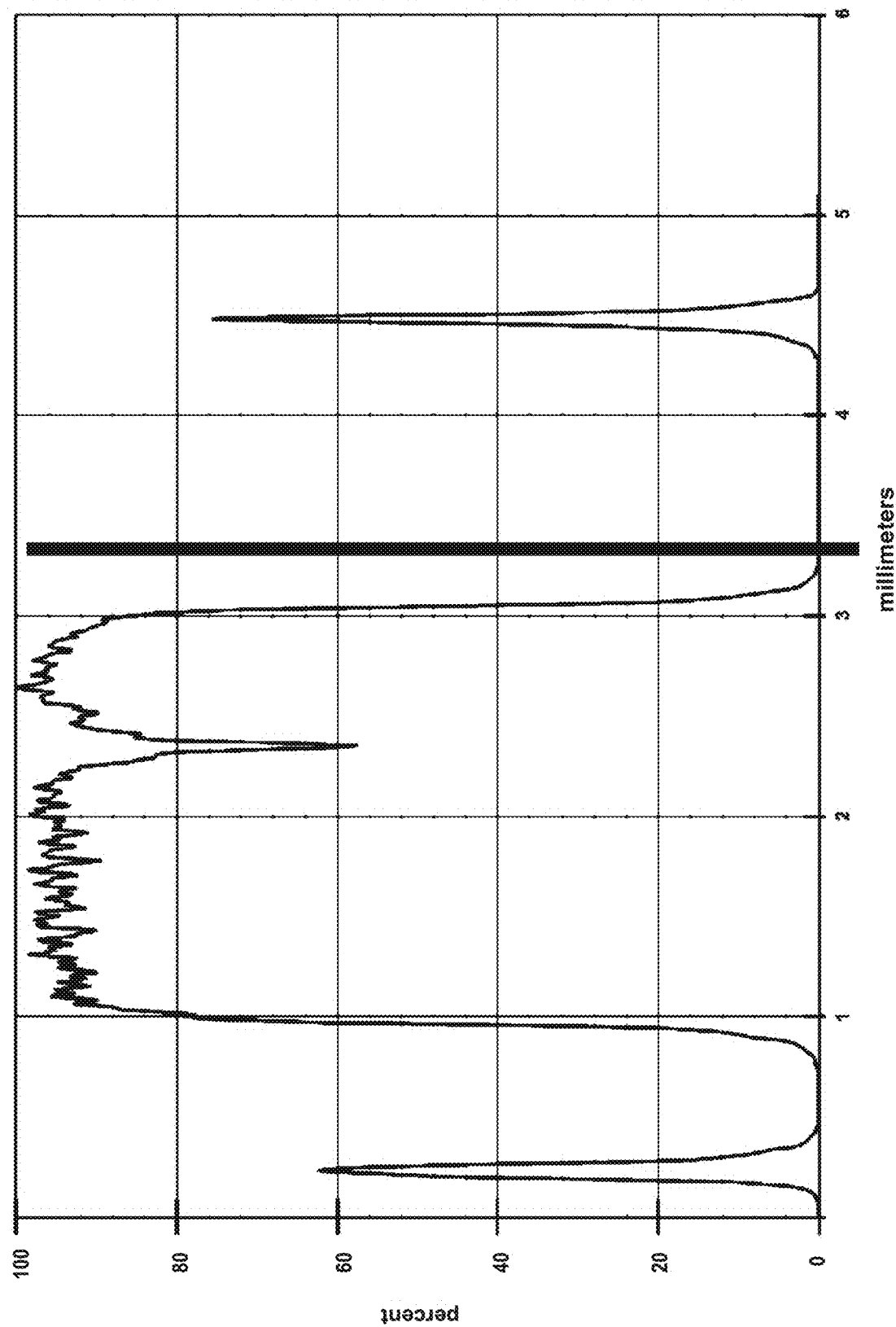
FIG. 11B is a plot of percent illumination versus position (millimeters) for a pixel of a pixelated-LED chip including a substrate light extraction surface textured with protruding features each having a width about one half of the width of a pixel (e.g., two bevel cuts per pixel).
Figure 11C:
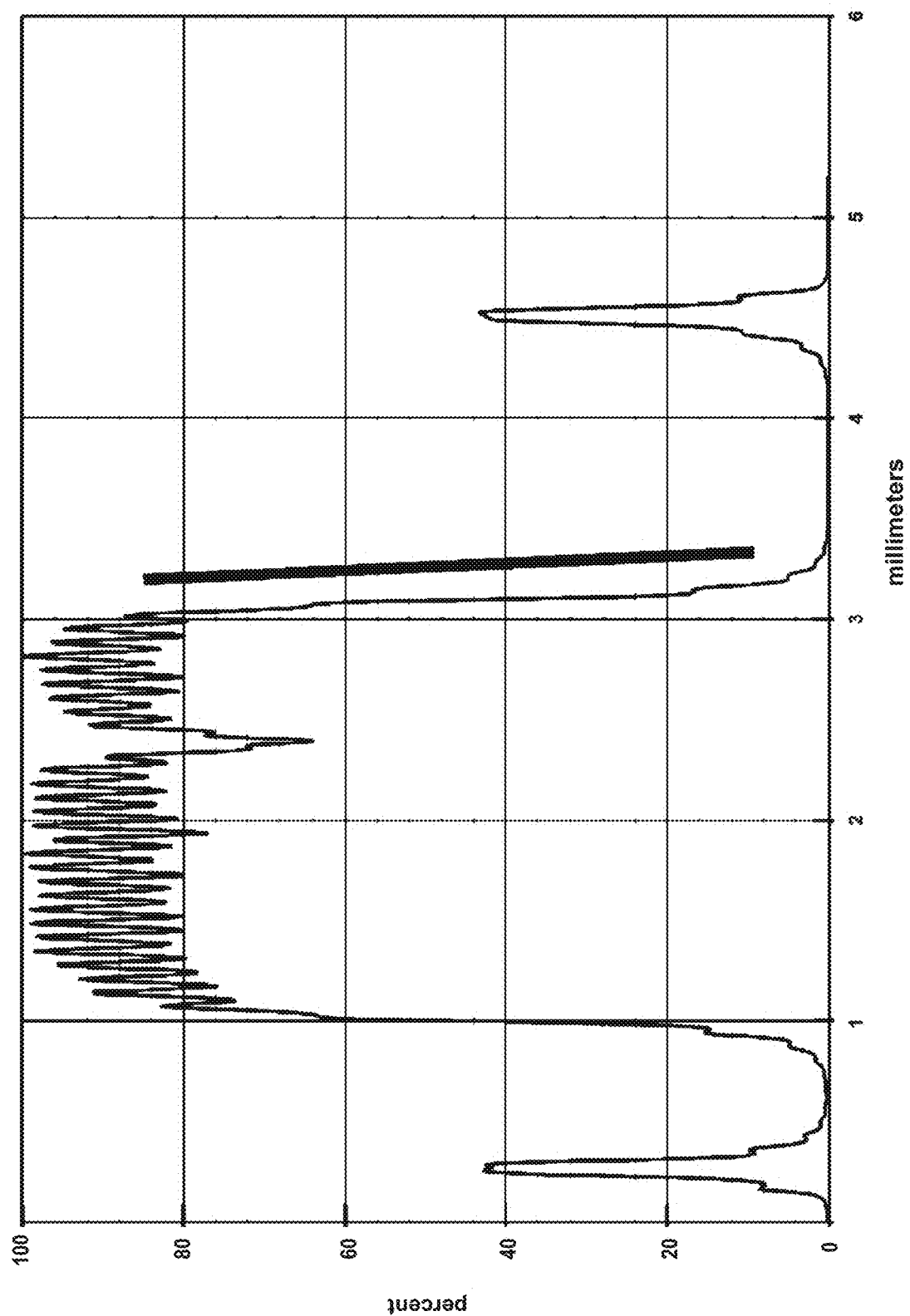
FIG. 11C is a plot of percent illumination versus position (millimeters) for a pixel of a pixelated-LED chip including a substrate light extraction surface textured with protruding features each having a width about one third of the width of a pixel (e.g., three bevel cuts per pixel).

FIGS. 11A-11C each provide plots of percent illumination versus position (millimeters) for a pixel of a different pixelated-LED chip, including a substrate light extraction surface textured with protruding features each having a width about the same as the width of a pixel (e.g., one bevel cut per pixel in FIG. 11A), each having a width about one half of the width of a pixel (e.g., two bevel cuts per pixel in FIG. 11B), and each having a width about one third of the width of a pixel (e.g., three bevel cuts per pixel in FIG. 11C). The progressively steeper slope at the pixel edge (at position of 3 mm in each chart) shows that increasing bevel cuts from 1 to 2 to 3 provides increased contrast.

Figure 12A:
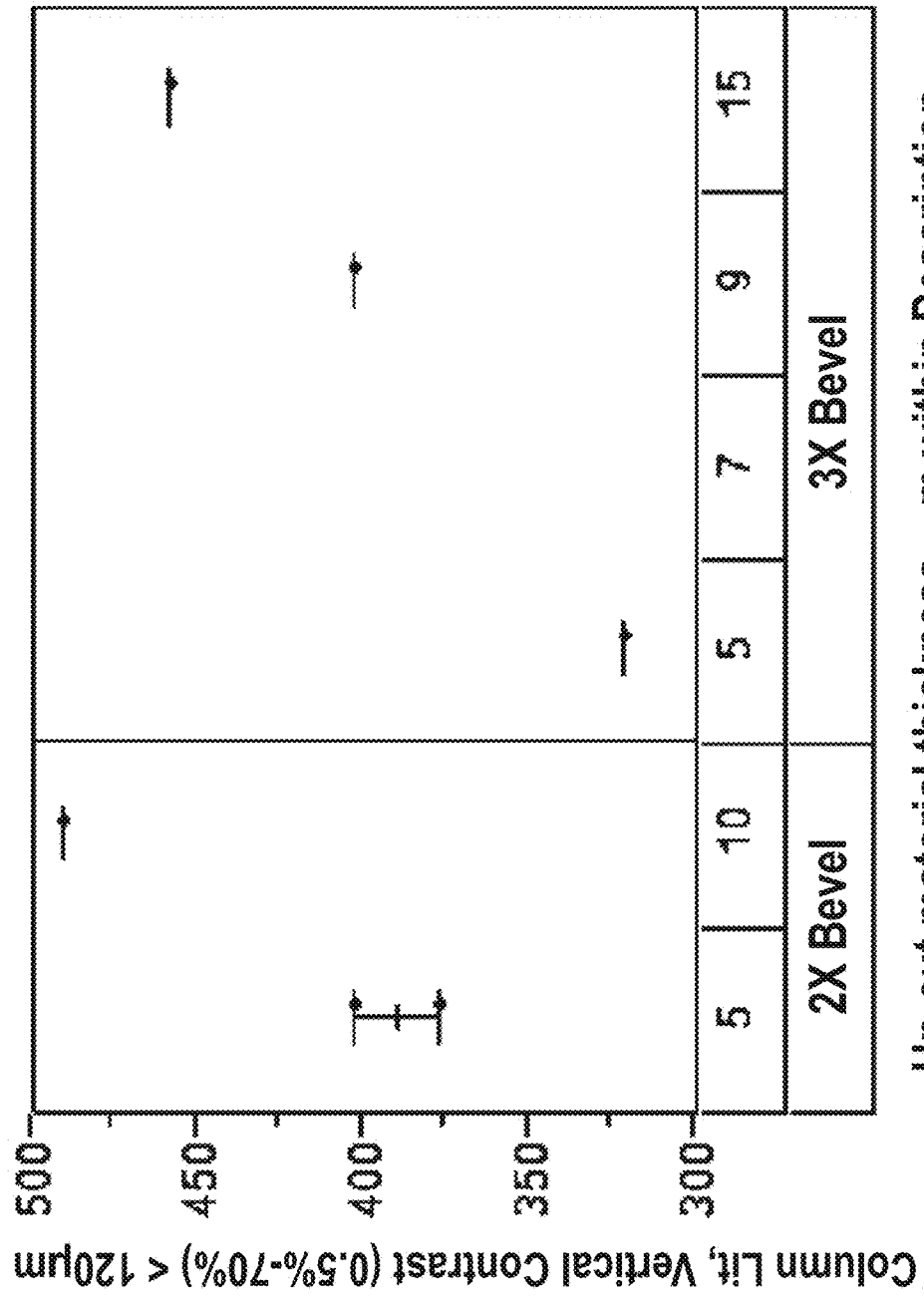
FIG. 12A is a variability chart including plots of vertical contrast as a function of un-cut material thickness for six different pixelated-LED chips with textured substrate light extraction surfaces, including two substrates with two bevel cuts per pixel and different un-cut material thicknesses, and four substrates with three bevel cuts per pixel and different un-cut material thicknesses.
Figure 12B:
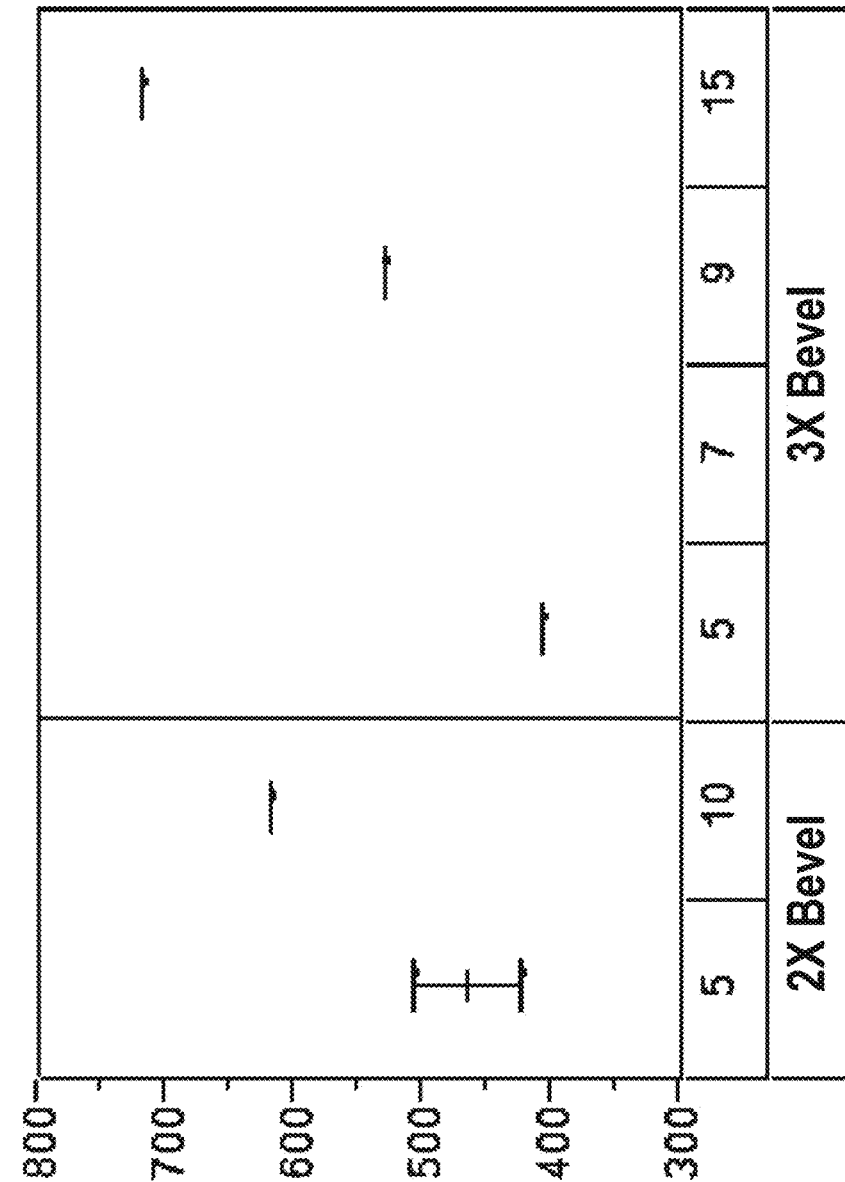
FIG. 12B is a variability chart including plots of horizontal contrast as a function of un-cut material thickness for the six different pixelated-LED chips identified in connection with FIG. 12A.

FIG. 12A is a variability chart including plots of vertical contrast as a function of uncut material thickness for six different pixelated-LED chips with textured substrate light extraction surfaces, including two substrates with two bevel cuts per pixel and different un-cut material thicknesses, and four substrates with three bevel cuts per pixel and different un-cut material thicknesses. FIG. 12B is a variability chart including plots of horizontal contrast as a function of un-cut material thickness for the six different pixelated-LED chips identified in connection with FIG. 12A. FIGS. 12A and 12B show that increasing un-cut material thickness results in degraded vertical contrast and degraded horizontal contrast for both two and three bevel cut per pixel samples.

Figure 12C:
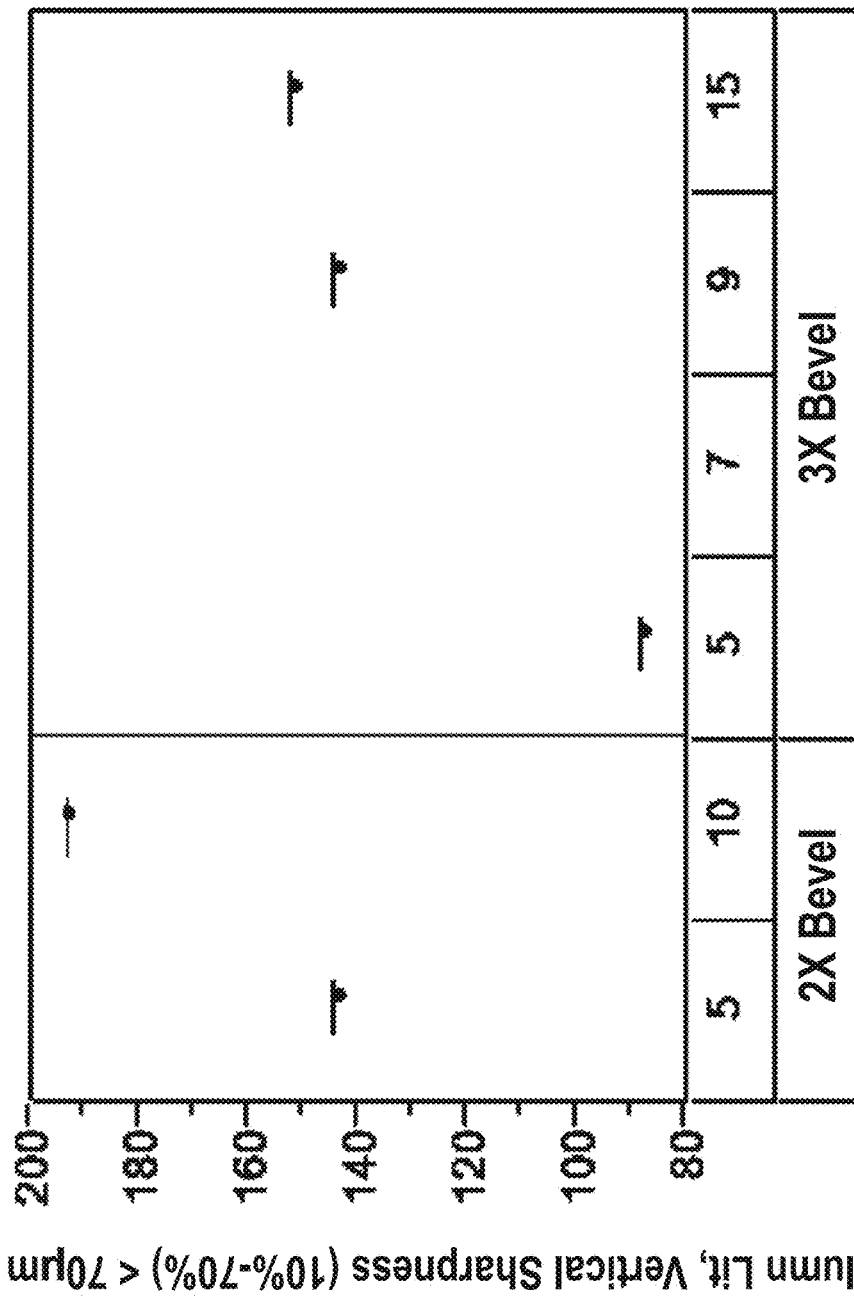
FIG. 12C is a variability chart including plots of vertical sharpness as a function of un-cut material thickness for the six different pixelated-LED chips identified in connection with FIGS. 12A and 12B.

FIG. 12C is a variability chart including plots of vertical sharpness as a function of un-cut material thickness for the six different pixelated-LED chips identified in connection with FIGS. 12A and 12B. FIG. 12D is a variability chart including plots of horizontal sharpness as a function of un-cut material thickness for the six different pixelated-LED chips identified in connection with FIGS. 12A-12C. FIGS. 12C and 12D show that increasing un-cut material thickness results in degraded vertical sharpness and degraded horizontal sharpness for both two and three bevel cut per pixel samples.

FIG. 12E is a variability chart including plots of luminous flux values greater than 90 Cd/mm$^2$ for the six different pixelated-LED chips identified in connection with FIGS. 12A-12D. Such figure appears to show that increasing un-cut material thickness results in degradation of luminous flux values for both two and three bevel cut per pixel samples.

Several principles may be appreciated from the preceding summary of experimental work performed by the inventors. Firstly, the amount of "un-cut" material is directly related to sharpness/contrast. Secondly, texturing feature size is directly related to homogeneity and sharpness/contrast. Texturing feature size is related to color uniformity, even in the absence of additional treatment. Additionally, very small to no "un-cut" material detrimentally tends to lead to shattering of pixels, thereby rendering extremely small "un-cut" material thicknesses very difficult to manufacture in a robust and repeatable way.

In certain embodiments, a light extraction surface may comprise a plurality of microscale textural features. In certain embodiments, each microscale textural a plurality of microscale textural features may have a maximum dimension (e.g., length, width, or height) of up to about 10 µm, or up to about 7.5 µm, or up to about 5 µm, or up to about 3 µm, or up to about 2 µm, or up to about 1 µm. In certain embodiments, microscale textural features may be defined by a subtractive material removal process, such as dry etching and/or wet etching. Examples of dry etching processes that might be used in certain embodiments include inductively coupled plasma etching and reactive ion etching.

In certain embodiments, microscale textural features may be randomly distributed (e.g., with large variation in spacing, optionally in combination with as well as large variation in size, shape, and/or texture). FIG. 13 is a scanning electrode microscope image of a silicon carbide surface processed with inductively coupled plasma etching to define a plurality of randomly distributed microscale textural features.

In certain embodiments, microscale textural features may be regularly spaced and/or regularly sized. Such features may be formed through use of at least one mask with regularly spaced openings or pores, which may be defined by photolithographic patterning or other conventional mask formation methods.

In certain embodiments, a substrate (e.g., silicon carbide) may be blanket coated with a thin coating (e.g., 200-300 Angstroms) of aluminum. A consumable water soluble template pre-coated with resist may be bonded to the coated wafer surface with low temperature and pressure. The template may be removed with warm water, leaving resist dots. The aluminum layer may be patterned with a short chlorine etch followed by a short (e.g., 20-60 second) inductively coupled plasma (ICP) etch to transfer the pattern into the silicon carbide. A TMAH wet etch may be used to remove any residual aluminum. FIG. 14 provides eight scanning electrode microscope images of silicon carbide surfaces following masking and selective material removal including inductively coupled plasma etching to define ordered arrays of regularly spaced and sized microscale textural features, with such features defined via ICP etching.

In certain embodiments, at least one lateral edge or sidewall of the substrate is encased in an encapsulant material (e.g., silicone). Such encapsulant material may also cover a submount. Use of encapsulant material in these contexts may prevent an etchant from attacking edges of the substrate and/or the submount.

In certain embodiments, a method for fabricating a pixelated-LED lighting device comprises: defining a plurality of recesses or grooves in a substrate supporting an array of LED-pixels, wherein the substrate comprises (i) a light injection surface proximate to a plurality of active layer portions, and (ii) a light extraction surface generally opposing the light injection surface, wherein recesses or grooves of the plurality of recesses or grooves are (a) defined through the light injection surface of the substrate and (b) arranged generally between LED-pixels of the array of LED-pixels, and the substrate includes a plurality of anode-cathode pairs in conductive electrical communication with the array of LED-pixels; mounting the substrate to a mounting surface, such as on a carrier substrate, temporary substrate, or submount; thinning the substrate; defining a plurality of microscale textural features in the light extraction surface; and applying at least one lumiphoric material over the light extraction surface, wherein the at least one lumiphoric material is configured to receive at least a portion of emissions of the array of LED-pixels and responsively generate lumiphor emissions.

In certain embodiments, the method further comprises encasing at least one lateral edge or sidewall of the substrate, and/or one or more surfaces of a submount to which the pixelated-LED chip is mounted, with an encapsulant material prior to the defining of the plurality of microscale textural features (e.g., via etching) in the light extraction surface. In certain embodiments, other protection means such as Kapton® tape, photoresist, and/or dry-films may be used for surface protection.

In certain embodiments, the method further comprises defining a plurality of extraction surface grooves or recesses through the light extraction surface (e.g., via bevel cutting or other means) after the defining of the plurality of microscale textural features in the light extraction surface. In certain embodiments, such grooves or recesses do not extend through an entire thickness of the substrate. In certain embodiments, the plurality of extraction surface grooves or recesses are substantially registered with the plurality of recesses or grooves in the substrate.

In certain embodiments, the method further comprises applying a mask over the substrate prior to the defining of the plurality of microscale textural features in the light extraction surface.

In certain embodiments, a pixelated LED chip comprises an active layer comprising a plurality of active layer portions and a plurality of substrate portions supporting the plurality of active layer portions. Each substrate portion comprises a light-transmissive material, a light injection surface, and a light extraction surface, wherein the light injection surface is arranged between the active layer and the light extraction surface. Each active layer portion of the plurality of active layer portions is independently electrically accessible and is configured to illuminate a different substrate portion of the plurality of substrate portions and transmit light through the light extraction surface of the substrate portion, such that the plurality of active layer portions and the plurality of substrate portions form a plurality of pixels. Additionally, this allows a group or subgroup of the active layer portions to be accessed together, independently of other active layer portions. The light extraction surface of each substrate portion comprises a plurality of protruding features and a plurality of recesses, and each protruding feature of the plurality of protruding features is separated from at least one other protruding feature by a recess of the plurality of recesses. Lateral borders between different pixels of the plurality of pixels are aligned with selected troughs of the plurality of recesses.

Figure 15B:
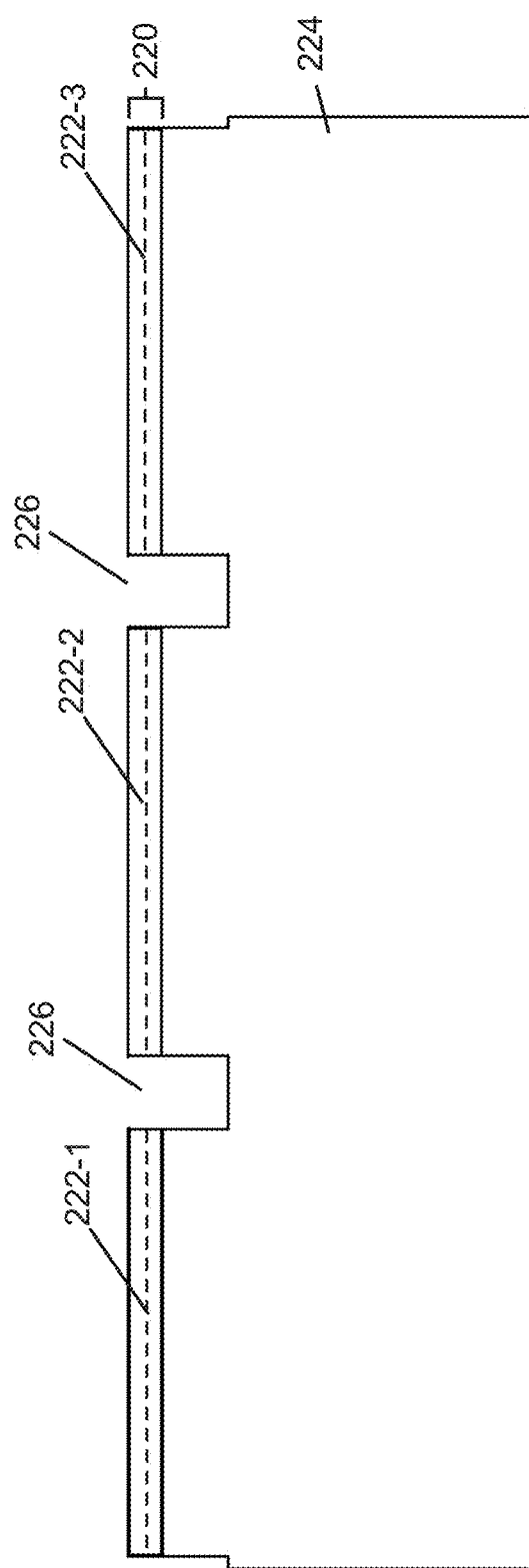

FIG. 15A-15I are schematic cross-sectional views of a pixelated-LED chip in various states of fabrication, according to certain embodiments. In FIG. 15A, an LED structure 220 including an active layer 222 has been deposited on a substrate 224. The LED structure 220 may include a plurality of epitaxial layers deposited by metal organic chemical vapor deposition (MOCVD). In addition to the active layer 222, the LED structure 220 may further include one or more n-type semiconductor layers and one or more p-type semiconductor layers. In some embodiments, the LED structure 220 includes Group III-V nitrides including but not limited to gallium nitride, aluminum gallium nitride (AlGaN), aluminum indium gallium nitride (AlInGaN), and indium gallium nitride (InGaN). An exemplary n-type dopant is silicon (Si) and an exemplary p-type dopant is magnesium (Mg). The active layer 222 may be configured between at least one n-type layer and one p-type layer. The active layer 222 may include a single quantum well (SQW) structure that includes a layer of InGaN or a multiple quantum well (MQW) structure such as a plurality of layers that include alternating layers of InGaN and GaN. Other semiconductor materials are possible, including gallium arsenide (GaAs), gallium phosphide (GaP), and alloys thereof. The substrate 224 may include a light-transmissive material such as silicon carbide (SiC) or sapphire, although other substrate materials are possible.

Figure 15C:
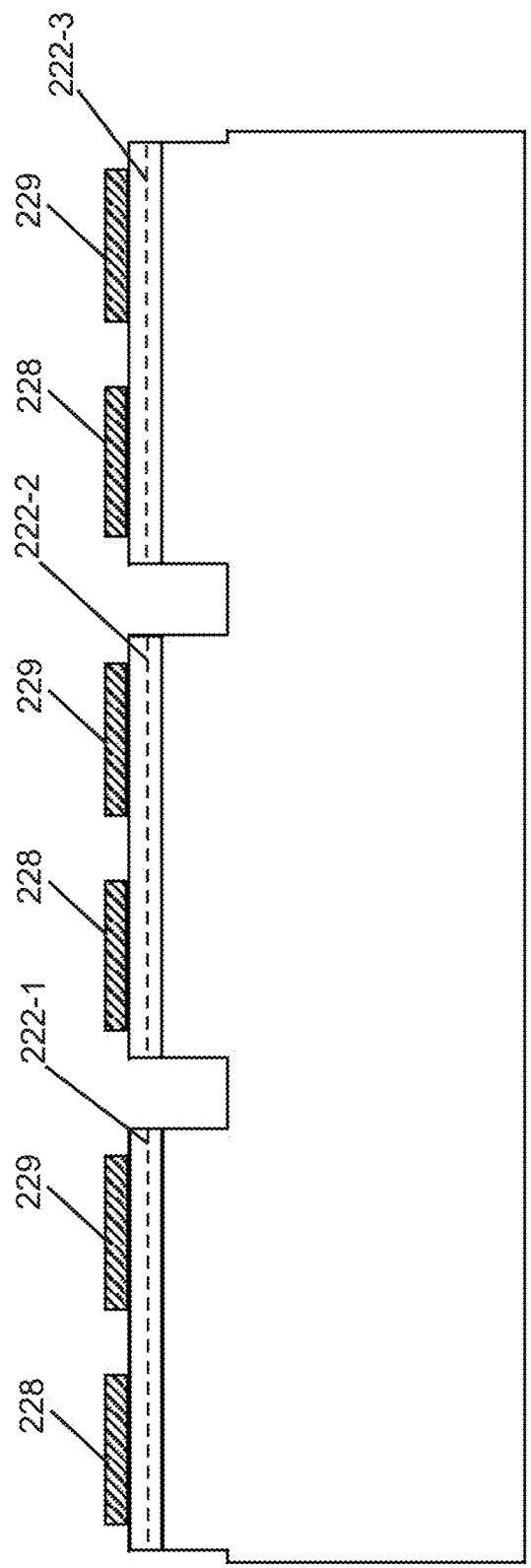

In FIG. 15B, a plurality of active layer portions 222-1, 222-2, and 222-3 have been formed from the LED structure 220. A plurality of recesses or streets 226 are configured to segregate active layer portions 222-1, 222-2, and 222-3. The plurality of recesses 226 may be formed by selectively etching portions of the LED structure 220 and the substrate 224. In some embodiments, the plurality of recesses 226 extends entirely through the LED structure 220 and partially through the substrate 224. In certain embodiments, a first etching step is applied to the LED structure 220 and a second etching step is applied to the substrate 224. In other embodiments, the LED structure 220 and the substrate 224 may be etched in the same etching step. In FIG. 15C, an anode 228 and a cathode 229 are deposited over each of the active layer portions 222-1, 222-2, and 222-3.

Figure 15D:
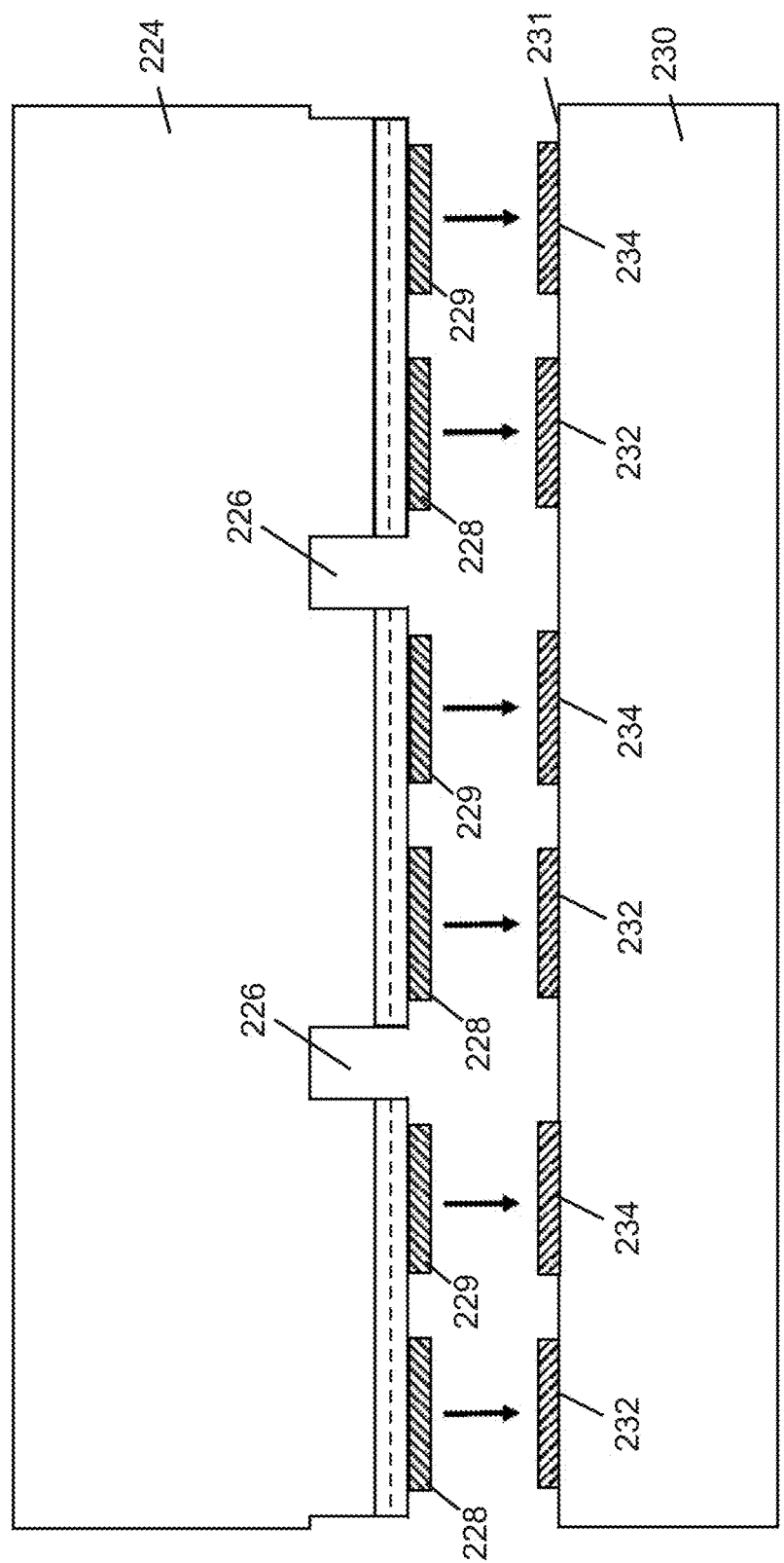

In FIG. 15D and FIG. 15E, the substrate 224 is flip-chip mounted over a mounting surface 231. In some embodiments, the mounting surface 231 is a surface of a submount 230 that includes a plurality of electrode pairs 232, 234. The submount 230 may comprise an active interface element such as an ASIC chip, a passive interface element that serves as an intermediate element that may be later-attached to an active interface element, or a temporary interface element that provides temporary support for subsequent manufacturing steps. For embodiments where the submount 230 comprises a temporary interface element, the plurality of electrode pairs 232, 234 may be omitted. The flip-chip mounting comprises establishing electrically conductive paths between the plurality of anode-cathode pairs 228, 229 and the plurality of electrode pairs 232, 234. In some embodiments, the plurality of anode-cathode pairs 228, 229 are planarized before flip-chip mounting to correct any variations in thicknesses from the anode-cathode deposition. Such planarization helps ensure that reliable electrical contacts may be made across the multiple contacts pairs 228, 230 distributed across the entire interface between the submount 230 and the substrate 224, and avoids variation in interfacial height that would otherwise promote cracking of the substrate 224 when the substrate 244 is mechanically processed (e.g., thinned and shaped) in subsequent steps. As previously described, the submount 230 may include a plurality of separate electrical paths, including one electrical path for each electrode pair of the plurality of electrode pairs 232, 234. In this regard, each of the active layer portions 222-1, 222-2, and 222-3 may be independently electrically accessible. Additionally, this allows a group or subgroup of the active layer portions (e.g. 222-1 and 222-2) to be accessed together, independently of other active layer portions (e.g. 222-3). Any suitable material and/or technique (e.g., solder attachment, preform attachment, flux or no-flux eutectic attachment, silicone epoxy attachment, metal epoxy attachment, thermal compression attachment, bump bonding, and/or combinations thereof) can electrically connect the plurality of anode-cathode pairs 228, 229 and the plurality of electrode pairs 232, 234. In some embodiments, residue from the mounting step may be left in undesired areas between the substrate 224 and the submount 230 (such as in the recesses or streets 226), and a cleaning step (such as an ultrasonic clean), may be used to remove the residue.

In FIG. 15F, an underfill material 236 has been applied between the substrate 224 and the submount 230. The underfill material 236 fills open spaces within the recesses or streets 226 as well as filling open spaces between the plurality of anode-cathode pairs 228, 229 that are bonded to the electrode pairs 232, 234. In this manner, the underfill material 236 is arranged between the plurality of active layer portions 222-1, 222-2, and 222-3 and the submount 230. The underfill material 236 is additionally arranged between lateral sidewalls 233 of the plurality of active layer portions 222-1, 222-2, and 222-3. In certain embodiments, the lateral sidewalls 233 are spaced from each other between the plurality of active layer portions 222-1, 222-2, and 222-3 by a distance no greater than about 60 µm, or about 50 µm, or about 40 µm, or about 30 µm, or about 20 µm, or about 10 µm, or in a range of from about 10 µm to about 30 µm, or in a range of from about 10 µm to about 20 µm. Accordingly, a width of the underfill material 236 between the lateral sidewalls 233 would have the same dimensions. In certain embodiments, the underfill material 236 comprises an insulating material. The underfill material 236 may comprise a light-altering or light-reflecting material such as light-altering or light-reflecting particles suspended in an insulating binder or a matrix, with the particles having a higher index of refraction than the binder. In some embodiments, the underfill material 236 comprises titanium dioxide (TiO$_2$) particles suspended in a silicone binder. In certain embodiments, a weight ratio of TiO$_2$ to silicone is in a range of 50% to 150%. In some embodiments, the weight ratio of TiO$_2$ to silicone is about 100%, or about 1:1. Additionally, a solvent may be added to help the underfill material 236 flow and fill the recesses or streets 226 as well as filling open spaces between the plurality of anode-cathode pairs 228, 229. In other embodiments, the underfill material 236 may comprise metallic particles suspended in an insulating binder. In some embodiments, the underfill material 236 comprises a dielectric material. In other embodiments, the underfill material 236 comprises air. In this manner, the underfill material 236 is arranged in the recesses or streets 226 to form light segregation elements, or pixel segregation elements, between each of the active layer portions 222-1, 222-2, and 222-3. Accordingly, light emissions of the active layer portions 222-1, 222-2, and 222-3 may be segregated from each other, thereby having improved contrast. The underfill material 236 may additionally comprise a material such as a solvent that may alter the viscosity. In some embodiments, the underfill material 236 is applied where the substrate 224 is mounted to the submount 230 and the underfill material 236 is allowed to fill open spaces by a wicking action, optionally aided by gravity (e.g., angling the submount/substrate assembly away from horizontal), by vibration, by establishment of a pressure differential, etc. In certain embodiments, the underfill material 236 may be applied when the substrate 224 and the submount 230 are under vacuum pressure. In addition to improving the contrast between active layer portions 222-1, 222-2, and 222-3, the underfill material 236 may additionally protect the integrity of the electrical connections between the plurality of anode-cathode pairs 228, 229 and the plurality of electrode pairs 232, 234, and further strengthen a mechanical interface between the substrate 224 and the submount 230 and between active layer portions 222-1, 222-2, and 222-3 during subsequent processing steps. In certain embodiments, the underfill material 236 comprises a material with a high durometer on a Shore hardness scale (e.g., a high durometer silicone material). A material with a high durometer, or hardness, in the underfill material 236 provides mechanical stability or anchoring to help prevent the plurality of anode-cathode pairs 228, 229 from detaching from the plurality of electrode pairs 232, 234 in subsequent processing steps. For example, the underfill material 236 may comprise a material, such as silicone, with a Shore D hardness scale durometer value of at least 40. In further embodiments, the underfill material 236 may comprise a material with a Shore D hardness scale durometer value in a range of from about 40 to about 100 or in a range from about 60 to about 80.

In FIG. 15G, the substrate 224 may be subjected to one or more thinning processes such as etching, grinding, lapping, mechanical polishing, chemical polishing, chemical-mechanical polishing, and the like. In some embodiments, the substrate 224 may initially comprise a thickness of greater than 300 µm. After mounting the substrate 224 to the submount 230, the substrate 224 may be thinned to a thickness of no more than 100 µm. In some embodiments, the substrate 224 may be thinned to about 50 µm by one or more thinning steps. In certain embodiments, multiple thinning steps may be performed in increments of 20-80 µm per thinning step. In some embodiments, the thinning process exerts mechanical stress on the substrate 224 as well as on the electrical connections between the plurality of anode-cathode pairs 228, 229 and the plurality of electrode pairs 232, 234. As previously described, the underfill material 236 may provide mechanical support to prevent cracking of the substrate 224 and/or prevent the electrical connections from being broken.

As illustrated in FIG. 15H, the substrate 224 is cut to provide a plurality of protruding features 238 defined by bevel cutting the substrate 224 with a rotary saw. The bevel cutting may be performed across the substrate 224 along various cut lines, or regions 240, 240' at a high rotation speed but a slow linear travel speed to prevent cracking of crystalline substrate material. Some of the cut lines or regions 240' are aligned with the plurality of recesses or streets 226 that segregate active layer portions 222-1, 222-2, and 222-3, thereby providing a "street-aligned" configuration. Notably, the cut lines or regions 240' intersect with the plurality of recesses or streets 226, such that portions of the substrate 224 that are registered with the plurality of recesses or streets 226 are removed through an entire thickness of the substrate 224. The substrate 224 is thereby segregated into a plurality of discontinuous substrate portions 224-1, 224-2, and 224-3 that are registered with corresponding active layer portions 222-1, 222-2, and 222-3 to form a pixelated-LED chip 255 comprising a plurality of pixels 242a, 242b, and 242c. The underfill material 236 extends between each pixel of the plurality of pixels 242a, 242b, and 242c and is configured as a light segregation element, or a pixel segregation element, that reduces transmission of emissions from one pixel to another. In some embodiments, the underfill material 236 extends entirely between the plurality of substrate portions 224-1, 224-2, and 224-3 and the submount 230 such that the pixelated-LED chip 255 is devoid of an air gap between the plurality of substrate portions 224-1, 224-2, and 224-3 and the submount 230. Each of the substrate portions 224-1, 224-2, and 224-3 includes a light injection surface 244 adjacent a corresponding active layer portion 222-1, 222-2, and 222-3 and a light extraction surface 246 that generally opposes the light injection surface 244. The light injection surface 244 is arranged between the active layer 222 and the light extraction surface 246. Each active layer portion 222-1, 222-2, and 222-3 is configured to illuminate a different substrate portion 224-1, 224-2, and 224-3, and to transmit light through the light extraction surface 246. The cut lines or regions 240 may additionally form a plurality of light extraction surface recesses 248 that intersect and serve to define and segregate the protruding features 238. More particularly, bevel cutting may be performed to yield a plurality of inclined lateral faces 250 of the light extraction surface recesses 248. In certain embodiments, each inclined lateral face 250 of the plurality of inclined lateral faces 250 comprises an angle of inclination from vertical in a range of from about fifteen degrees to about forty-five degrees, or in a subrange of from about twenty degrees to about forty degrees, or in a subrange of from about twenty-five degrees to about thirty-five degrees, or in an amount of about thirty degrees. When an angle of inclination from vertical of about thirty degrees is used, and opposing faces of a protruding feature are formed by two bevel cuts of the same magnitude, a protruding feature may include an angle of about sixty degrees between the opposing faces. With further reference to FIG. 15H, a lower boundary of each light extraction surface recess 248 is radiused, reflecting the fact that a rotary saw blade useable to form each light extraction surface recess 248 has a non-zero thickness. The dashed lines shown below each light extraction surface recess 248 represent imaginary projections of the plurality of inclined lateral faces 250.

In FIG. 15I, the pixelated-LED chip 255 includes at least one lumiphoric material 252 (also referred to herein as a lumiphor). In particular, the lumiphoric material 252 is arranged on the light extraction surface 246 of each of the plurality of pixels 242a, 242b, and 242c. The lumiphoric material 252 may include one or more of a phosphor, a scintillator, a lumiphoric ink, a quantum dot material, a day glow tape, or the like. In certain embodiments, the lumiphoric material 252 may be in the form of one or more phosphors and/or quantum dots arranged in a binder such as silicone or glass, arranged in the form of a single crystalline plate or layer, a polycrystalline plate or layer, and/or a sintered plate. In certain embodiments, a lumiphoric material such as a phosphor may be spin coated or sprayed on a surface of the plurality of pixels 242a, 242b, and 242c. In certain embodiments, the lumiphoric material 252 may be located on each of the plurality of discontinuous substrate portions 224-1, 224-2, and 224-3, on the LED structure 220, and/or on the submount 230 of the plurality of pixels 242a, 242b, and 242c. In some embodiments, the lumiphoric material 252 is continuous on the plurality of discontinuous substrate portions 224-1, 224-2, and 224-3 of the plurality of pixels 242a, 242b, and 242c. In general, the plurality of active layer portions 222-1, 222-2, and 222-3 may generate light having a first peak wavelength. At least one lumiphor receiving at least a portion of the light generated by the plurality of active layer portions 222-1, 222-2, and 222-3 may re-emit light having a second peak wavelength that is different from the first peak wavelength. A solid state light source and one or more lumiphoric materials may be selected such that their combined output results in light with one or more desired characteristics such as color, color point, intensity, etc. In certain embodiments, aggregate emissions may be arranged to provide cool white, neutral white, or warm white light, such as within a color temperature range of from 2500K to 10,000K. In certain embodiments, a lumiphoric material comprises one or more materials including cyan, green, amber, yellow, orange, and/or red peak emission wavelengths. In certain embodiments, lumiphoric materials may be added to one or more emitting surfaces (e.g., top surface and one or more edge surfaces) by methods such as spray coating, dipping, liquid dispensation, powder coating, inkjet printing, or the like. In certain embodiments, lumiphoric material may be dispersed in an encapsulant, adhesive, or other binding medium. In certain embodiments, a scattering material may be included in the lumiphoric material 252. By way of example, the lumiphoric material 252 may include phosphor particles and scattering particles such as fused silica, fumed silica, or $TiO_2$ particles in the same silicone binder. In other embodiments the scattering material may comprise a layer of fused silica, fumed silica, or $TiO_2$ particles in a silicone binder deposited sequentially on the lumiphoric material 252.

The lumiphoric material 252 may comprise a material with a lower durometer value on a Shore hardness scale than the underfill material 236. In some embodiments, the lumiphoric material 252 and the underfill material 236 comprise silicone and the silicone of the lumiphoric material 252 has a lower durometer value on a Shore hardness scale than the silicone of the underfill material 236. As previously described, the underfill material 236 may comprise a silicone with a Shore D hardness durometer value of at least 40. In further embodiments, the underfill material 236 may comprise a silicone with a Shore D hardness durometer value in a range from about 40 to about 100 or in a range from about 60 to about 80. In that regard, the lumiphoric material 252 comprises silicone with a Shore D hardness durometer value of less than 40 in some embodiments. In some embodiments, the underfill material 236 between each pixel of the plurality of pixels 242a, 242b, and 242c and registered with the plurality of recesses or streets 226 may be omitted. Accordingly, an open space or an unfilled void of air may be provided between each pixel of the plurality of pixels 242a, 242b, and 242c to form a light segregation element, or a pixel segregation element. The underfill material 236 may be provided between the plurality of anodes 228 and cathodes 229.

In some embodiments, the submount 230 of FIGS. 15D-15I may comprise a temporary carrier. Accordingly, the plurality of discontinuous substrate portions 224-1, 224-2, and 224-3, the underfill material 236, the anode-cathode pairs 228, 229, and the lumiphoric material 252 are separated or removed from the mounting surface (231 of FIG. 15D).

In some embodiments, the omnidirectional character of lumiphoric material emissions may render it difficult to prevent emissions of one pixel from significantly overlapping emissions of another pixel. In that regard, FIG. 16A illustrates a cross-sectional view of a pixelated-LED chip 265 that is similar to the pixelated-LED chip 255 FIG. 15I. In FIG. 16A, a plurality of light segregation elements 266 are configured in the lumiphoric material 252 and registered with the portions of the underfill material 236 that are between the plurality of pixels 242a, 242b, and 242c. Light segregation elements 266 affect TIR between the plurality of pixels 242a, 242b, and 242c to reduce emissions of one pixel from overlapping or bleeding into an adjacent pixel. In some embodiments, the light segregation elements 266 are voids where portions of the lumiphoric material 252 have been removed. In some embodiments, the light segregation elements 266 are cuts in the lumiphoric material. For example, a rotary saw with a narrow saw blade may be passed across portions of the lumiphoric material 252 to cut and remove portions of the lumiphoric material 252 to form the light segregation elements 266. The size (i.e., width) of the saw blade may be selected to be less than the spacing between adjacent pixels of the plurality of pixels 242a, 242b, and 242c. For example, if the spacing between adjacent pixels is about 20 μm to 25 μm, then a 15 μm or a 10 μm saw blade may be used. In some embodiments, the size of the light segregation elements 266 may be narrower than the saw blade selected because the lumiphoric material 252 may relax after cutting. In some embodiments, the light segregation elements 266 may extend partially through, or partially segment the lumiphoric material 252; however, the lumiphoric material 252 is continuous across the plurality of pixels 242a, 242b, and 242c. In other embodiments, the light segregation elements 266 may extend entirely through the lumiphoric material 252 to the underfill material 236. Depending on the shape of the saw blade as well as how much the lumiphoric material 252 relaxes after cutting, the light segregation elements 266 may have a variety of shapes. In some embodiments, the light segregation elements 266 embody unfilled voids. In some embodiments, the light segregation elements 266 may be filled with another material. For example, the light segregation elements 266 may be filled with a light-reflecting material such as $TiO_2$ suspended in silicone. In other embodiments, the light segregation elements 266 may be filled with an opaque material. In FIG. 16A, the light segregation elements 266 are tapered toward the underfill material 236. In other embodiments, the light segregation elements 266 may include a reverse taper, or straight (e.g., vertical) side walls with no taper. The light segregation elements 266 serve as an index of refraction transition (e.g., stepwise transition) with the lumiphoric material 252 and help redirect light emissions from one pixel that would otherwise reach an adjacent pixel. Accordingly, the light segregation elements 266 provide an increased contrast between the plurality of pixels 242a, 242b, and 242c. Increasing the depth of the light segregation elements 266 tends to lead to increased contrast; however, lumiphoric emissions may decrease as more lumiphoric material 252 is removed. In this regard, the depth of the light segregation elements 266 may be tuned for different applications, depending on desired brightness and contrast between pixels.

In some embodiments, the brightness and homogeneity between pixels may decrease after formation of the light segregation elements, such that inter-pixel boundaries become more visible. To address this issue, a second lumiphoric material may be applied over a first lumiphoric material in which light segregation elements are defined. For example, FIG. 16B illustrates a cross-sectional view of a pixelated-LED chip 267 that is similar to the pixelated-LED chip 265 of FIG. 16A. In FIG. 16B, a plurality of light segregation elements 266 are provided in the lumiphoric material 252 (i.e., embodying a first lumiphoric material 252) and between pixels 242a, 242b, and 242c as previously described. A second lumiphoric material 268 is applied or deposited over the first lumiphoric material 252 after formation of the light segregation elements 266 therein. The second lumiphoric material 268 may comprise the same or different composition, thickness, and/or concentration as the first lumiphoric material 252. The second lumiphoric material 268 may be deposited in any manner as previously provided in connection with FIG. 15I. In some embodiments, the first lumiphoric material 252 is applied with a composition, thickness, and/or concentration different than would typically be required for a target color and brightness in a particular application, but the target color and brightness may be achieved by the combination of sequentially applied first and second lumiphoric materials. The resulting pixelated-LED chip 267 may have improved contrast between pixels with improved pixel homogeneity. Accordingly, the composition, thickness, and/or concentrations of the first lumiphoric material 252 and the second lumiphoric material 268, as well as dimensions of the light segregation elements 266 may be adjusted or tuned to achieve desired pixel brightness and contrast for different applications.

In some embodiments, a pixelated-LED chip may be formed in a similar manner as described in FIGS. 15A-15I, but with the cut lines or regions 240 of FIG. 15H omitted. The cut lines or regions 240' of FIG. 15H may remain to provide a street-aligned cut. Accordingly, substrate portions of the pixelated-LED chip do not have protruding features and light extraction surface recesses as previously described.

Figure 17A:
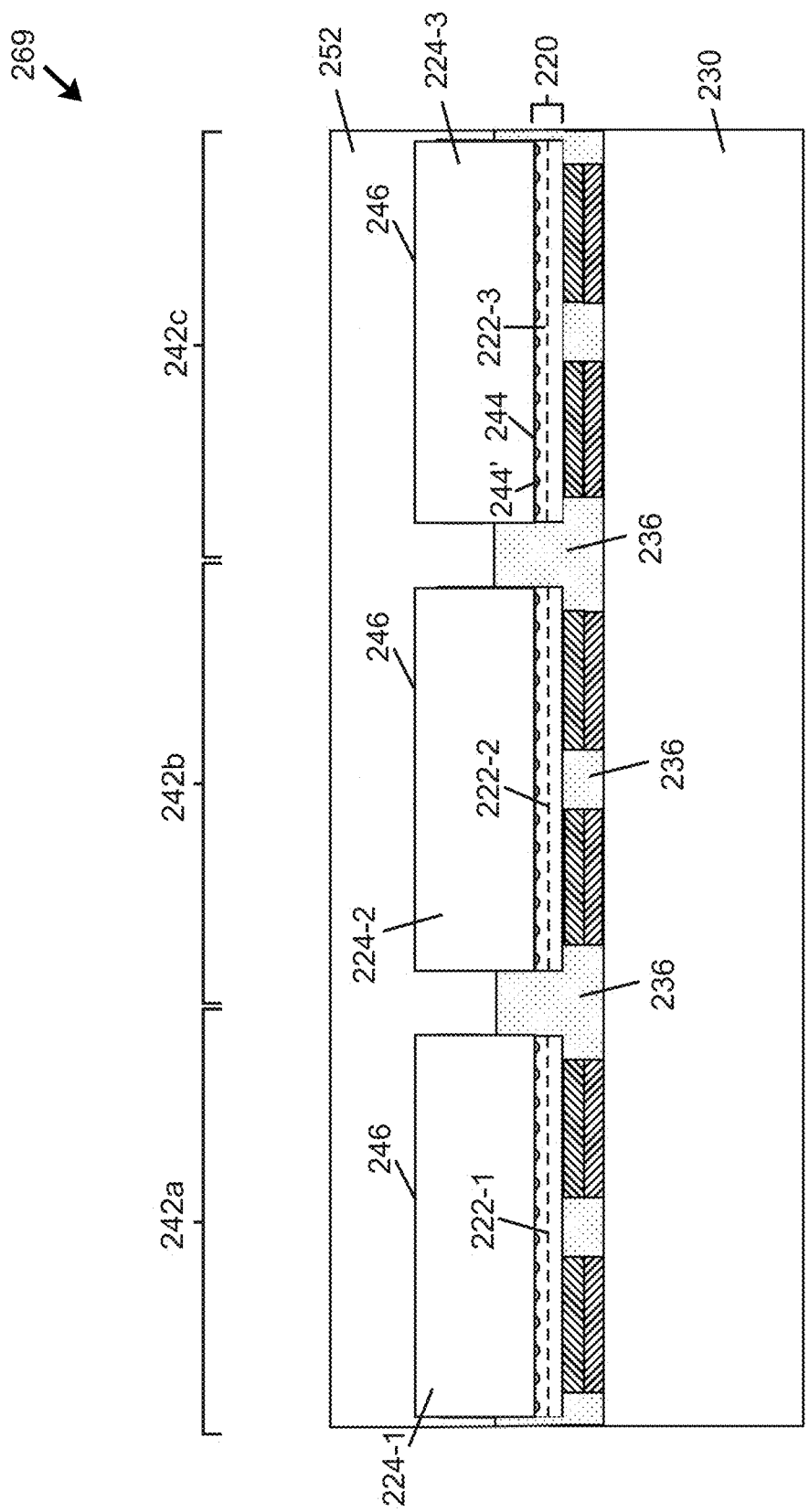
FIG. 17A is a schematic cross-sectional view of a pixelated-LED chip according to some embodiments.

FIG. 17A illustrates a cross-sectional view of a pixelated-LED chip 269 with a plurality of discontinuous substrate portions 224-1, 224-2, and 224-3 that do not have protruding features and light extraction surface recesses as previously described. For example, the light extraction surface 246 of each substrate portion 224-1, 224-2, and 224-3 may be planar. In some embodiments, the plurality of substrate portions 224-1, 224-2, and 224-3 comprise sapphire. In further embodiments, the light injection surface 244 of the plurality of substrate portions 224-1, 224-2, and 224-3 may comprise a patterned surface with multiple recessed and/or raised features 244' that improves light injection from the LED structure 220 into the plurality of substrate portions 224-1, 224-2, and 224-3. In other embodiments, the plurality of substrate portions 224-1, 224-2, and 224-3 may comprise silicon carbide, silicon, or a Group III-nitride material. The pixelated-LED chip 269 may include a plurality of pixels 242a, 242b, and 242c; an LED structure 220 including a plurality of active layer portions 222-1, 222-2, and 222-3; a submount 230; and at least one lumiphoric material 252 as previously described.

Figure 17B:
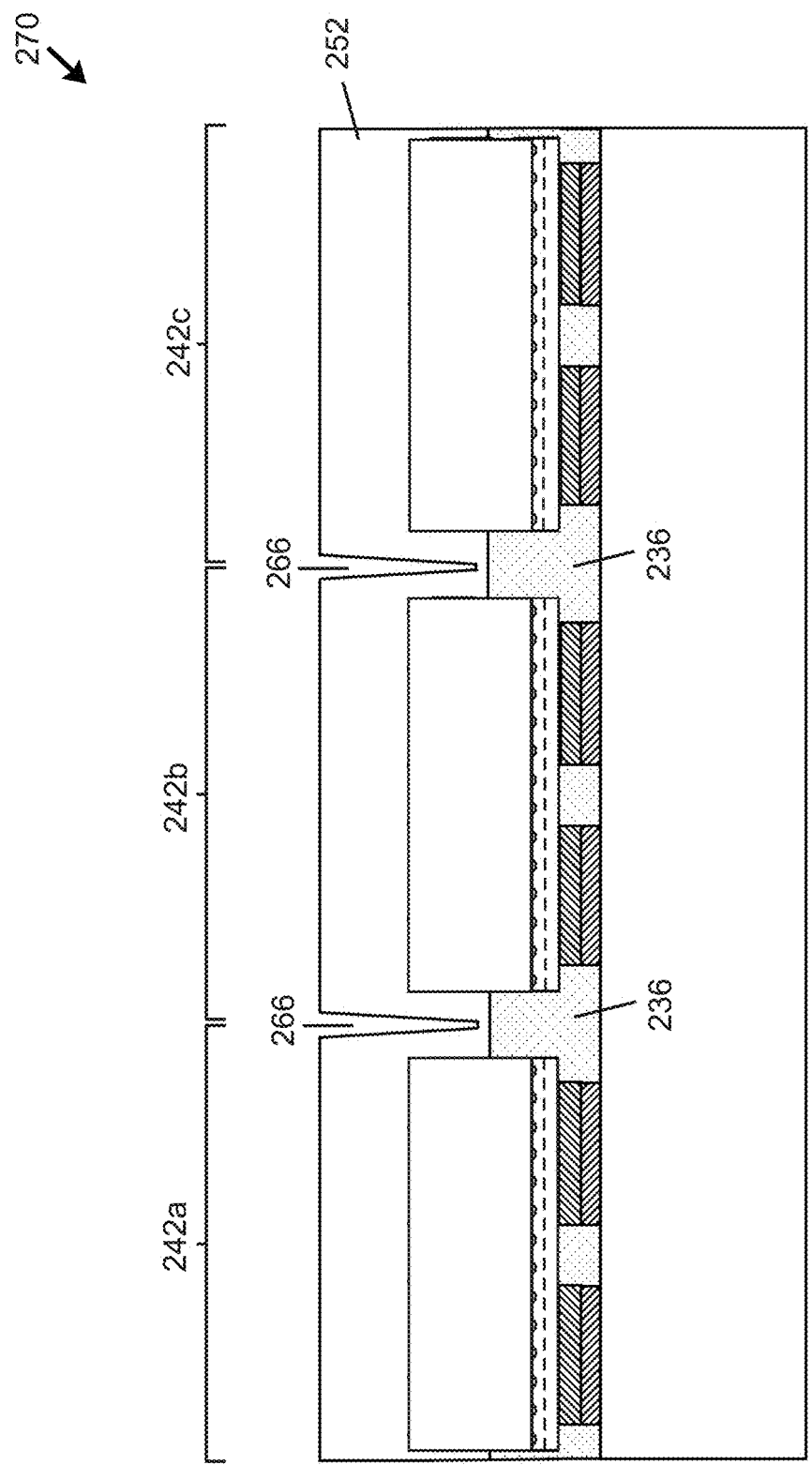
FIG. 17B is a schematic cross-sectional view of a pixelated-LED chip according to some embodiments including light segregation elements in a lumiphoric material.

FIG. 17B illustrates a cross-sectional view of a pixelated-LED chip 270 that is similar to the pixelated-LED chip 269 of FIG. 17A. In FIG. 17B, a plurality of light segregation elements 266 are configured in the lumiphoric material 252 and registered with portions of the underfill material 236 that are between the plurality of pixels 242a, 242b, and 242c. The light segregation elements 266 may be configured in a similar manner as described in connection with FIG. 16A.

Figure 17C:
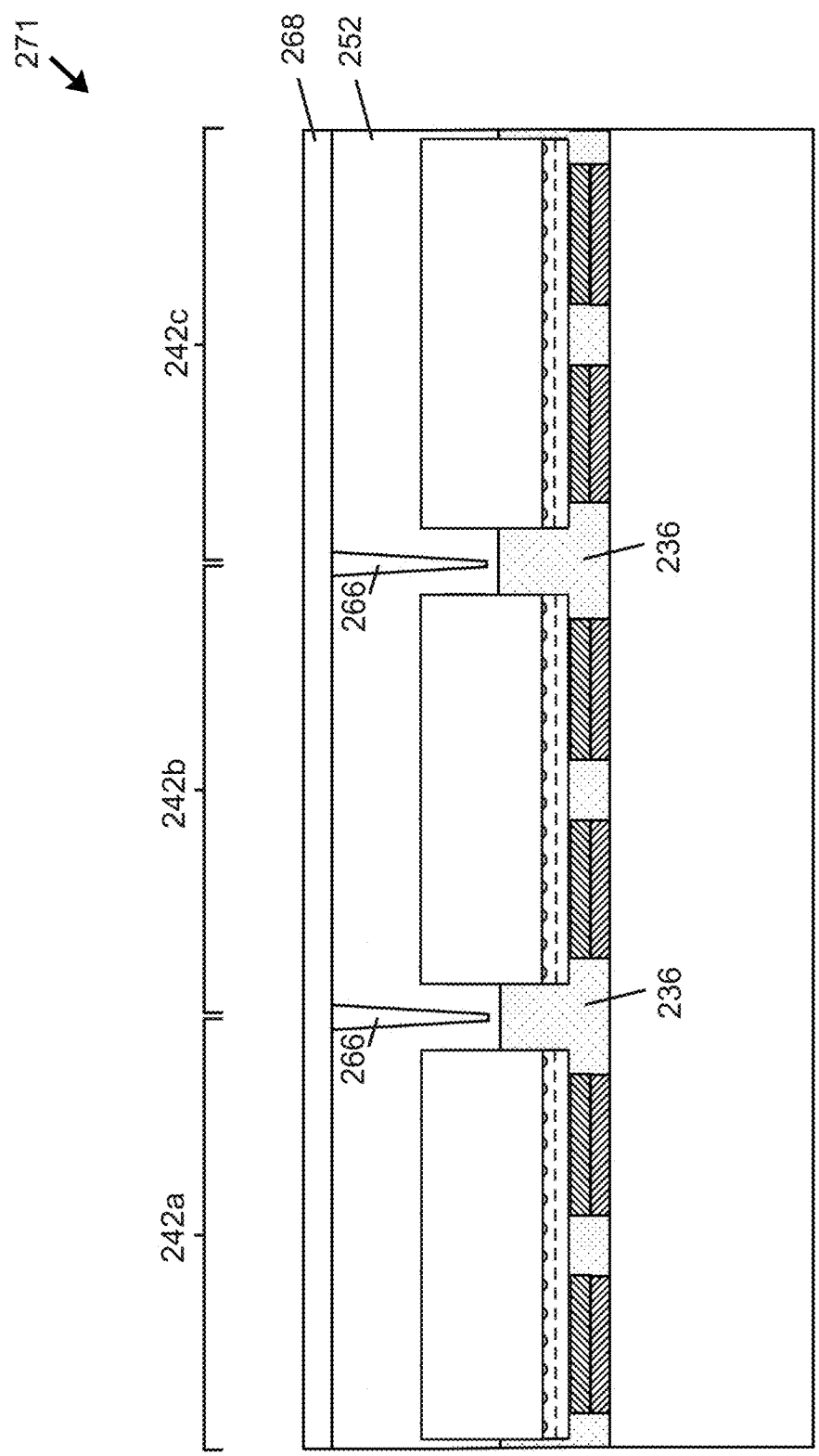
FIG. 17C is a schematic cross-sectional view of a pixelated-LED chip according to some embodiments including a second lumiphoric material over a lumiphoric material with light segregation elements.

FIG. 17C illustrates a cross-sectional view of a pixelated-LED chip 271 that is similar to the pixelated-LED chip 270 of FIG. 17B. In FIG. 17C, the plurality of light segregation elements 266 are provided in the lumiphoric material 252 (i.e., embodying a first lumiphoric material 252) and between the plurality of pixels 242a, 242b, and 242c as previously described. A second lumiphoric material 268 is applied or deposited over the first lumiphoric material 252 after formation of the light segregation elements 266 therein. The second lumiphoric material 268 may be configured in a similar manner as described in connection with FIG. 16B.

In some embodiments of a pixelated-LED chip, a substrate on which an LED structure is formed may be completely removed. The pixelated-LED chip may be formed in a similar manner as described in FIGS. 15A-15I. However, the substrate 224 would be completely removed in FIG. 15G, and FIG. 15H may not be necessary.

Figure 17D:
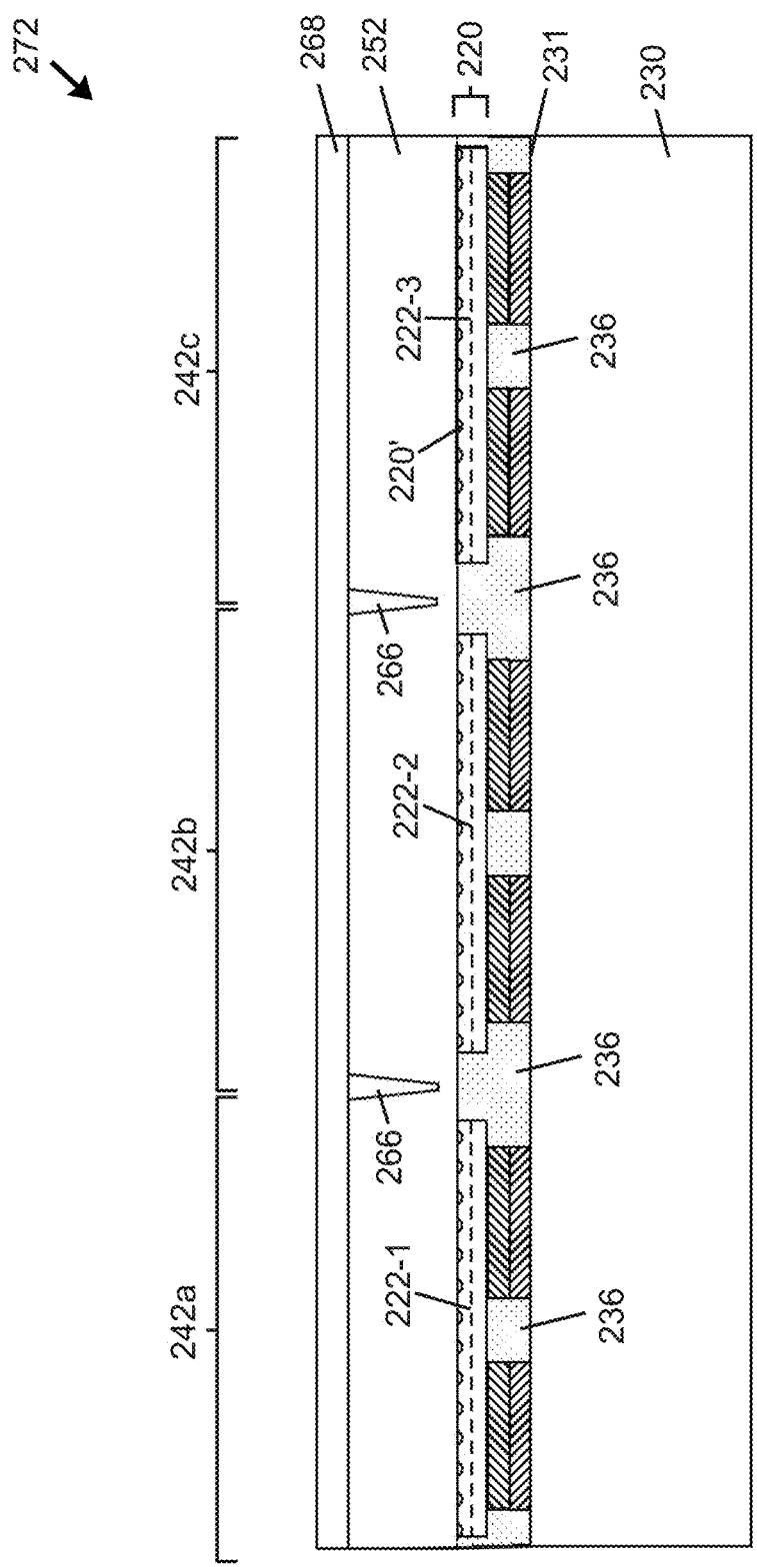
FIG. 17D is a schematic cross-sectional view of a pixelated-LED chip according to some embodiments where the substrate of previous embodiments is completely removed.
Figure 17E:
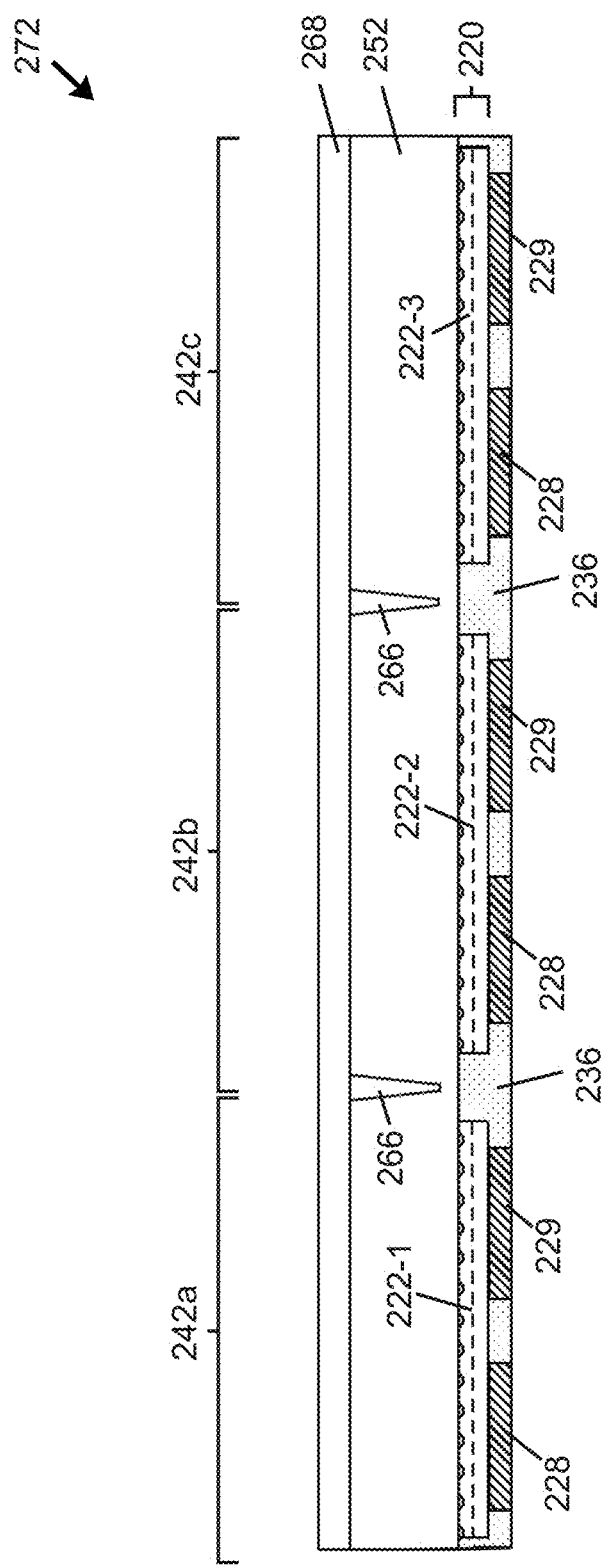
FIG. 17E is a schematic cross-sectional view of a pixelated-LED chip according to some embodiments.

In that regard, FIG. 17D illustrates a cross-sectional view of a pixelated-LED chip 272 where the substrate 224 of previous embodiments is completely removed. Accordingly, the pixelated-LED chip 272 includes an LED structure 220 including a plurality of active layer portions 222-1, 222-2, and 222-3 that are supported by at least one of the underfill material 236 and the first lumiphoric material 252. In some embodiments, the underfill material 236 comprises a material with a high durometer on a Shore hardness scale (e.g., a silicone material with a Shore D hardness scale durometer value of at least 40). Accordingly, the underfill material 236 may provide mechanical support of the plurality of active layer portions 222-1, 222-2, and 222-3. In embodiments where the substrate that was removed included a patterned light injection surface, such as patterned sapphire, the pattern may transfer to the LED structure even after the growth substrate is removed. In other embodiments, the LED structure may be patterned, shaped, textured, or roughened after the substrate removal. Accordingly, the LED structure 220 may comprise a patterned, shaped, textured, or roughened surface 220' adjacent the first lumiphoric material 252. In embodiments where the submount 230 is temporary, the plurality of active layer portions 222-1, 222-2, and 222-3 and the underfill material 236 are separated or removed from the mounting surface 231, as illustrated in FIG. 17E. Accordingly, the plurality of active layer portions 222-1, 222-2, and 222-3 form a plurality of pixels 242a, 242b, and 242c. The underfill material 236 extends between each active layer portion of the plurality of active layer portions 222-1, 222-2, and 222-3 and between each anode 228 and cathode 229.

FIG. 18 is an upper perspective view photograph of a portion of a pixelated-LED light emitting device 273 according to some embodiments, showing a plurality of pixels A1, A2, B1, and B2. Alphanumeric column labels A and B appear at top between vertical dashed lines, and Arabic numerals 1 and 2 appear at left between horizontal dashed lines to provide column and row references for individual pixels. The vertical and horizontal dashed lines correspond to street-aligned cut lines or regions 274-1 to 274-6 that define lateral borders between the pixels A1, A2, B1, and B2. Dashed lines extending outward beyond the image represent extensions of boundaries between pixels. The vertical and horizontal solid lines correspond to cut lines or regions 276-1 to 276-6 that are not aligned with streets between pixels. The street-aligned cut lines 274-1 to 274-6 are configured similar to the previously-described cut lines 240' of FIG. 15H. Accordingly, an underfill material 278 is configured along the lateral borders of each pixel for improved contrast. The width of the street-aligned cut lines 274-1 to 274-6 forms at least a portion of the spacing between pixels. In certain embodiments, each pixel of the pixelated-LED light emitting device 273 is spaced from adjacent pixels by a distance no greater than about 60 μm, or about 50 μm, or about 40 μm, or about 30 μm, or about 20 μm, or about 10 μm, or in a range of from about 10 μm to about 30 μm, or in a range of from about 10 μm to about 20 μm. Such dimensional ranges provide a desirably small pixel pitch. The spacing between pixels also relates to the width of the underfill material 278 that is configured between adjacent pixels. For example, in some embodiments, a 25 microns spacing between pixels allows more of the underfill material 278 (about 25 μm width) to be configured between adjacent pixels than a pixel spacing of 20 μm. Accordingly, more light may be reflected and re-directed out of each pixel without leaking into an adjacent pixel by the underfill material 278 with 25 μm spacing than the underfill material 278 with 20 μm spacing, thereby providing improved contrast and pixel brightness. Notably, for a constant spacing between street-aligned cut lines 274-1 to 274-6, a pixel spacing of 25 μm reduces the area of each pixel; however, the increase in the underfill material 278 may still provide brighter pixels with improved contrast.

The cut lines 276-1 to 276-6 that are not aligned with streets are configured similar to the previously-described cut lines 240 of FIG. 15H. Accordingly, the cut lines 276-1 to 276-6 form a plurality of light extraction surface recesses 280 that intersect and segregate a plurality of protruding features 281. For example, in pixel A1, vertical cut lines 276-1 and 276-2 and horizontal cut lines 276-5 and 276-6 form two vertical and two horizontal light extraction surface recesses 280 that intersect and define nine protruding features 281. As described above, the shape of a cutting tool as well as the number and direction of cut lines defines the shape of the protruding features 282. In FIG. 18, the cut lines are evenly spaced vertical lines that intersect with evenly spaced and orthogonal horizontal lines, and are formed with a beveled cutting tool. Accordingly, the protruding features 281 comprise square-base pyramidal shapes. In some embodiments, the pyramidal shapes comprise truncated pyramidal shapes, wherein such truncation may be vertical, lateral, or both vertical and lateral in character. Other shapes are possible, including triangle-shaped features, extruded triangle-shaped features and cuboid-shaped features. In other embodiments, the cut lines may comprise intersecting diagonal lines to form other shapes, such as diamond-shaped features or other polyhedral features.

In certain embodiments, one or more pixelated-LED chips may include different pixels with protruding features of the same or different sizes, shapes, numbers, and/or distributions. Protruding features of different sizes may include differences in at least one of height, width, length, or angularity. Protruding features of different shapes may include differences in symmetry (or lack thereof), angularity, inter-feature boundary curvature, or the like. Protruding features may be provided in different numbers in association with different pixels. Differences in pixel distribution may include relative or absolute placement of pixels relative to a pixel area.

FIG. 19 is a schematic side cross-sectional view of at least a portion of a pixelated-LED chip 282 according to some embodiments. The pixelated-LED chip 282 includes an LED structure 220 that includes a plurality of active layer portions 222-1, 222-2, and 222-3 as previously described. The pixelated-LED chip 282 also includes a substrate 284 with a plurality of substrate portions 284-1, 284-2, and 284-3 as previously described. Each of the substrate portions 284-1, 284-2, and 284-3 includes a plurality of protruding features 286 and a plurality of light extraction surface recesses 288 as previously described. The pixelated-LED chip 282 includes a plurality of pixels 290a, 290b, and 290c and it should be understood that while three pixels are shown, any number of pixels may be provided. In FIG. 19, the plurality of protruding features 286 each have a same angle A, where the angle A is defined as the angle between two opposing faces 292, 294 of each protruding feature 286. In some embodiments, the angle A is related to how the plurality of protruding features 286 are formed. For example, a rotary saw blade with a thirty degree bevel may define a protruding feature with an angle A of about sixty degrees. Accordingly, in some embodiments, each pixel 290a, 290b, and 290c comprises at least three protruding features 286 and each protruding feature 286 comprises an angle A of about sixty degrees.

Figure 20:
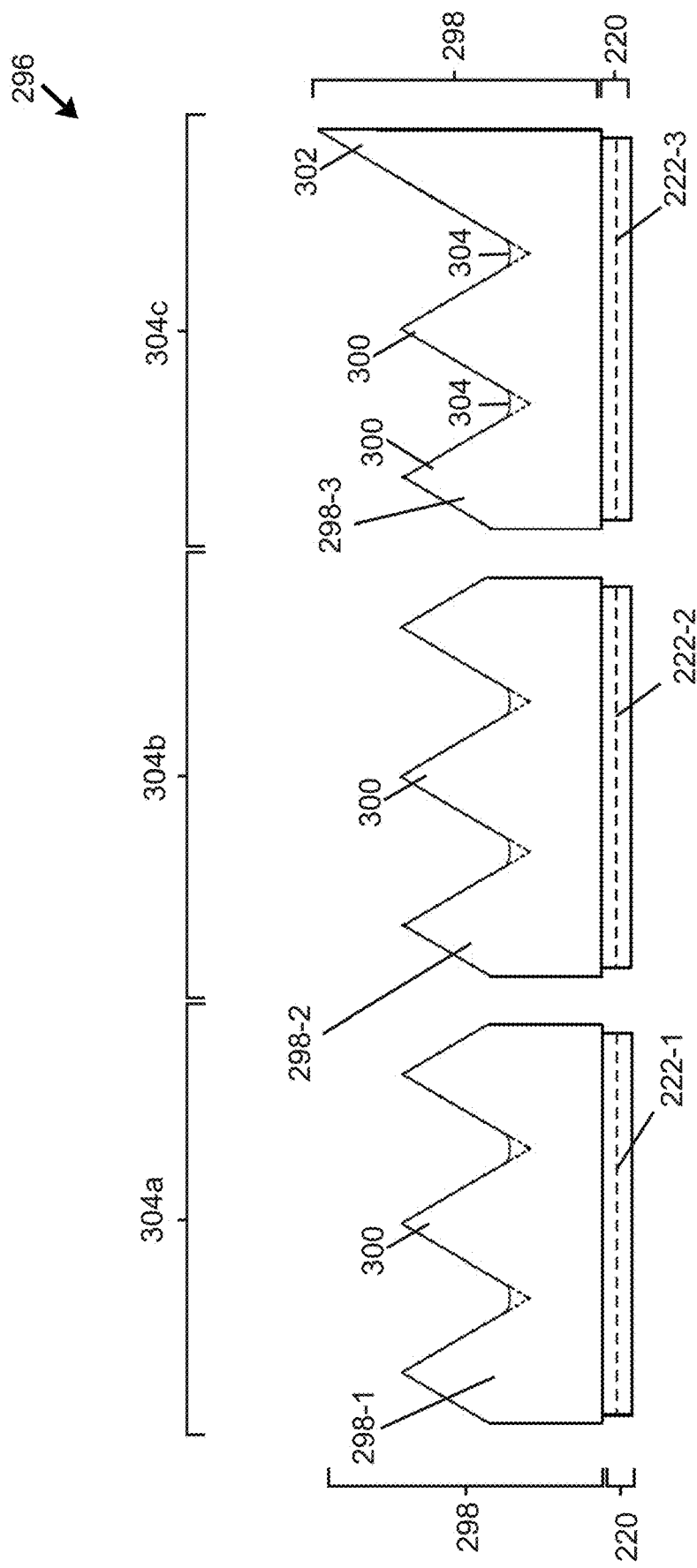
FIG. 20 is a schematic side cross-sectional view of at least a portion of a pixelated-LED chip according to some embodiments including a plurality of protruding features having different sizes and shapes.

FIG. 20 is a schematic side cross-sectional view of at least a portion of a pixelated-LED chip 296 according to some embodiments. The pixelated-LED chip 296 includes an LED structure 220 that includes a plurality of active layer portions 222-1, 222-2, and 222-3 as previously described. The pixelated-LED chip 296 also includes a substrate 298 with a plurality of substrate portions 298-1, 298-2, and 298-3, and at least one of the substrate portions 298-1, 298-2, and 298-3 includes a plurality of protruding features 300, 302 and a plurality of light extraction surface recesses 304. The pixelated-LED chip 296 includes a plurality of pixels 304a, 304b, and 304c, and it should be understood that while three pixels are shown, any number of pixels may be provided. In FIG. 20, the plurality of protruding features 300, 302 are shown as having different sizes (e.g., heights) and different shapes, with the laterally outermost (or edge-adjacent) protruding feature 302 of pixel 304c being larger than non-edge-adjacent protruding features 300. Such a configuration may increase light extraction proximate to the edges and thereby at least partially ameliorate perceived non-uniformity of light output intensity (with edge or corner pixels generally appearing dimmer than interior pixels). In some embodiments, pixels 304a and 304b may also include at least one protruding feature having a differing size or shape than other protruding features within each pixel.

Figure 21:
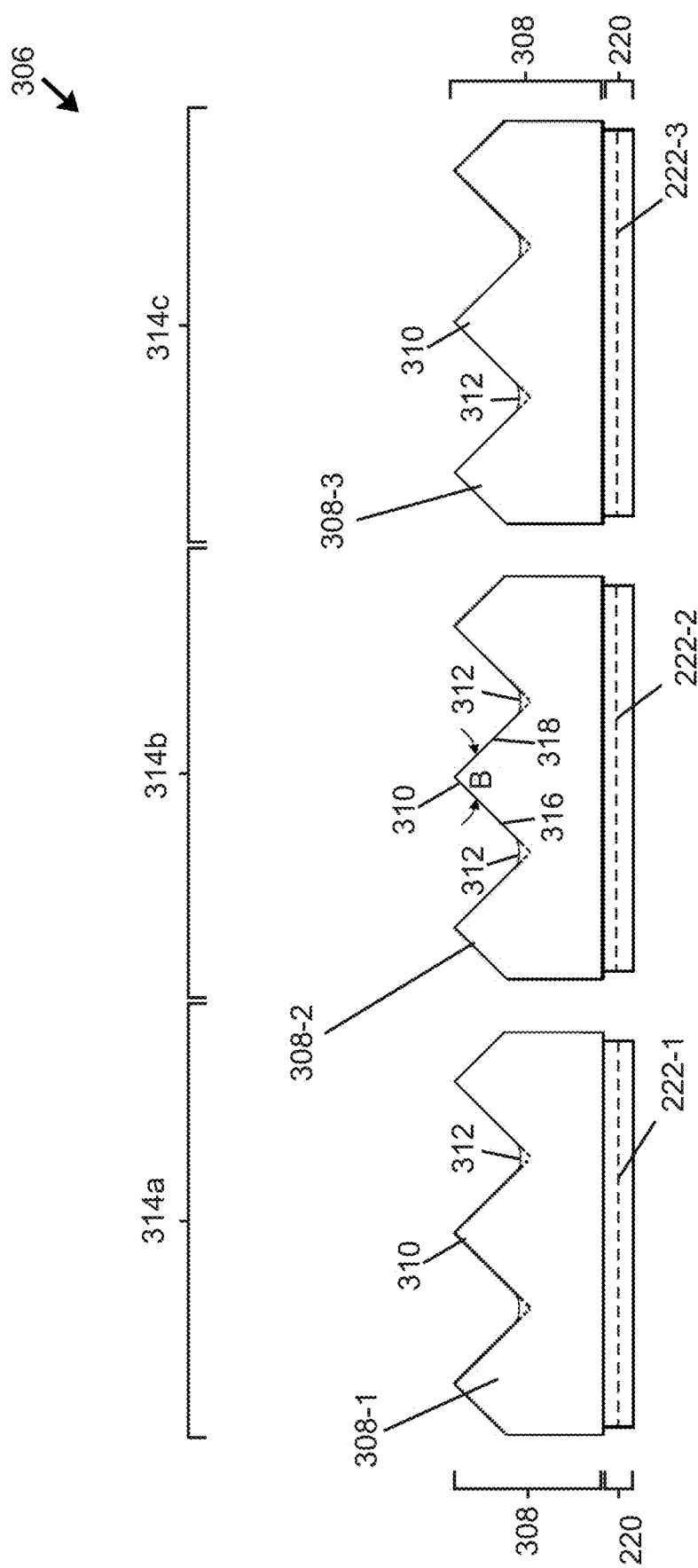
FIG. 21 is a schematic side cross-sectional view of at least a portion of a pixelated-LED chip according to some embodiments including a plurality of protruding features with a same angle B defined as the angle between two opposing faces of a protruding feature, where the angle B is wider than the angle A of FIG. 19.

FIG. 21 is a schematic side cross-sectional view of at least a portion of a pixelated-LED chip 306 according to some embodiments. The pixelated-LED chip 306 includes an LED structure 220 that includes a plurality of active layer portions 222-1, 222-2, and 222-3 as previously described. The pixelated-LED chip 306 also includes a substrate 308 with a plurality of substrate portions 308-1, 308-2, and 308-3, and each of the substrate portions 308-1, 308-2, and 308-3 includes a plurality of protruding features 310 and a plurality of light extraction surface recesses 312. The pixelated-LED chip 306 includes a plurality of pixels 314a, 314b, and 314c. In FIG. 21, the plurality of protruding features 310 each have a same angle B, where the angle B is defined as the angle between two opposing faces 316, 318 of each protruding feature 310. In a similar manner to angle A of FIG. 19, the angle B in FIG. 21 is related to how the plurality of protruding features 310 are formed. For example, a rotary saw blade with a forty-five degree bevel may define a protruding feature with an angle B of about ninety degrees. Accordingly, in some embodiments, each pixel 314a, 314b, and 314c comprises at least three protruding features 310, and each protruding feature 310 comprises an angle B of about ninety degrees. Notably, angle B of FIG. 21 is larger than the angle A of FIG. 19, such that opposing faces 316, 318 of each protruding feature 310 are inclined closer to horizontal than the opposing faces 292, 294 shown in FIG. 19. In order to maintain at least three protruding features 310 per pixel, the height of the plurality of substrate portions 308-1, 308-2, and 308-3 in FIG. 21 is reduced in comparison to the height of the protruding features 286 of FIG. 19. In some embodiments, the opposing faces 316, 318 of a larger angle protruding feature 310 are inclined closer to horizontal than the opposing faces 292, 294 shown in FIG. 19. Accordingly, more light may exit the opposing faces 316, 318 of the protruding features 310 of a first pixel (e.g. 314a) without impinging on an adjacent pixel (e.g., 314b), such that inter-pixel contrast may increase.

Figure 22:
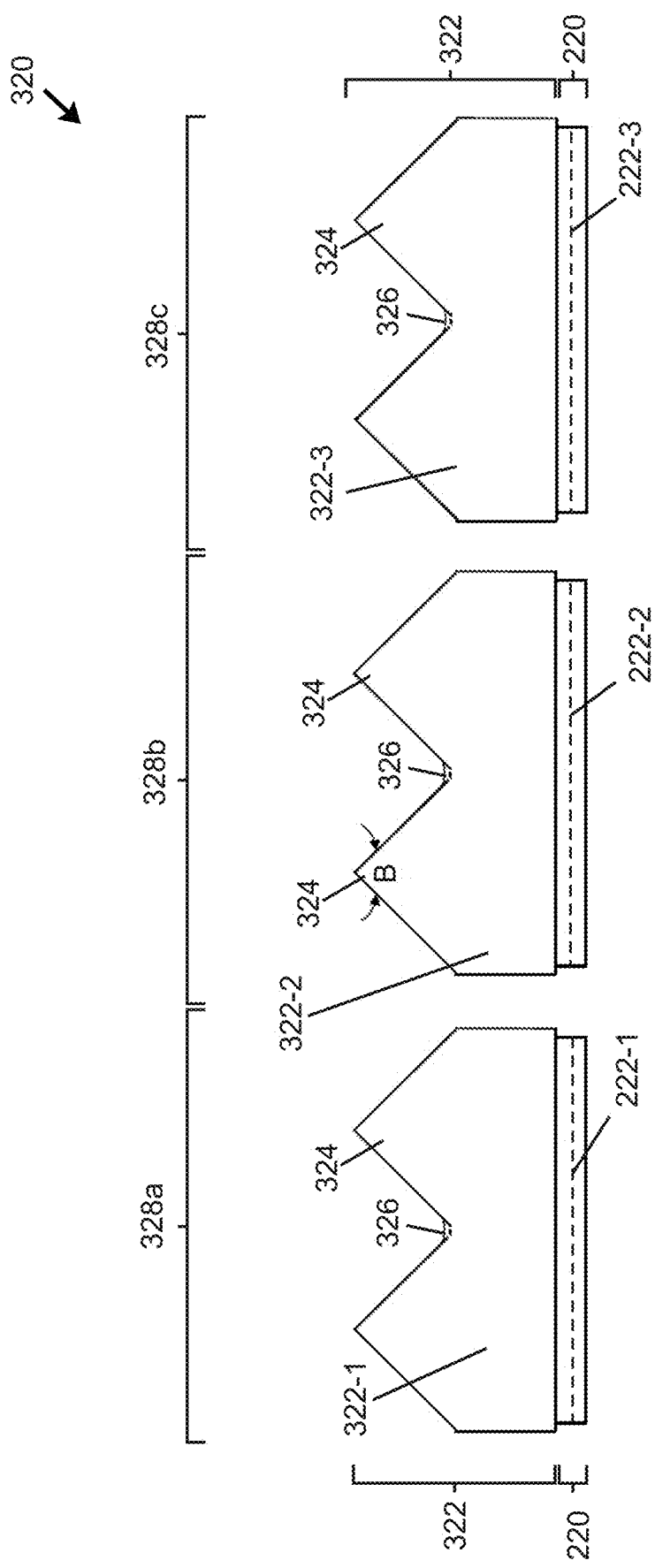
FIG. 22 is a schematic side cross-sectional view of at least a portion of a pixelated-LED chip according to some embodiments including two protruding features per pixel.

FIG. 22 is a schematic side cross-sectional view of at least a portion of a pixelated-LED chip 320 according to some embodiments. The pixelated-LED chip 320 includes an LED structure 220 that includes a plurality of active layer portions 222-1, 222-2, and 222-3 as previously described. The pixelated-LED chip 320 also includes a substrate 322 with a plurality of substrate portions 322-1, 322-2, and 322-3, and each of the substrate portions 322-1, 322-2, and 322-3 includes a plurality of protruding features 324 and a plurality of light extraction surface recesses 326. The pixelated-LED chip 320 includes a plurality of pixels 328a, 328b, and 328c. In FIG. 22, the plurality of protruding features 324 each have the same angle B as previously described in connection with FIG. 21, such as about ninety degrees in some embodiments. However, in FIG. 22, there are only two protruding features 324 per pixel; accordingly, the height of the plurality of substrate portions 322-1, 322-2, and 322-3 may be higher than the substrate portions 308-1, 308-2, and 308-3 of FIG. 21.

Figure 23:
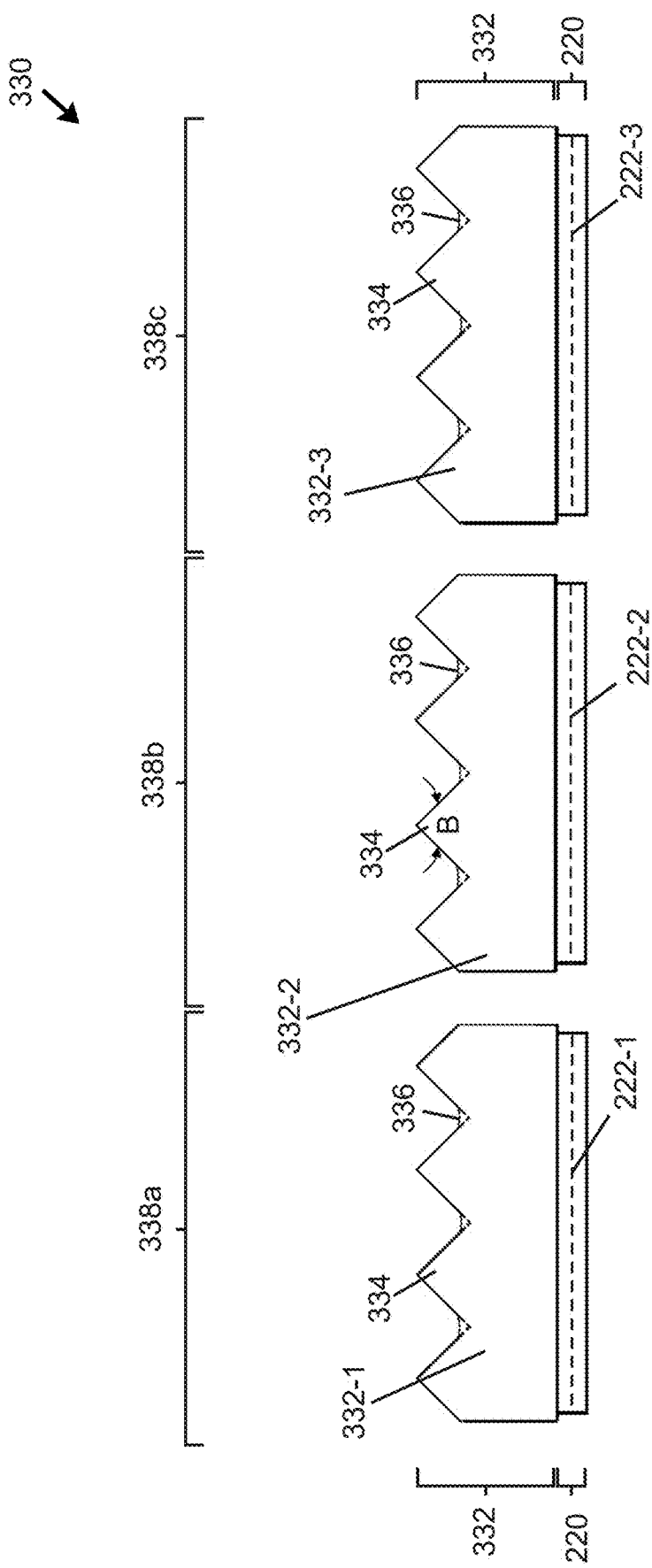
FIG. 23 is a schematic side cross-sectional view of at least a portion of a pixelated-LED chip according to some embodiments including four protruding features per pixel.

FIG. 23 is a schematic side cross-sectional view of at least a portion of a pixelated-LED chip 330 according to some embodiments. The pixelated-LED chip 330 includes an LED structure 220 that includes a plurality of active layer portions 222-1, 222-2, and 222-3 as previously described. The pixelated-LED chip 330 also includes a substrate 332 with a plurality of substrate portions 332-1, 332-2, and 332-3 and each of the substrate portions 332-1, 332-2, and 332-3 includes a plurality of protruding features 334 and a plurality of light extraction surface recesses 336. The pixelated-LED chip 330 includes a plurality of pixels 338a, 338b, and 338c. In FIG. 23, the plurality of protruding features 334 each have the same angle B as previously described for FIG. 22, such as about ninety degrees in some embodiments. It is understood that other angles are possible. However, in FIG. 23, there are four protruding features 334 per pixel; accordingly, the height of the plurality of substrate portions 332-1, 332-2, and 332-3 may be lower to accommodate the larger number of protruding features 334 for a comparably sized pixel. In some embodiments, a higher number of protruding features per pixel provides an increased number of angled surfaces for light to emit from the plurality of plurality of substrate portions 332-1, 332-2, and 332-3 without being lost due to internal reflection and absorption.

In some embodiments, a pixelated-LED chip includes one or more reflective layers between individual pixels for improved contrast. Depending on the shape and material of the substrate portions for each pixel, the reflective layer may re-direct and reflect light toward a desired emission direction that would otherwise impinge with adjacent pixels. In some embodiments, the reflective layer may be separate from the underfill material and both the reflective layer, and the underfill material may be located between pixels. For example, the reflective layer may be a thin layer on a lateral sidewall of a pixel with the underfill material occupying the remaining space between an adjacent pixel. In other embodiments, the reflective layer may be continuous between adjacent pixels.

Figure 24:
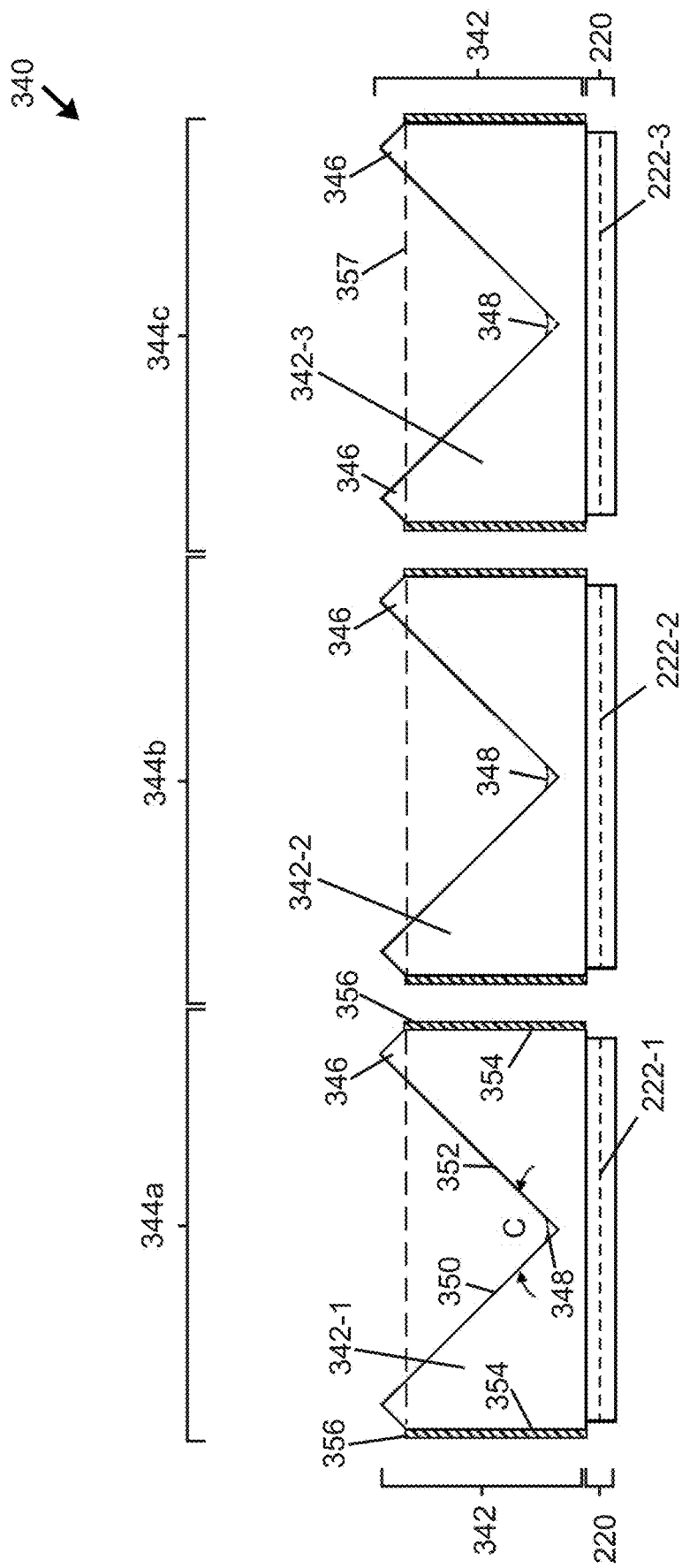
FIG. 24 is a schematic side cross-sectional view of at least a portion of a pixelated-LED chip according to some embodiments including one light extraction surface recess with an angle C defined as the angle between two opposing faces of a the light extraction surface recess.

In that regard, FIG. 24 is a schematic side cross-sectional view of at least a portion of a pixelated-LED chip 340 according to some embodiments. The pixelated-LED chip 340 includes an LED structure 220 that includes a plurality of active layer portions 222-1, 222-2, and 222-3 as previously described. The pixelated-LED chip 340 also includes a substrate 342 with a plurality of substrate portions 342-1, 342-2, and 342-3. Each substrate portion 342-1, 342-2, and 342-3 is registered with a separate pixel of a plurality of pixels 344a, 344b, and 344c. While three pixels are shown, it should be understood that any number of pixels may be provided. In some embodiments, the substrate portions 342-1, 342-2, and 342-3 may each include at least one protruding feature 346 or at least one light extraction surface recess 348. The pixelated-LED chip 340 of FIG. 24 is illustrated with a single light extraction surface recess 348 for each pixel. An angle C of the light extraction surface recess 348 is defined as the angle between two opposing faces 350, 352 of the light extraction surface recess 348. In some embodiments, the angle C is in a range of from about thirty degrees to about one-hundred and eighty degrees. In a particular example, the angle C is about ninety degrees. In some embodiments, a single light extraction surface recess 348 is configured near a center of a pixel and between pixel sidewalls 354. The two opposing faces 350, 352 extend upward toward the pixel sidewalls 354 such that the substrate 342 is thickest adjacent at least one pixel sidewall 354. This may increase the chance light from one pixel will impinge or bleed over laterally into an adjacent pixel. In some embodiments, the at least one pixel sidewall 354 includes a reflective layer 356 configured to re-direct and reflect at least some light, thereby preventing lateral emissions of one pixel from reaching an adjacent pixel. In some embodiments, the substrate portions 342-1, 342-2, and 342-3 may include a planar (e.g., horizontal) light emitting surface 357 with no protruding features or light extraction surface recesses as indicated by the horizontal dashed lines. The planar light emitting surface 357 may reflect a portion of light toward the pixel sidewall 354, and the reflective layer 356 may re-direct or reflect it away from an adjacent pixel. The reflective layer 356 may comprise at least one of a metal reflector, a dielectric reflector, and combinations thereof.

In some embodiments, a pixelated-LED chip includes a plurality of pixels and each pixel includes a plurality of protrusions that have different sizes (e.g., heights) and/or different shapes. In some embodiments, a pixel of a pixelated-LED chip includes a substrate portion with a plurality of protruding features comprising different angles. An angle of particular protruding feature is defined as the angle between two opposing faces of that protruding feature. Different angles may provide different benefits for light extraction and contrast. For example, a protruding feature with a smaller angle may provide improved light extraction to increase pixel brightness. However, the smaller angle may also provide a protrusion with a larger height that can more easily direct light towards or receive light from an adjacent pixel, thereby impacting contrast. A protruding feature with a larger angle and a smaller height provides increased contrast, but not as much brightness increase compared with the smaller angle protrusion. In some embodiments, a pixel includes a first protrusion comprising a first angle and a second protrusion comprising a second angle that is larger than the first angle. In further embodiments, the second protrusion is closer to a sidewall of the pixel than the first protrusion. In still further embodiments, the second angle exceeds the first angle by at least ten degrees, at least fifteen degrees, at least twenty degrees, at least thirty degrees, at least forty degrees, or at least sixty degrees. In still further embodiments, the first angle is about sixty degrees and the second angle is about ninety degrees.

Figure 25:
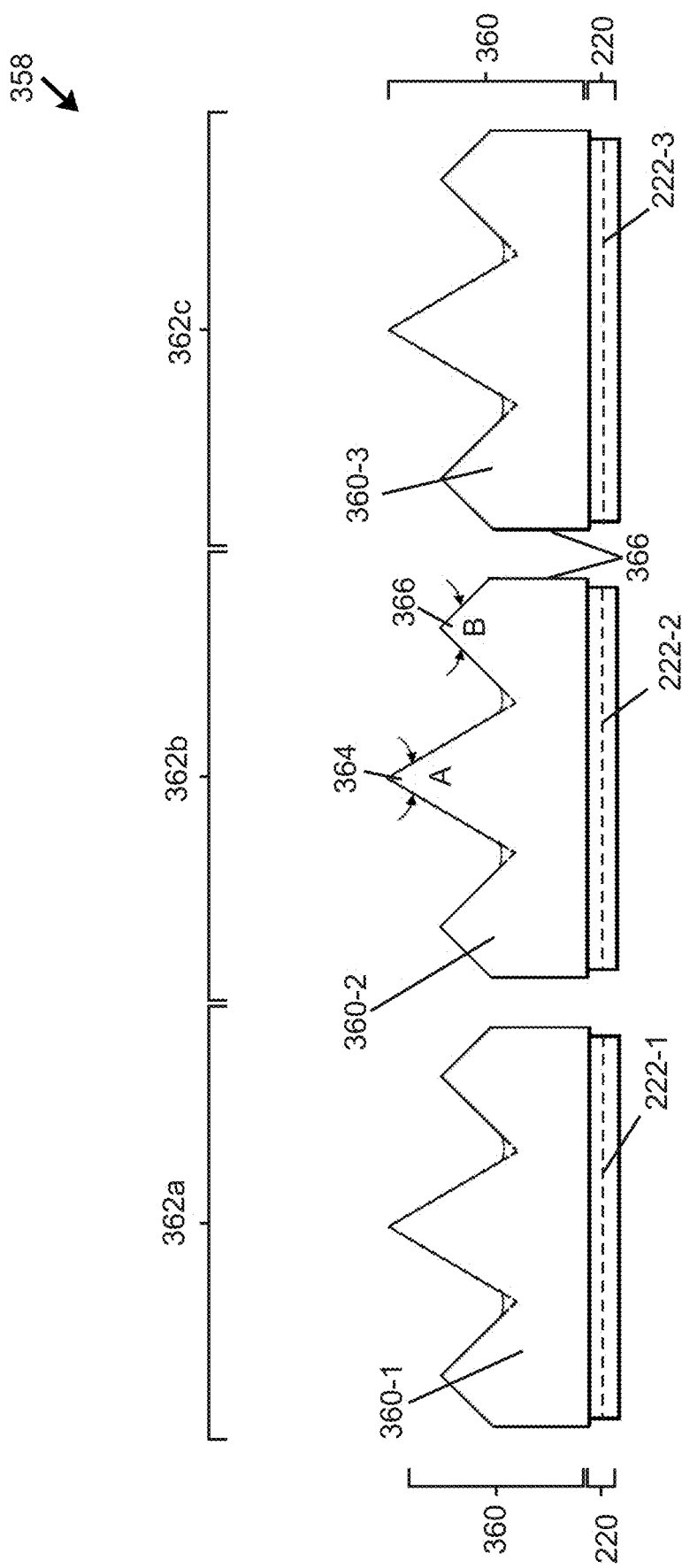
FIG. 25 is a schematic side cross-sectional view of at least a portion of a pixelated-LED chip according to some embodiments including a first protruding feature having an angle A and a second protruding feature having an angle B that is larger than the angle A.

In that regard, FIG. 25 is a schematic side cross-sectional view of at least a portion of a pixelated-LED chip 358 according to some embodiments. The pixelated-LED chip 358 includes an LED structure 220 that includes a plurality of active layer portions 222-1, 222-2, and 222-3 as previously described. The pixelated-LED chip 358 also includes a substrate 360 with a plurality of substrate portions 360-1, 360-2, and 360-3. Each substrate portion 360-1, 360-2, and 360-3 is registered with a separate pixel of a plurality of pixels 362a, 362b, and 362c. While three pixels are shown, it should be understood that any number of pixels may be provided. In some embodiments, at least one pixel of the plurality of pixels 362a, 362b, and 362c includes at least one first protruding feature 364 and at least one second protruding feature 366. The first protruding feature includes an angle A and the second protruding feature includes an angle B that is larger than the angle A. As illustrated in FIG. 25, the first protruding feature 364 comprises a larger height than the second protruding feature 366. In some embodiments, the second protruding feature 366 is closer to a sidewall 363 of one of the pixels than the first protruding feature 364. The second angle B may exceed the first angle A by at least ten degrees, at least ten degrees, at least fifteen degrees, at least twenty degrees, at least thirty degrees, at least forth degrees, or at least sixty degrees. In some embodiments, the first angle is about sixty degrees and the second angle is about ninety degrees.

In some embodiments, a pixelated-LED chip includes a substrate that comprises a plurality of light extraction surface recesses between a plurality of protrusions. The plurality of light extraction surface recesses includes a first light extraction surface recess and a second light extraction surface recess that comprises a different size or a different shape than the first light extraction surface recess. In some embodiments, the first light extraction surface recess extends deeper into the substrate than the second light extraction surface recess, such that different light extraction surface recesses have different depths. In some embodiments, the second light extraction surface recess has a wider bottom than the first light extraction surface recess.

Figure 26:
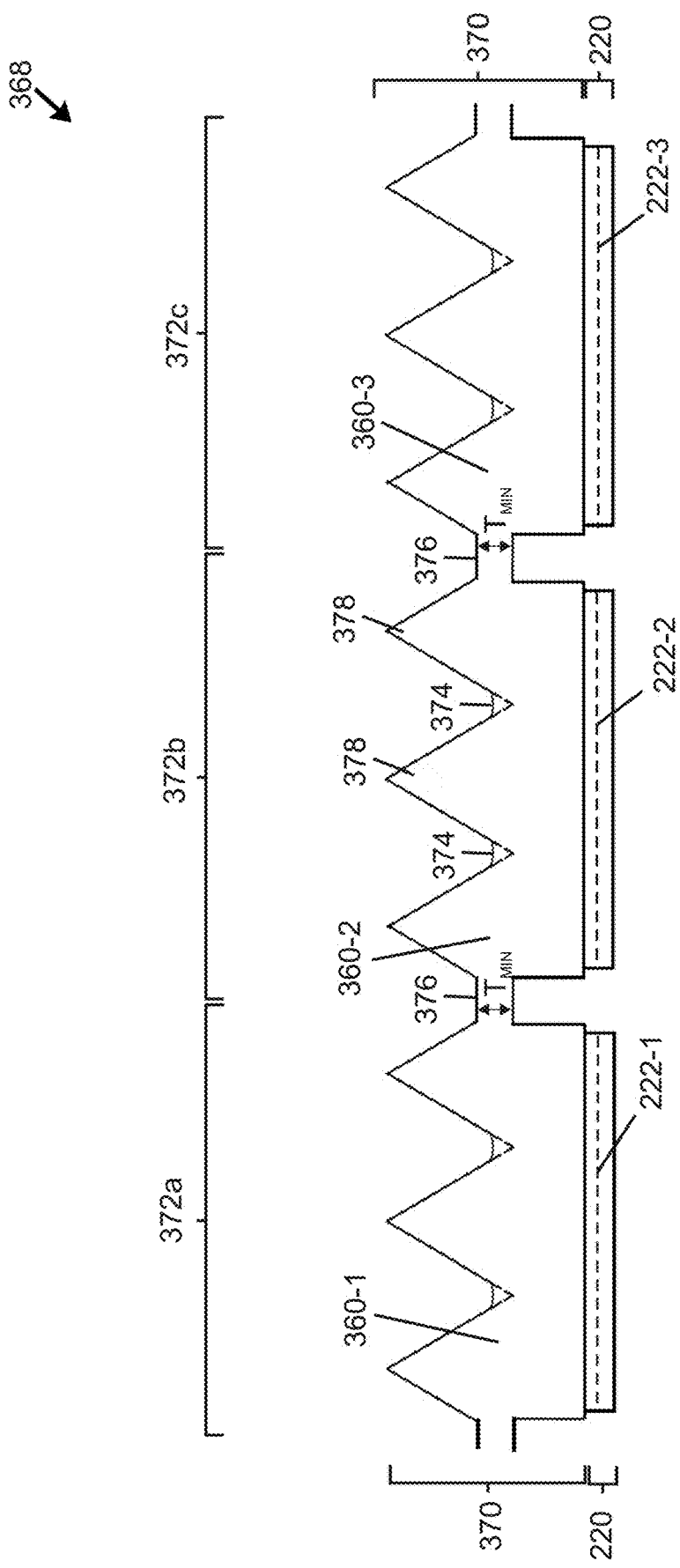
FIG. 26 is a schematic side cross-sectional view of at least a portion of a pixelated-LED chip according to some embodiments including a substrate that is continuous between a plurality of pixels.

In that regard, FIG. 26 is a schematic side cross-sectional view of at least a portion of a pixelated-LED chip 368 according to some embodiments. The pixelated-LED chip 368 includes an LED structure 220 that includes a plurality of active layer portions 222-1, 222-2, and 222-3 as previously described. The pixelated-LED chip 368 also includes a substrate 370 with a plurality of substrate portions 370-1, 370-2, and 370-3. Each substrate portion 370-1, 370-2, and 370-3 is registered with a separate pixel of a plurality of pixels 372a, 372b, and 372c. While three pixels are shown, it should be understood that any number of pixels may be provided. The substrate 370 includes at least one first light extraction surface recess 374, at least one second light extraction surface recess 376, and a plurality of protrusions 378. The at least one second light extraction surface recess 376 is aligned with a street, or "street-aligned" between adjacent pixels of the plurality of pixels 372a, 372b, and 372c. In some embodiments, the substrate may be continuous between the plurality of substrate portions 370-1, 370-2, and 370-3; accordingly, the at least one second light extraction surface recess 376 does not extend entirely through the substrate 370 between pixels. In some embodiments, the at least one first light extraction surface recess 374 extends deeper into the substrate 370 than the at least one second light extraction surface recess 376. In some embodiments, a different saw blade is used to provide the different depths. In some embodiments, the different saw blade has a flatter blade edge and accordingly, the second light extraction surface recess 376 may have a wider bottom than the first light extraction surface recess 374. A minimum thickness region of the substrate 370 between adjacent pixels extends in a vertical direction and is shown as $T_{MIN}$ in FIG. 26. The minimum thickness region $T_{MIN}$ is registered with the at least one second light extraction surface recess 376. For light emissions of the first pixel 372A to pass through the substrate 370 to the second pixel 372b, such emissions would need to be transmitted in an approximately lateral direction through the minimum thickness region $T_{MIN}$. Permitting a small amount of light to be transmitted through the minimum thickness region $T_{MIN}$ may beneficially reduce the appearance of a dark boundary between adjacent pixels that would result if inter-pixel light segregation were 100% effective. Reducing the minimum thickness region $T_{MIN}$ would be expected to generally reduce cross-talk and increase contrast between adjacent pixels.

In certain embodiments, a pixelated-LED chip may output light beams centered in different directions. Such functionality may be provided, for example, with microlenses of different shapes and/or configurations. In certain embodiments, different microlenses may be arranged over different light output areas of at least one lumiphoric material arranged over a substrate supporting multiple flip chip LEDs.

In certain embodiments, pixelated-LED chips and devices incorporating pixelated-LED chips as disclosed herein may be used in automotive applications, such as in headlamps, tail lamps, automotive interior lighting, and the like.

In certain embodiments, pixelated-LED chips and devices incorporating pixelated-LED chips as disclosed herein may be used in a variety of non-automotive applications, including stationary and portable lighting devices. Stationary lighting devices may include sequentially illuminated displays, backlighting with localized dimming for display screens, micro-LED displays, image projectors, video displays, premises interior lighting (e.g., residential, commercial, and/or industrial), premises exterior lighting, instrumentation, industrial fabrication tools (e.g., for fabrication of masks, patterning of material, curing of compounds, etc.), roadway lighting, and indoor or outdoor signage. Portable lighting devices may include flashlights or lanterns, and personal display devices such as personal computers, tablets, phones, watches, and the like. In some embodiments, variable levels of lighting may be provided for stationary or portable lighting devices by selectively energizing a pixel or a subgroup of pixels of a pixelated-LED chip and/or by operating pixels of a pixelated-LED chip at reduced current levels. Additionally, different current levels may be used to energize different pixels or different subgroups of pixels within a pixelated-LED chip. Accordingly, a lighting device may be configured to simultaneously illuminate or project an image and provide general illumination to a surface. In other embodiments, a lighting device may be configured to provide selective illumination or selective dimming to a surface.

Figure 27:
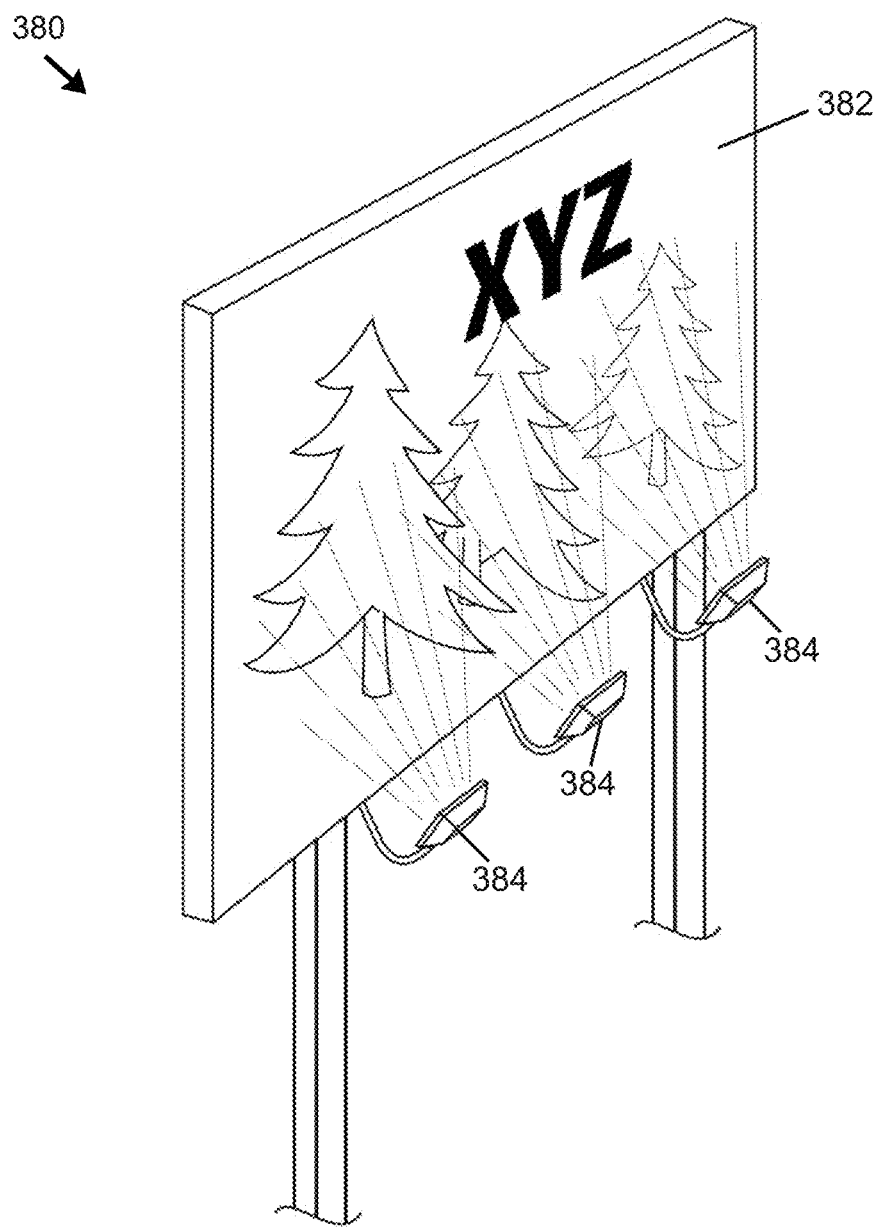
FIG. 27 illustrates a billboard or sign that displays an image projected from at least one pixelated-LED chip according to some embodiments.

In that regard, FIG. 27 illustrates a billboard or sign 380 that displays at least one image projected from at least one pixelated-LED chip according to some embodiments. The billboard or sign 380 includes an upright surface 382 and a plurality of illumination devices 384, or stationary lighting devices. The illumination devices 384 may also be referred to as lighting devices or lighting fixtures. Each illumination device 384 includes at least one pixelated-LED chip as previously described. The plurality of illumination devices 384 are configured such that emissions from the at least one pixelated-LED chip illuminate the upright surface 382, as depicted by the lines (signifying light beams) between each illumination device 384 and the upright surface 382. In FIG. 27, the plurality of illumination devices 384, or a lighting device, are configured in front of and towards a bottom of the upright surface 382, although other configurations may be provided. As previously described, a pixelated-LED chip includes a plurality of individually electrically accessible (e.g., addressable) pixels. Accordingly, individual pixels or subgroups of pixels in the illumination devices 384 may be selectively activated or deactivated to provide various images such as alphanumeric characters, symbols, different colors, still images, and moving images such as videos that are projected onto the upright surface 382. Additionally, all pixels of a pixelated-LED chip in a particular illumination device 384 may be simultaneously activated or deactivated to provide general illumination to the upright surface 382. Although not shown in FIG. 27, it should be appreciated that additional lighting devices may be arranged along or adjacent to any one or more surfaces or edges of the billboard or sign 380, such as along a bottom edge, top edge, left side edge, and/or right side edge. In some embodiments, the additional lighting devices may comprise at least one pixelated-LED chip. In other embodiments, the additional lighting devices comprise only conventional illumination sources and are configured to provide ambient lighting to the upright surface 382 in addition to any images projected by the plurality of illumination devices 384. In certain embodiments, the illumination devices 384 may include one or more optical elements (e.g., lenses, micro lenses, diffusers, filters, etc.) to achieve a desired distribution or pattern of light on the upright surface 382. In certain embodiments, the plurality of illumination devices 384 may be independently controlled such as to permit different subregions of the upright surface 382 to be illuminated differently. In other embodiments, the plurality of illumination devices 384 may be controlled together as a group.

In some embodiments, a stationary lighting device such as an indoor lighting device may include at least one pixelated-LED chip. Indoor lighting devices include, by way of examples, area lights, downlights, high-bay or low-bay lighting fixtures, suspended lighting fixtures, troffers, wall-mounted or ceiling mounted fixtures, track lighting, plug-in devices such as table and floor lamps, and light bulbs.

Figure 28:
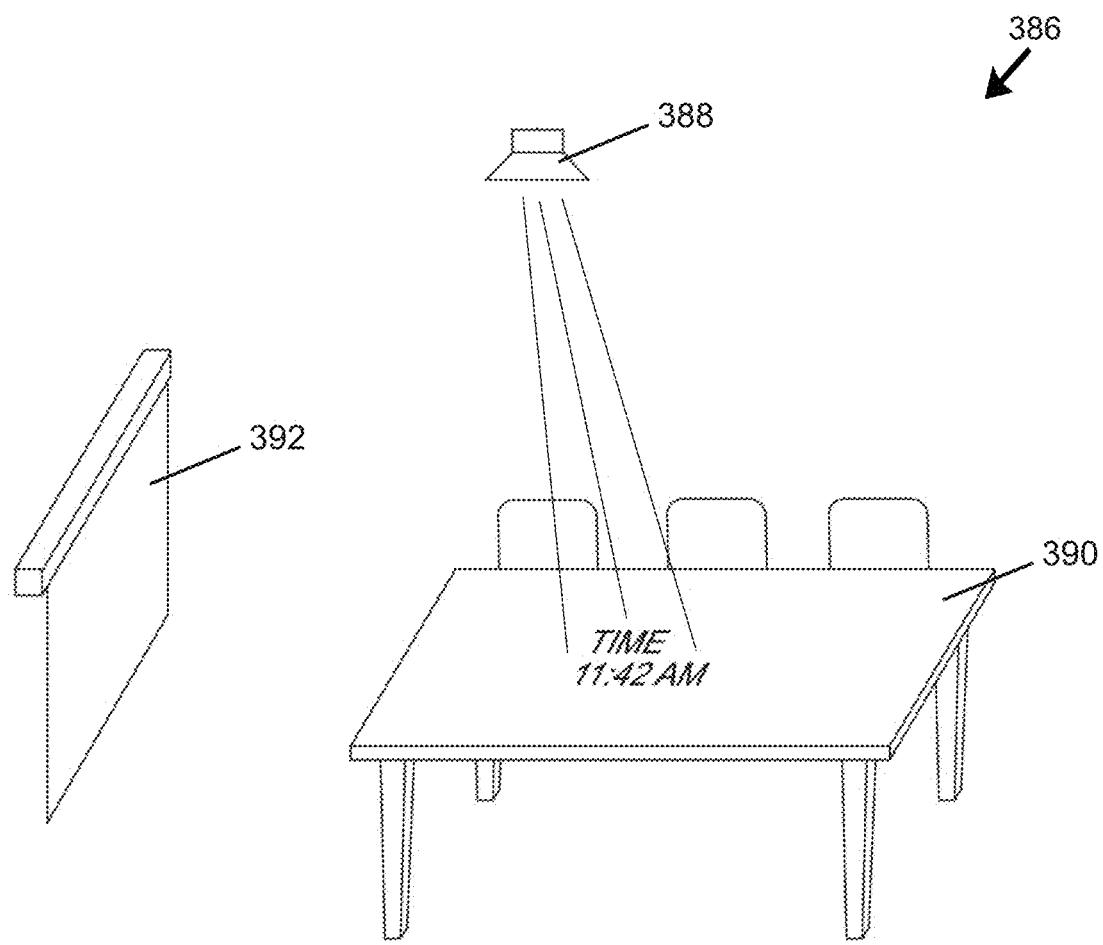
FIG. 28 illustrates an indoor lighting device according to some embodiments that can project an image from a pixelated-LED chip as well as provide general illumination.

In that regard, FIG. 28 illustrates an interior space 386 with an indoor lighting device 388 according to some embodiments that can project at least one image from a pixelated-LED chip as well as provide general illumination. The indoor lighting device 388 includes at least one pixelated-LED chip that comprises a plurality of individually electrically accessible (e.g., addressable) pixels as previously described. Accordingly, individual pixels or subgroups of pixels may be selectively activated or deactivated to provide various images such as alphanumeric characters, symbols, different colors, still images, and moving images such as videos that are projected onto one or more surfaces within the interior space 386. FIG. 28, by way of a non-limiting example, illustrates the indoor lighting device 388 projecting the time of day onto the surface of a table 390. In some embodiments, only certain pixels of the at least one pixelated-LED chip in the indoor lighting device 388 are activated to selectively project the at least one image on the surface of the table 390 while not projecting the image on another surface 392, such as a screen, sign, display, or window. In other embodiments, all pixels of the at least one pixelated-LED chip in the indoor lighting device 388 may be simultaneously activated or deactivated to provide general illumination to both the surface of the table 390 as well as another surface 392.

In some embodiments, a stationary lighting device such as an outdoor lighting device may include at least one pixelated-LED chip. Outdoor lighting devices include, by way of examples, area lights, street and roadway lighting fixtures, canopy light fixtures, soffit light fixtures, parking garage lighting fixture, flood lighting, and wall-mounted or ceiling mounted outdoor fixtures.

Figure 29:
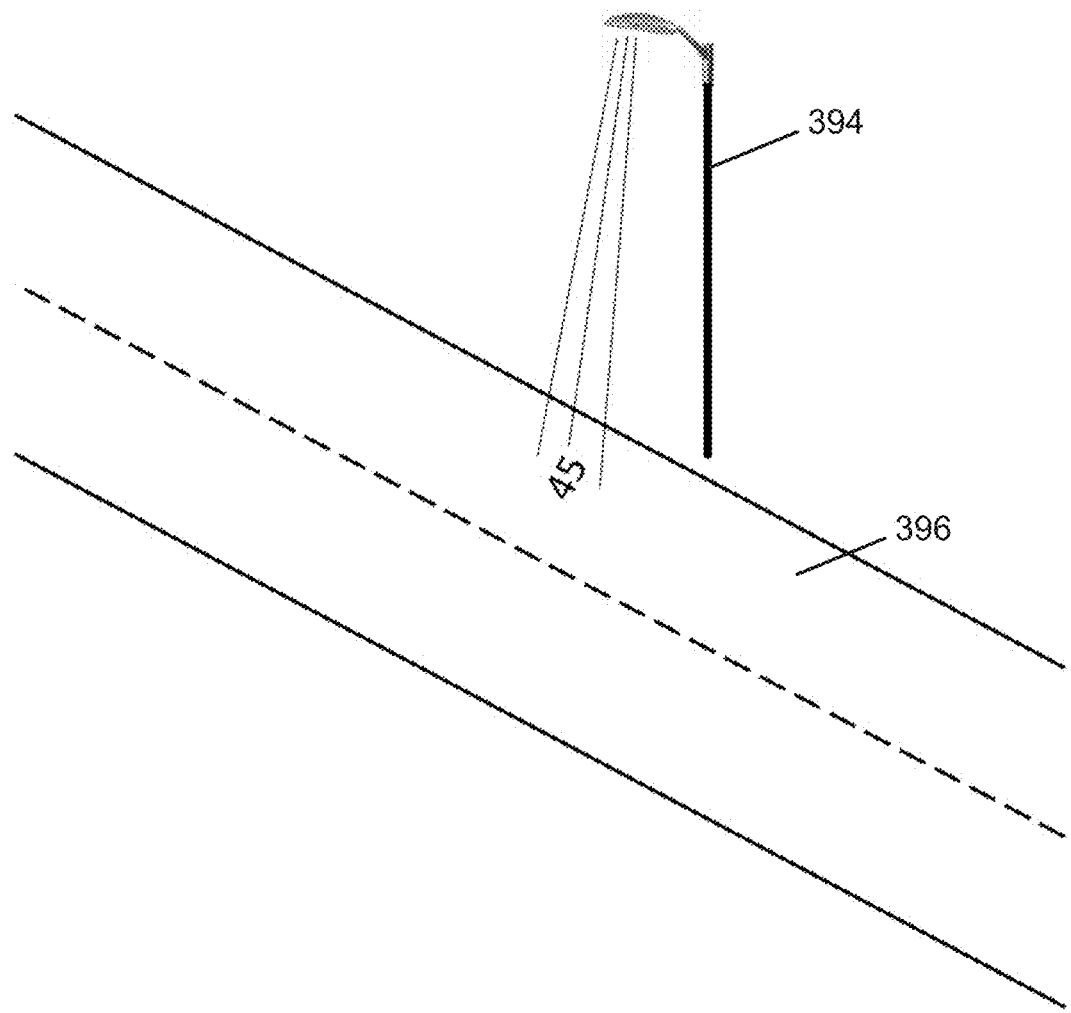
FIG. 29 illustrates an outdoor lighting device according to some embodiments that can project an image from a pixelated-LED chip as well as provide general illumination.

FIG. 29 illustrates an outdoor lighting device 394, such as a streetlight, according to some embodiments that can project at least one image from a pixelated-LED chip as well as provide general illumination. The outdoor lighting device 394 includes at least one pixelated-LED chip that comprises a plurality of individually electrically accessible (e.g., addressable) pixels as previously described. Accordingly, individual pixels or subgroups of pixels may be selectively activated or deactivated to provide various images such as alphanumeric characters, symbols, different colors, still images, and moving images such as videos that are projected onto one or more surfaces. FIG. 29, by way of a non-limiting example, illustrates the outdoor lighting device 394 projecting the speed limit onto the surface of a roadway 396. In some embodiments, only certain pixels of the at least one pixelated-LED chip in the outdoor lighting device 394 are activated to selectively project the at least one image onto the surface of a roadway 396. In other embodiments, all pixels of the at least one pixelated-LED chip in the outdoor lighting device 394 may be simultaneously activated or deactivated to provide general illumination to the surface of the roadway 396.

In some embodiments, a plurality of stationary lighting devices may be grouped together to form a network of lighting devices that collectively provide general illumination as well as provide various images such as alphanumeric characters, different colors, still images, and moving images such as videos that are projected onto one or more surfaces. The network of lighting devices may be dynamically or collaboratively controlled to provide or communicate coordinated information. In some embodiments, individual lighting devices of the network of lighting devices may all provide the same image. In other embodiments, different lighting devices of the network of lighting devices may provide images that differ from one another to provide a coordinated image, or sequenced images that vary based on location.

In some embodiments, a stationary lighting device may receive input information from integral or communicatively coupled sensors, such as ambient lighting sensors, motion detectors, occupancy sensors, image sensors, environmental sensors, or building sensors. Based on information received from one or more of the sensors, the stationary light may adjust a lighting brightness or color temperature, or provide alphanumeric characters, symbols, different colors, still images, and moving images. In addition to providing a signal to the stationary lighting device, the one or more sensors may also provide a signal to an external control system, which may then send an input signal to a plurality of stationary lighting devices that are grouped together as a network. In other embodiments, the one or more sensors may communicate information directly to a plurality of stationary lighting devices without an external control system.

In some embodiments, an environmental sensor may be used to sense temperature and/or smoke in the case of a fire alarm; or a weather or security emergency. In such circumstances, the stationary lighting device may be configured to provide an alternative communication, such as information corresponding to an alternate exit route and/or color coding, such as a red output color to indicate fire; or a blue output color to indicate a health emergency. In some embodiments, the environmental sensor may be a personnel sensor that may be used to trigger a specific communication corresponding to the presence of personnel. For example, in a commercial context, when a customer in a store enters a specific area, a communication regarding a commercial event such as, for example, a sale, special and/or discount may be provided.

In some embodiments, the stationary lighting device may receive input information from one or more sensors and adjust the light output to enhance visibility of the general illumination or of the message to be conveyed. For example, the input information may alert the stationary lighting device to an approaching person or vehicle, and the stationary lighting device may make adjustments to reduce glare, or direct light emissions toward the person or vehicle. In such embodiments, reducing the glare or directing light emissions would allow better visibility of additional information (alphanumeric characters, symbols, different colors, still images, or moving images) that is communicated from the stationary lighting device.

Figure 30:
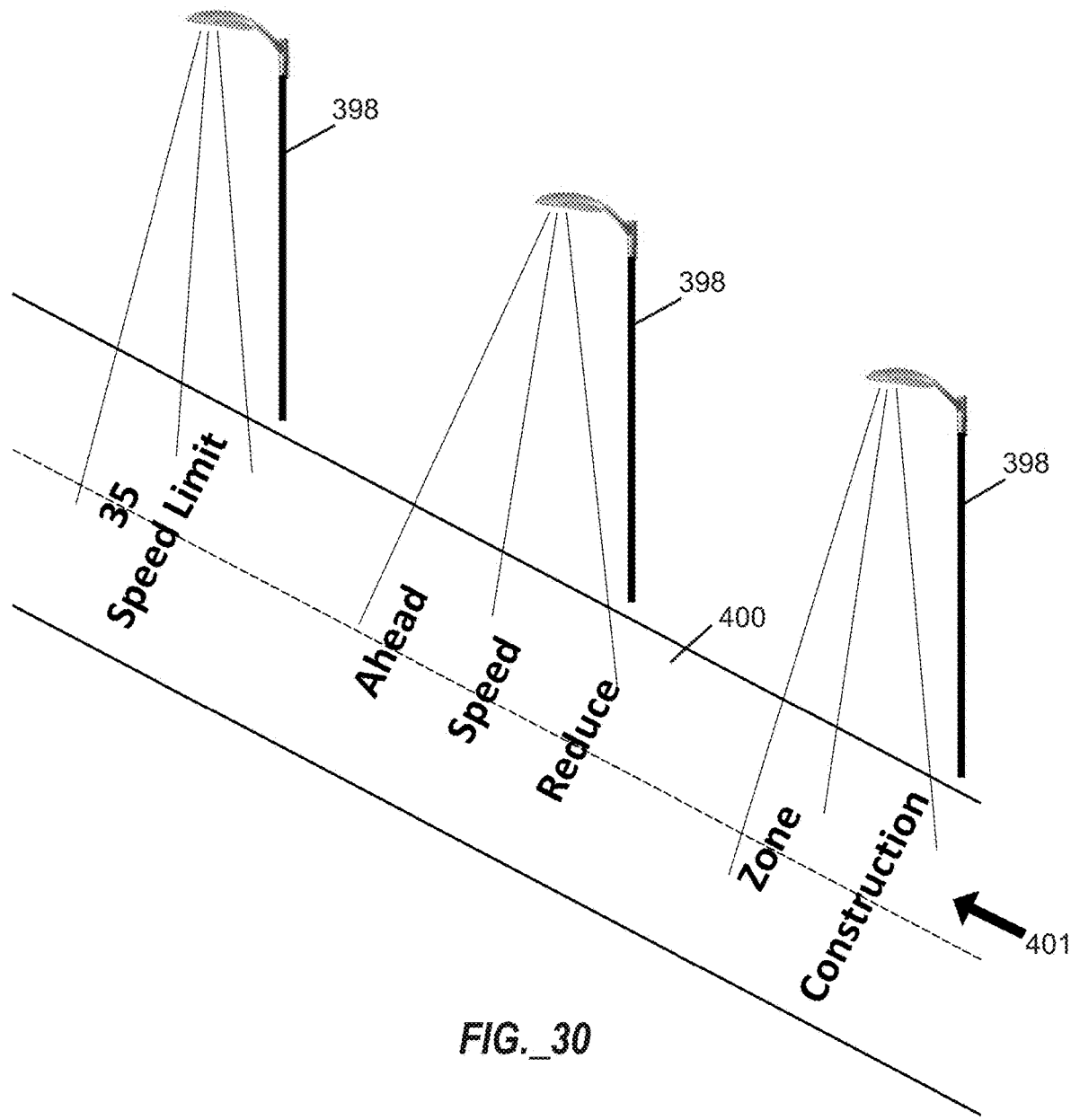
FIG. 30 illustrates a plurality of stationary lighting devices, such as streetlights, that form a network for providing a coordinated image, or sequenced images.

FIG. 30 illustrates a plurality of stationary lighting devices 398, such as streetlights, that form a network for providing a coordinated image, or sequenced images. Each of the plurality of stationary lighting devices 398 includes at least one pixelated-LED chip that comprises a plurality of individually electrically accessible (e.g., addressable) pixels as previously described. Accordingly, individual pixels or subgroups of pixels may be selectively activated or deactivated to provide various images such as alphanumeric characters, symbols, different colors, still images, and moving images that are projected onto one or more surfaces. Each stationary lighting device 398 may project the same image or a different image. In some embodiments, each stationary lighting device 398 projects a different image such that the plurality of stationary lighting devices 398 collectively project either a coordinated image or a sequenced image. FIG. 30, by way of a non-limiting example, illustrates the plurality of stationary lighting devices 398 projecting a sequenced image onto a roadway 400 to notify a driver travelling in direction 401 of a construction zone and to reduce speed to a certain speed limit. In some embodiments, only certain pixels of the at least one pixelated-LED chip in the stationary lighting device 398 are activated to selectively project at least one image on a surface of the roadway 400. In other embodiments, all pixels of the at least one pixelated-LED chip in each stationary lighting device 398 may be simultaneously activated or deactivated to provide general illumination to the surface of the roadway 400.

Figure 31:
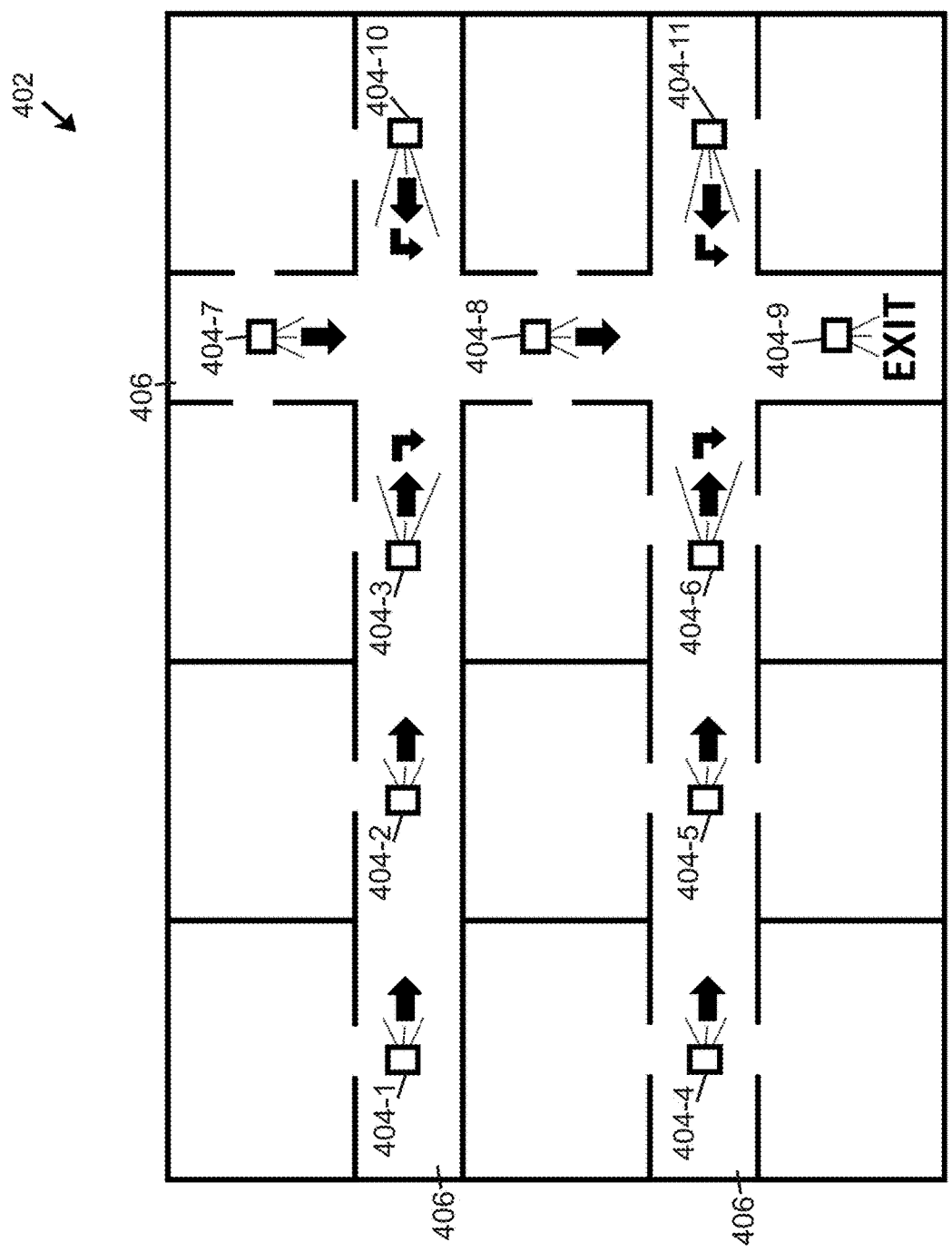
FIG. 31 illustrates a floor plan view of a building that includes a plurality of stationary lighting devices, such as troffers or other ceiling mounted light fixtures, which form a network for providing a coordinated image, or sequenced images within the building.

FIG. 31 illustrates a floor plan view of a building 402 that includes a plurality of stationary lighting devices 404-1 to 404-11, such as troffers or other ceiling mounted light fixtures, which form a network for providing a coordinated image, or sequenced images within the building 402. Each of the plurality of stationary lighting devices 404-1 to 404-11 includes at least one pixelated-LED chip that comprises a plurality of individually electrically accessible (e.g., addressable) pixels as previously described. Accordingly, individual pixels or subgroups of pixels may be selectively activated or deactivated to provide various images such as alphanumeric characters, symbols, different colors, still images, and moving images that are projected onto one or more surfaces. Each stationary lighting device 404-1 to 404-11 may project the same image or a different image. In some embodiments, each stationary lighting device 404-1 to 404-11 projects a different image such that the plurality of stationary lighting devices 404-1 to 404-11 collectively project either a coordinated image or a sequenced image. FIG. 31, by way of a non-limiting example, illustrates the plurality of stationary lighting devices 404-1 to 404-11 projecting a sequenced image onto floors of one or more hallways 406 to notify occupants of evacuation paths during an emergency. For example, stationary lighting devices 404-1, 404-2, 404-4, 404-5, 404-7, and 404-8 project an image of a single arrow. Stationary lighting devices 404-3, 404-6, 404-10, and 404-11 project multiple images such as a straight arrow followed by a bent arrow to direct occupants toward stationary lighting device 404-9 which projects an image marking the location of an emergency exit. In some embodiments, only certain pixels of the at least one pixelated-LED chip in each stationary lighting device 404-1 to 404-11 are activated to selectively project at least one image onto floors of the one or more hallways 406. In other embodiments, all pixels of the at least one pixelated-LED chip in each stationary lighting device 404-1 to 404-11 may be simultaneously activated or deactivated to provide general illumination to the hallways 406.

Figure 32:
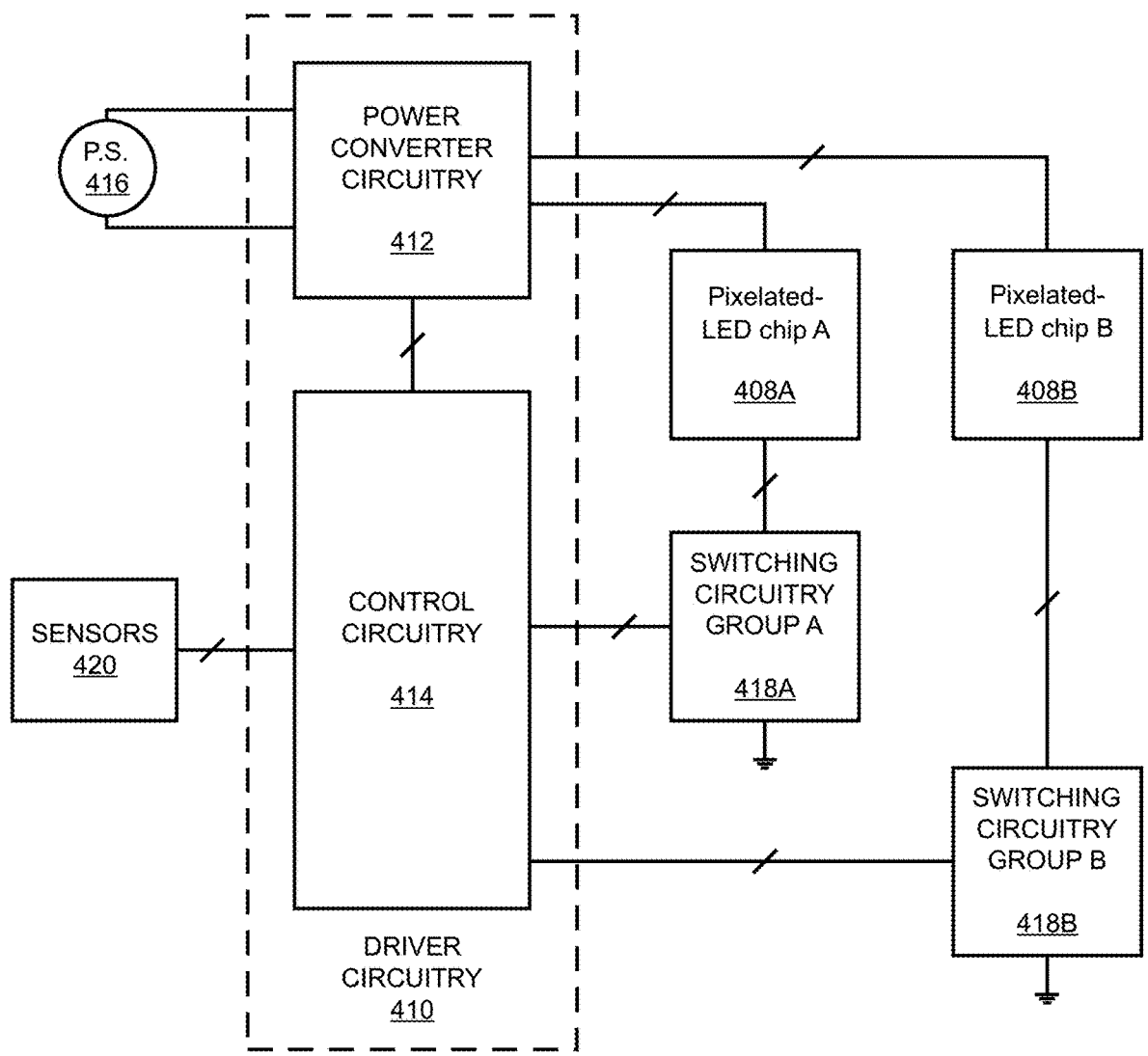
FIG. 32 is a simplified schematic diagram showing interconnections between components of a light emitting device including two pixelated-LED chips together with driver circuitry and one or more sensors.

In certain embodiments, a stationary lighting device may include or be associated with driver circuitry and/or one or more sensors. FIG. 32 is a simplified schematic diagram showing interconnections between components of a light emitting device including two pixelated-LED chips together with driver circuitry and one or more sensors. Although single lines are shown as coupling various components for simplicity, it is to be appreciated that each line with a slash represents multiple conductors. The light emitting device includes pixelated-LED chips 408A, 408B and driver circuitry 410 coupled to pixelated-LED chips 408A, 408B. Each pixelated-LED chip 408A, 408B includes multiple pixels that are separately coupled between the driver circuitry 410 and ground, thereby permitting each pixel of each pixelated-LED chip 408A, 408B to be individually addressable and separately controlled. Each pixelated-LED chip 408A, 408B is configured to generate emissions (e.g., blue light, green light, UV emissions, or any other suitable wavelength range) in response to application of electric current, which is provided by the driver circuitry 410. Emissions of each pixelated-LED chip 408A, 408B may be proportional to the current provided thereto by the driver circuitry 410. In each pixelated-LED chip 408A, 408B, at least some pixels may be overlaid with at least one lumiphoric material arranged to output any suitable wavelengths in the visible range, such that aggregate emissions of each pixelated-LED chip 408A, 408B may include lumiphor emissions. The resulting aggregate light output from each pixelated-LED chip 408A, 408B may include any desired color or combination of colors.

In certain embodiments, each pixelated-LED chip 408A, 408B includes different pixels that are configured to emit light of different wavelengths, such that each pixelated-LED chip 408A, 408B may be arranged to emit light of multiple peak wavelengths. For example, in certain embodiments, each pixelated-LED chip 408A, 408B may be arranged to emit any two or more of short wavelength blue light, long wavelength blue light, cyan light, green light, yellow light, amber light, orange light, red light, white light, blue shifted yellow light, and blue shifted green light. Pixels of different peak wavelengths and/or lumiphoric materials of different peak wavelengths may be provided within one or more of the pixelated-LED chips 408A, 408B to enable production of light of different wavelengths. In certain embodiments, multiple lumiphor portions may be spatially separated from one another and arranged to receive emissions from respective solid state light sources.

The driver circuitry 410 includes power converter circuitry 412 and control circuitry 414. The power converter circuitry 412 may be configured to receive power from a power source (P.S.) 416, which may be a direct current (DC) or alternating current (AC) power source, and provides a desired current to each one of the pixels in the pixelated-LED chips 408A, 408B. The control circuitry 414 may provide one or more control signals to the power converter circuitry 412 in order to independently control the amount of current provided to each one of the pixels in the pixelated-LED chips 408A, 408B. Each pixelated-LED chip 408A, 408B has associated therewith a switching circuitry group 418A, 418B including switching circuitry coupled between each pixel and ground. In certain embodiments, the switching circuitry groups 418A, 418B may include multiple metal-oxide-semiconductor field-effect transistors (MOSFETs) each including a drain contact coupled to the respective emitter, a source contact coupled to ground, and a gate contact coupled to the control circuitry 414. In such an instance, the control circuitry 414 may be configured to vary a voltage provided to the gate contact of each transistor such that a current through each one of the pixels of the pixelated-LED chip 408A, 408B is independently controllable.

In certain embodiments, the control circuitry 414 provides control signals based on input from at least one sensor 420. The at least one sensor 420 may embody any suitable sensor type, such as a photosensor, a radar sensor, an image sensor, a temperature sensor, a motion sensor, an environmental sensor, a building sensor or the like. In another embodiment, the control circuitry 414 may provide control signals based on a user input provided to the control circuitry 414.

In certain embodiments, each pixelated-LED chip 408A, 408B may include multiple pixels arranged to output light beams centered in different directions. Such functionality may be provided, for example, with microlenses of different shapes and/or configurations. In certain embodiments, different microlenses may be arranged over different light output areas of at least one lumiphoric material arranged over a substrate supporting multiple pixels. The ability to output light beams centered in different directions may be beneficial in the context indoor or outdoor area lighting, in which it may be desirable to selectively illuminate and darken different zones forward of a moving person or a moving vehicle to provide maximum illumination without dazzling or impairing the vision of the moving person or a driver of the moving vehicle.

Embodiments disclosed herein may provide one or more of the following beneficial technical effects: enabling fabrication of solid state light emitting devices with small pixel pitch emitter arrays; providing small pixel pitch solid state light emitting devices (including lumiphor-containing emitting devices) with reduced scattering and/or optical crosstalk properties; providing small pixel pitch solid state light emitting devices (including lumiphor-containing emitting devices) with enhanced uniformity of illumination while simultaneously providing reduced optical crosstalk; simplifying fabrication and enhancing resolution of multi-color sequentially illuminated LED displays; enabling fabrication of large modular arrays of a solid state light emitting device; enabling fabrication of interior or exterior illumination devices (including roadway lamps) incorporating LED arrays with improved controllability; and enabling projection of images or information on a target illumination surface.

Those skilled in the art will recognize improvements and modifications to the preferred embodiments of the present disclosure. All such improvements and modifications are considered within the scope of the concepts disclosed herein and the claims that follow.

What is claimed is:

1. A pixelated-LED chip comprising:
   an active layer comprising a plurality of active layer portions;
   a substrate comprising a plurality of discontinuous substrate portions supporting the plurality of active layer portions, wherein each substrate portion comprises a light-transmissive material; and
   a plurality of anode-cathode pairs associated with the plurality of active layer portions;
   wherein each active layer portion of the plurality of active layer portions comprises a different anode-cathode pair of the plurality of anode-cathode pairs and is configured to illuminate a different substrate portion of the plurality of discontinuous substrate portions and transmit light through the substrate portion, such that the plurality of active layer portions and the plurality of discontinuous substrate portions form a plurality of pixels; and
   wherein an underfill material arranged (i) between lateral sidewalls of the plurality of pixels and (ii) between the anode and the cathode of the anode-cathode pair of each pixel of the plurality of pixels; and
   wherein a first lumiphoric material is arranged on the plurality of pixels and in contact with the underfill material.

2. The pixelated-LED chip of claim 1, wherein the first lumiphoric material is continuous on the plurality of discontinuous substrate portions.

3. The pixelated-LED chip of claim 1, wherein the first lumiphoric material comprises phosphor particles and scattering particles.

4. The pixelated-LED chip of claim 3, wherein the scattering particles comprise at least one of fused silica, fumed silica, or titanium dioxide particles.

5. The pixelated-LED chip of claim 1, further comprising a second lumiphoric material over the first lumiphoric material.

6. The pixelated-LED chip of claim 5, wherein the second lumiphoric material comprises a same composition but a different concentration of lumiphoric material relative to the first lumiphoric material.

7. The pixelated-LED chip of claim 1, wherein the first lumiphoric material comprises a plurality of light segregation elements that are registered between pixels of the plurality of pixels.

8. The pixelated-LED chip of claim 7, wherein the plurality of light segregation elements comprises cuts in the first lumiphoric material.

9. The pixelated-LED chip of claim 1, wherein the underfill material comprises a light-altering or a light-reflecting material suspended in a binder.

10. The pixelated-LED chip of claim 9, wherein the light-altering or light-reflecting particles comprise titanium dioxide particles and the binder comprises silicone.

11. The pixelated-LED chip of claim 1, wherein a width of the underfill material between the lateral sidewalls of the plurality of pixels is no greater than about 60 μm.

12. The pixelated-LED chip of claim 1, being devoid of an air gap between the plurality of substrate portions.

13. The pixelated-LED chip of claim 1, wherein the substrate comprises silicon carbide or sapphire.

14. The pixelated-LED chip of claim 1, wherein the substrate comprises a plurality of randomly distributed microscale textural features.

15. A pixelated-LED chip comprising:
an active layer comprising a plurality of active layer portions;
a substrate comprising a plurality of discontinuous substrate portions supporting the plurality of active layer portions, wherein each substrate portion comprises a light-transmissive material with a light extraction surface that comprises textural features; and
a plurality of anode-cathode pairs associated with the plurality of active layer portions;
wherein each active layer portion of the plurality of active layer portions is configured to illuminate a different substrate portion of the plurality of discontinuous substrate portions and transmit light through the light extraction surface of the substrate portion, such that the plurality of active layer portions and the plurality of discontinuous substrate portions form a plurality of pixels; and
wherein an underfill material is arranged (i) between lateral sidewalls of the plurality of pixels and (ii) between the plurality of anode-cathode pairs; and
wherein a first lumiphoric material is arranged on the plurality of pixels and in contact with the underfill material.

16. The pixelated-LED chip of claim 15, wherein each active layer portion of the plurality of active layer portions comprises a different anode-cathode pair of the plurality of anode-cathode pairs.

17. The pixelated-LED chip of claim 15, wherein the textural features comprise a plurality of randomly distributed microscale textural features.

18. The pixelated-LED chip of claim 15, wherein the first lumiphoric material is continuous on the plurality of discontinuous substrate portions.

19. The pixelated-LED chip of claim 15, wherein the first lumiphoric material comprises phosphor particles and scattering particles.

20. The pixelated-LED chip of claim 19, wherein the scattering particles comprise at least one of fused silica, fumed silica, or titanium dioxide particles.

21. The pixelated-LED chip of claim 15, further comprising a second lumiphoric material over the first lumiphoric material.

22. The pixelated-LED chip of claim 21, wherein the second lumiphoric material comprises a same composition but a different concentration of lumiphoric material relative to the first lumiphoric material.

23. The pixelated-LED chip of claim 15, wherein the first lumiphoric material comprises a plurality of light segregation elements that are registered between pixels of the plurality of pixels.

24. The pixelated-LED chip of claim 23, wherein the plurality of light segregation elements comprises cuts in the first lumiphoric material.

25. The pixelated-LED chip of claim 15, wherein the underfill material comprises a light-altering or a light-reflecting material suspended in a binder.

26. The pixelated-LED chip of claim 25, wherein the light-altering or light-reflecting particles comprise titanium dioxide particles and the binder comprises silicone.

27. The pixelated-LED chip of claim 15, wherein a width of the underfill material between the lateral sidewalls of the plurality of pixels is no greater than about 60 μm.

28. The pixelated-LED chip of claim 15, being devoid of an air gap between the plurality of discontinuous substrate portions.

29. The pixelated-LED chip of claim 15, wherein the substrate comprises silicon carbide or sapphire.

* * * * *